(12) United States Patent
Lee et al.

(10) Patent No.: US 12,740,249 B2

(45) Date of Patent: Sep. 15, 2026

(54) DISPLAY PANEL AND METHOD OF MANUFACTURING THE SAME

(71) Applicant: Samsung Display Co., Ltd., Yongin-si (KR)

(72) Inventors: Jeongseok Lee, Yongin-si (KR); Taewook Kang, Yongin-si (KR); Woo Yong Sung, Yongin-si (KR); Seungyong Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 347 days.

(21) Appl. No.: 18/454,318

(22) Filed: Aug. 23, 2023

(65) Prior Publication Data

US 2024/0074245 A1 Feb. 29, 2024

(30) Foreign Application Priority Data

Aug. 30, 2022 (KR) ........................ 10-2022-0109424

(51) Int. Cl.

| | |
|---|---|
| ***H10K 59/122*** | (2023.01) |
| ***H10K 59/12*** | (2023.01) |
| ***H10K 59/80*** | (2023.01) |
| ***H10K 71/20*** | (2023.01) |
| *H10K 102/00* | (2023.01) |

(52) U.S. Cl.

CPC ....... *H10K 59/122* (2023.02); *H10K 59/1201* (2023.02); *H10K 59/873* (2023.02); *H10K 71/231* (2023.02); *H10K 2102/351* (2023.02)

(58) Field of Classification Search

CPC ............. H10K 59/122; H10K 59/1201; H10K 59/873; H10K 71/231

See application file for complete search history.

(56) References Cited

U.S. PATENT DOCUMENTS

| | | | | |
|---|---|---|---|---|
| 5,604,399 A * | 2/1997 | Mandelman | ............ | H01J 3/022 313/309 |
| 9,236,581 B2 | 1/2016 | Kato et al. | | |
| 9,431,634 B2 | 8/2016 | Song | | |

(Continued)

FOREIGN PATENT DOCUMENTS

| | | | |
|---|---|---|---|
| CN | 101630689 A * | 1/2010 | ............ H10P 95/064 |
| KR | 10-1502206 | 3/2015 | |

(Continued)

*Primary Examiner* — Joseph L Williams

(74) *Attorney, Agent, or Firm* — Womble Bond Dickinson (US) LLP

(57) ABSTRACT

A display panel includes a base layer, a first lower electrode, a first sacrificial pattern layer defining a first lower opening exposing a portion of an upper surface of the first lower electrode, an insulating layer covering a portion of the first sacrificial pattern layer and defining a first emission opening overlapping the first lower opening, a conductive bank defining a first upper opening overlapping the first emission opening, a first emission pattern layer disposed inside the first lower opening, the first emission opening, and the first upper opening and on the first lower electrode, and a first upper electrode disposed on the first emission pattern layer and in contact with an inner surface of the conductive bank defining the first upper opening, and a thickness of the first emission pattern layer is greater than a sum of a thickness of the first sacrificial pattern layer and a thickness.

41 Claims, 39 Drawing Sheets

(56) References Cited

U.S. PATENT DOCUMENTS

| | | | |
|---|---|---|---|
| 10,868,088 B2 | 12/2020 | Bok et al. | |
| 11,342,404 B2 | 5/2022 | Ko et al. | |
| 2008/0231168 A1 | 9/2008 | Choi | |
| 2014/0103385 A1 | 4/2014 | Hatano et al. | |
| 2021/0408163 A1 | 12/2021 | Heo et al. | |
| 2022/0077257 A1 | 3/2022 | Choung et al. | |
| 2023/0329042 A1 | 10/2023 | Sung et al. | |
| 2024/0138194 A1* | 4/2024 | Park .................. | H10K 59/1201 |

FOREIGN PATENT DOCUMENTS

| | | |
|---|---|---|
| KR | 10-2121984 | 6/2020 |
| KR | 10-2020-0102025 | 8/2020 |
| KR | 10-2021-0022206 | 3/2021 |
| KR | 10-2022-0000605 | 1/2022 |
| KR | 10-2364522 | 2/2022 |

* cited by examiner

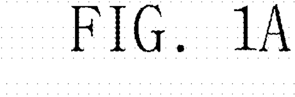
FIG. 1A
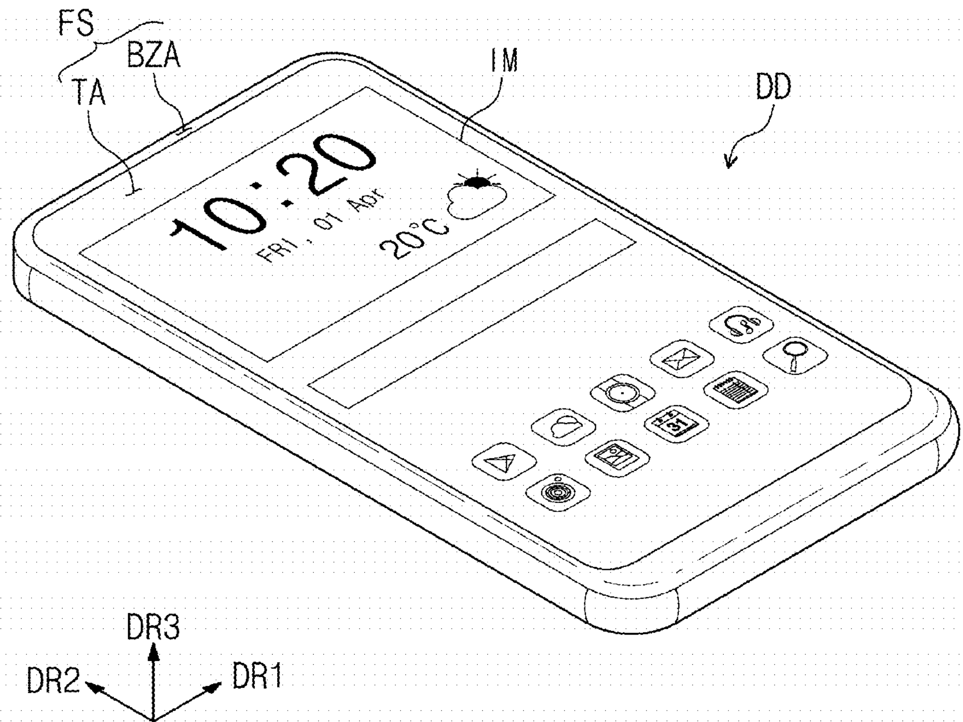

DP
TFE
DP-OLED
DP-CL
UIL
OL
LIL1
L3
L2
L1
DMP1
CDL2
CDL1
CPW
OP1-E
OP1-L
ISL
SP1
CNT-3
60
50
40
30
20
10
BFL
BL
BP
PP
UE1-A
NPXA
PXA-R
NPXA
CNT-2
CNT-1
SCL
CNE1
CNE2
ED1-A
CP1 UE1-A EP1 LE1
UE
D1
A1
S1
G1
TR1
OP1-U
OP1-U1 OP1-U2
PP BP

DP
TFE
DP-OLED
CPW-C
UIL
OL
LIL2
LIL1-C
CDL2-C
CDL1-C
ISL-C
DP-CL
NPXA
PXA-G
NPXA
PXA-R
NPXA
CP2
UE2
EP2
LE2
ED2
SP2
OP2-U
DMP2
L3-G
L2-G
L1-G
DMP-G
GV
OP-G1
OP-GU
DMP1-C
BL
CP1
UE1
EP1
LE1
ED1
SP1
OP1-U

DP-CL
BL
SP3 LE3
SP2 LE2
SP1 LE1

ISL
DP-CL
BL
SP3 LE3
SP2 LE2
SP1 LE1

FIG. 9B

MP1
CDL2
CDL1
CPW-I
ISL
DP-CL
BL
SP3
LE3
SP2
LE2
OP1-MP
SP1
LE1
OP1-UI

FIG. 9E

CPW
MP1
CDL2
CDL1
ISL
DP-CL
BL
SP3
LE3
SP2
LE2
OP1-MP
SP1
LE1
OP1-E
OP1-L
OP1-U

DMP1
CDL2
CDL1
CPW
ISL
DP-CL
BL
SP3
LE3
SP2
LE2
OP1-L
OP1-E
UE1
EP1
LE1
SP1
ED1
OP1-U

DMP1
CDL2
CDL1
CPW
ISL
DP-CL
BL
SP3
LE3
SP2
LE2
OP1-L
CP1
OP1-E
UE1
EP1
LE1
SP1
ED1
OP1-U

DMP1
CDL2
CDL1
CPW
ISL
DP-CL
BL
LIL1
SP3
LE3
SP2
LE2
OP1-L
CP1
OP1-E
UE1
EP1
LE1
SP1
ED1
OP1-U

MK2
MP2
LIL1
DMP1
CDL2
CDL1
CPW
ISL
DP-CL
BL
SP3
LE3
OP2-MK
OP2-MP
SP2
LE2
OP1-L
CP1
OP1-E
UE1
EP1
LE1
ED1
SP1
OP1-U

MP2
LIL1
DMP1
CDL2
CDL1
CPW
ISL
DP-CL
BL
SP3
LE3
OP2-MP
OP1-IL
SP2
LE2
OP1-L
CP1
OP1-E
UE1
EP1
LE1
ED1
SP1
OP1-U

CPW
MP2
LIL1
DMP1
CDL2
CDL1
ISL
DP-CL
BL
SP3
LE3
SP2
LE2
OP1-DM
OP2-MP
OP1-IL
OP1-L
CP1
OP1-E
UE1
EP1
LE1
SP1
ED1
OP1-U

DML2-I
LIL1
DMP1
CDL2
CPW
CDL1
ISL
DP-CL
BL
SP3
LE3
OP1-IL
OP1-DM
OP2-E
OP2-L
CP2
UE2
EP2
LE2
SP2
ED2
OP2-U
OP1-E
OP1-L
CP1
UE1
EP1
LE1
SP1
ED1
OP1-U

DML2-I
LIL1
DMP1
CDL2
CDL1
CPW
ISL
DP-CL
BL
LIL2-I
SP3
LE3
OP1-IL
OP2-E
OP2-L
CP2
UE2
EP2
LE2
SP2
ED2
OP2-U
OP1-DM
OP1-L
CP1
UE1
EP1
LE1
SP1
ED1
OP1-E
OP1-U

MK3
MP3
DML2-I
LIL1
DMP1
CDL2
CDL1
CPW
ISL
DP-CL
BL
OP3-MK
OP3-MP
SP3
LE3
LIL2-I
OP1-IL
OP1-DM
OP2-E
OP2-L
CP2
UE2
EP2
LE2
SP2
ED2
OP2-U
OP1-L
CP1
UE1
EP1
LE1
SP1
ED1
OP1-E
OP1-U

FIG. 11B

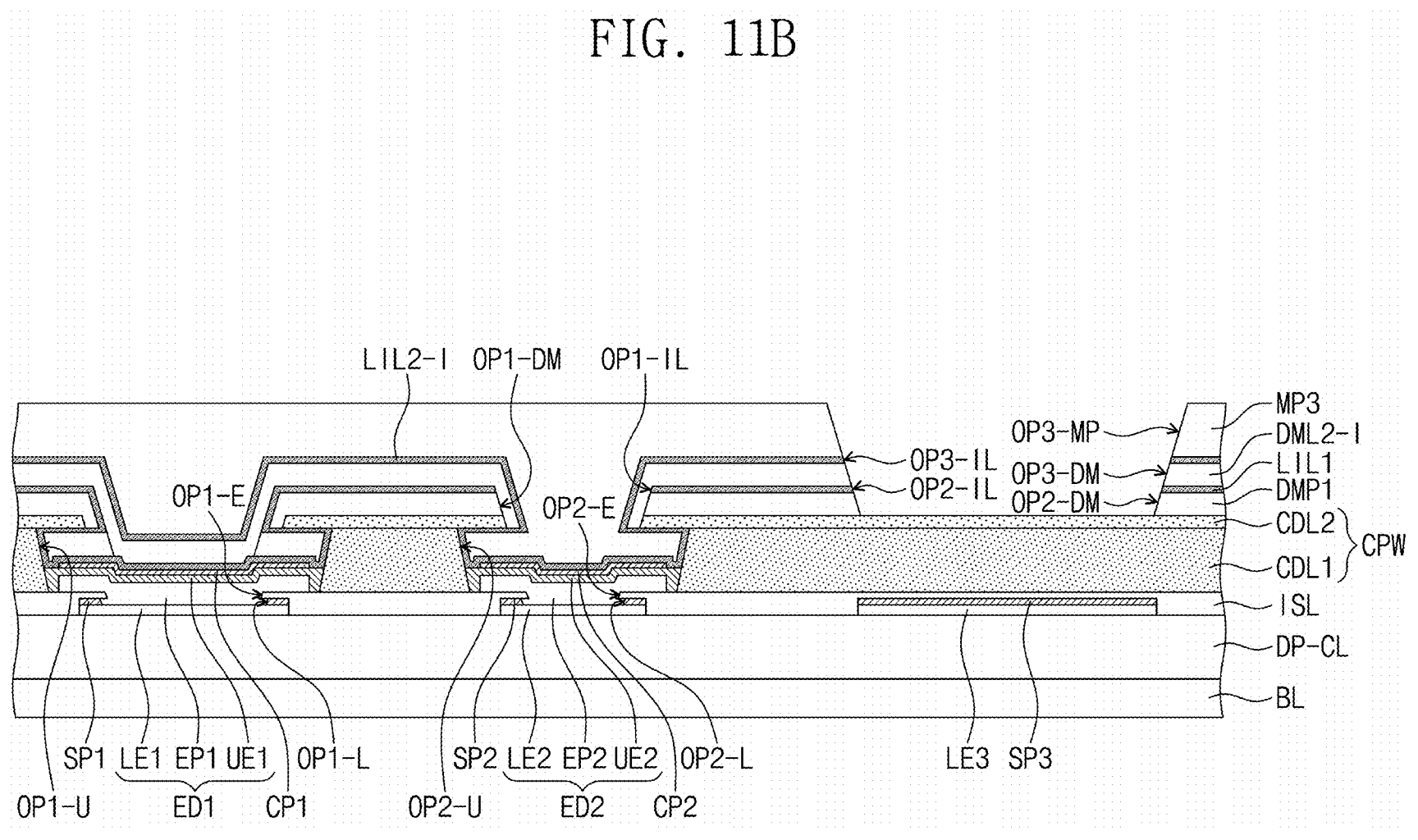

MP3 DML2-I LIL1 DMP1 CDL2 CDL1 CPW ISL DP-CL BL

OP3-MP OP3-DM OP2-DM SP3 LE3

OP3-IL OP2-IL

OP1-IL OP1-DM LIL2-I OP2-E OP2-L CP2 UE2 EP2 LE2 SP2 ED2 OP2-U

Figure 11C:
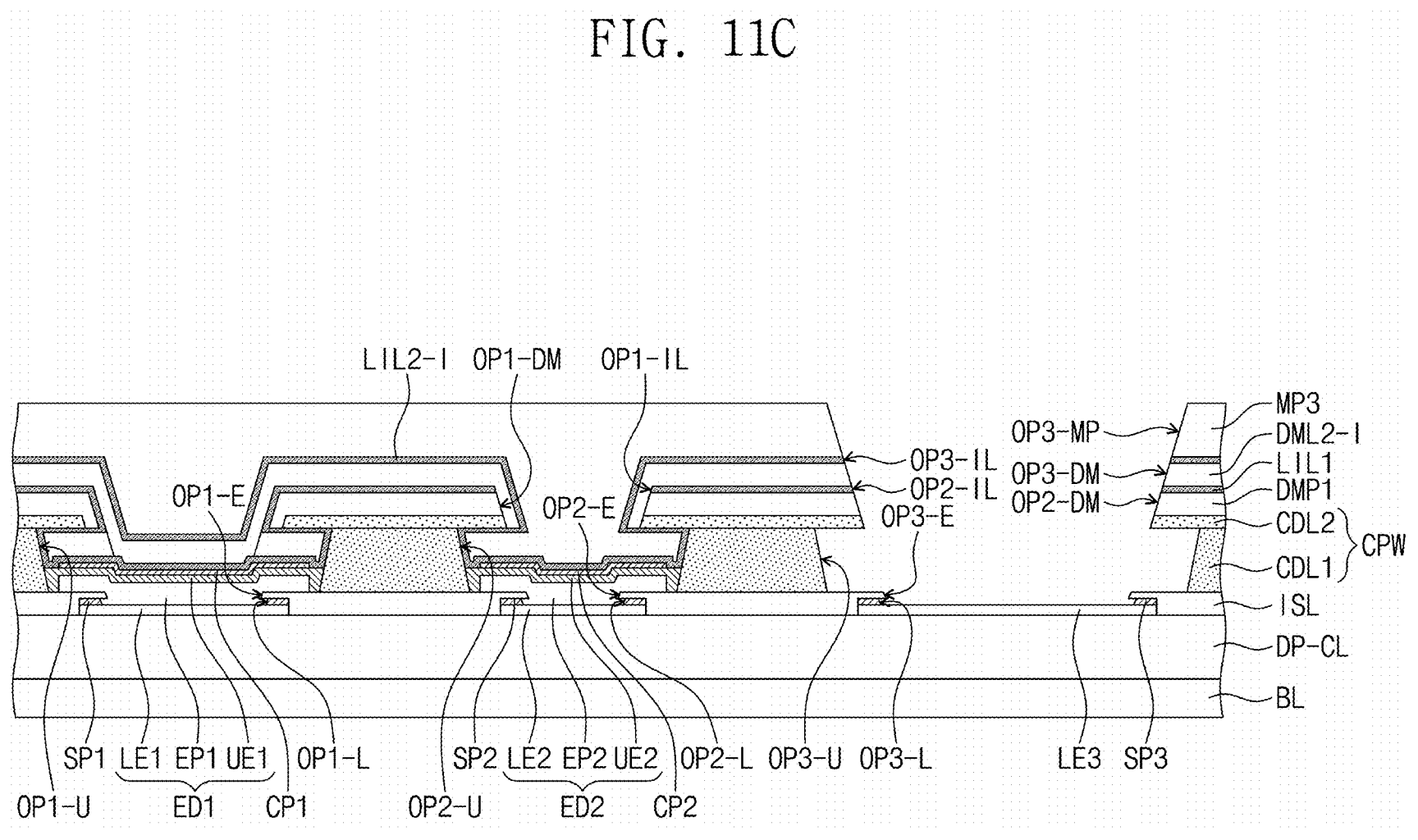

CPW
MP3
DML2-I
LIL1
DMP1
CDL2
CDL1
ISL
DP-CL
BL
SP3
LE3
OP3-MP
OP3-DM
OP2-DM
OP3-IL
OP2-IL
OP3-E
OP3-L
OP3-U
OP2-L
CP2
UE2
EP2
LE2
SP2
ED2
OP2-E
OP1-IL
OP1-DM
OP2-U
LIL2-I
OP1-L
CP1
UE1
EP1
LE1
SP1
ED1
OP1-E
OP1-U

FIG. 11D

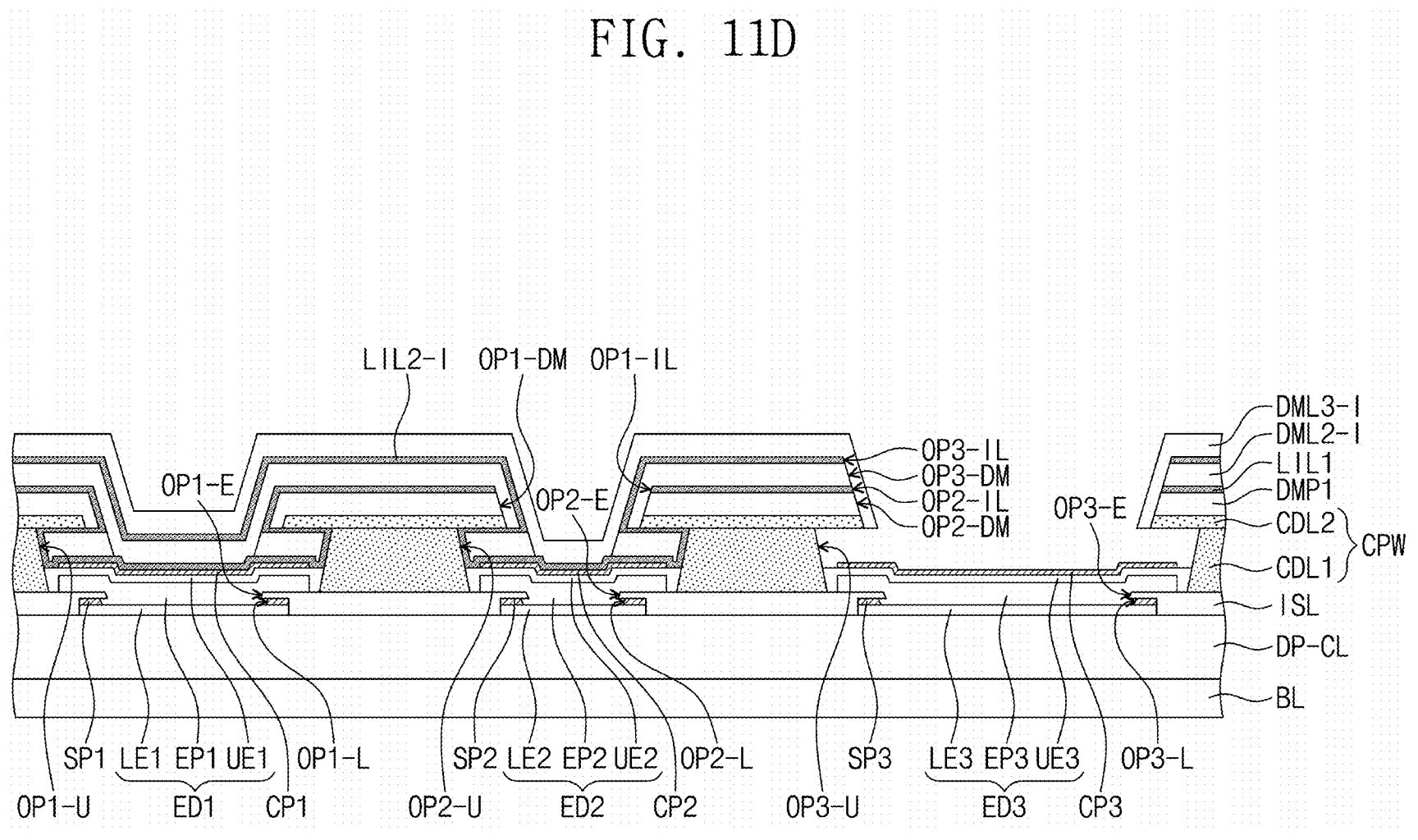

DML3-I
DML2-I
LIL1
DMP1
CDL2
CPW
CDL1
ISL
DP-CL
BL
OP3-L
OP3-E
CP3
UE3
EP3
LE3
ED3
OP3-IL
OP3-DM
OP2-IL
OP2-DM
SP3
OP3-U
OP2-L
CP2
UE2
EP2
LE2
ED2
SP2
OP2-U
OP2-E
OP1-IL
OP1-DM
LIL2-I
OP1-L
CP1
UE1
EP1
LE1
ED1
OP1-E
SP1
OP1-U

FIG. 11E

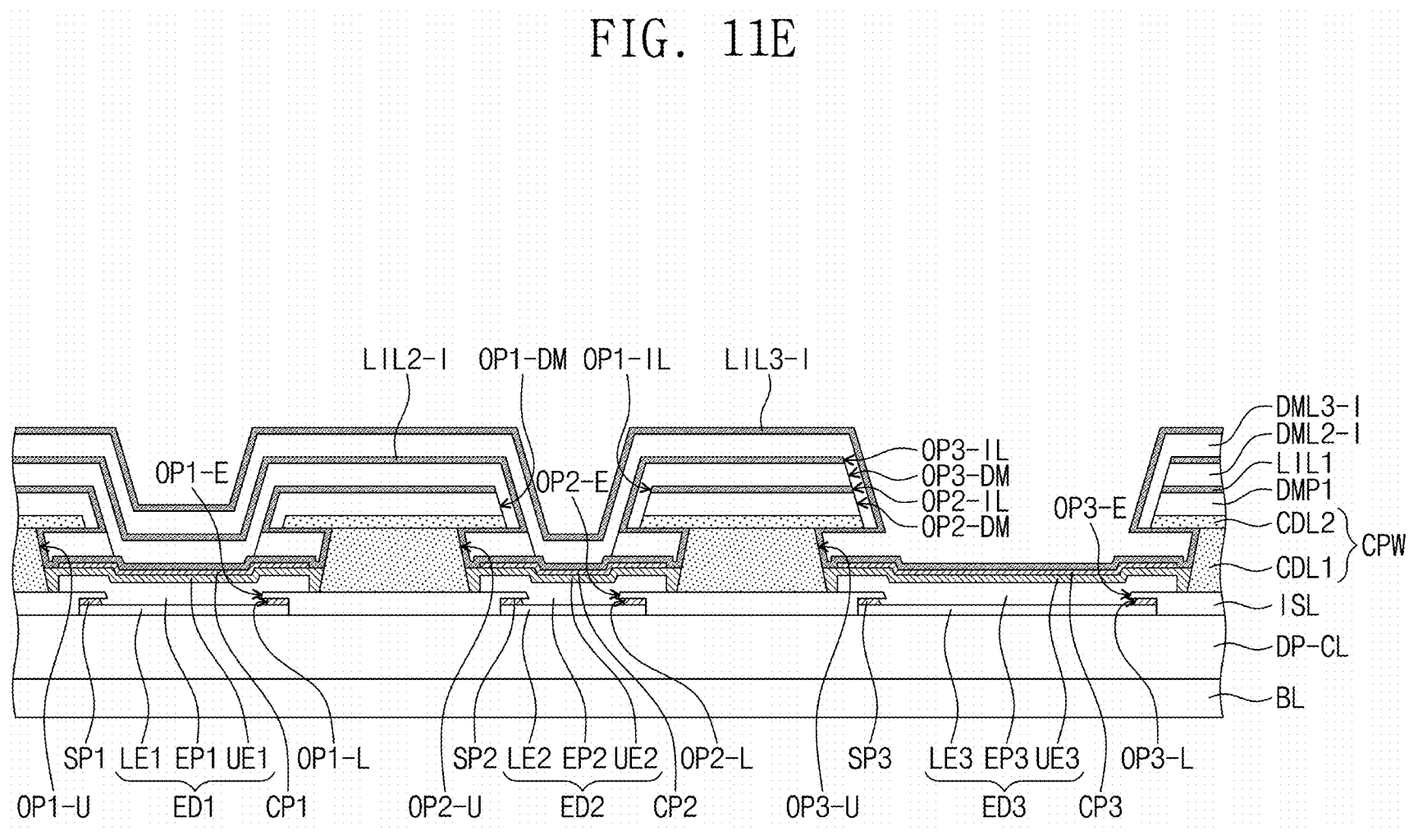

DML3-I
DML2-I
LIL1
DMP1
CDL2
CDL1
CPW
ISL
DP-CL
BL
OP3-E
OP3-L
CP3
UE3
EP3
LE3
ED3
OP3-IL
OP3-DM
OP2-IL
OP2-DM
SP3
OP3-U
LIL3-I
OP1-IL
OP1-DM
OP2-E
OP2-L
CP2
UE2
EP2
LE2
ED2
SP2
OP2-U
LIL2-I
OP1-E
OP1-L
CP1
UE1
EP1
LE1
ED1
SP1
OP1-U

Figure 12D:
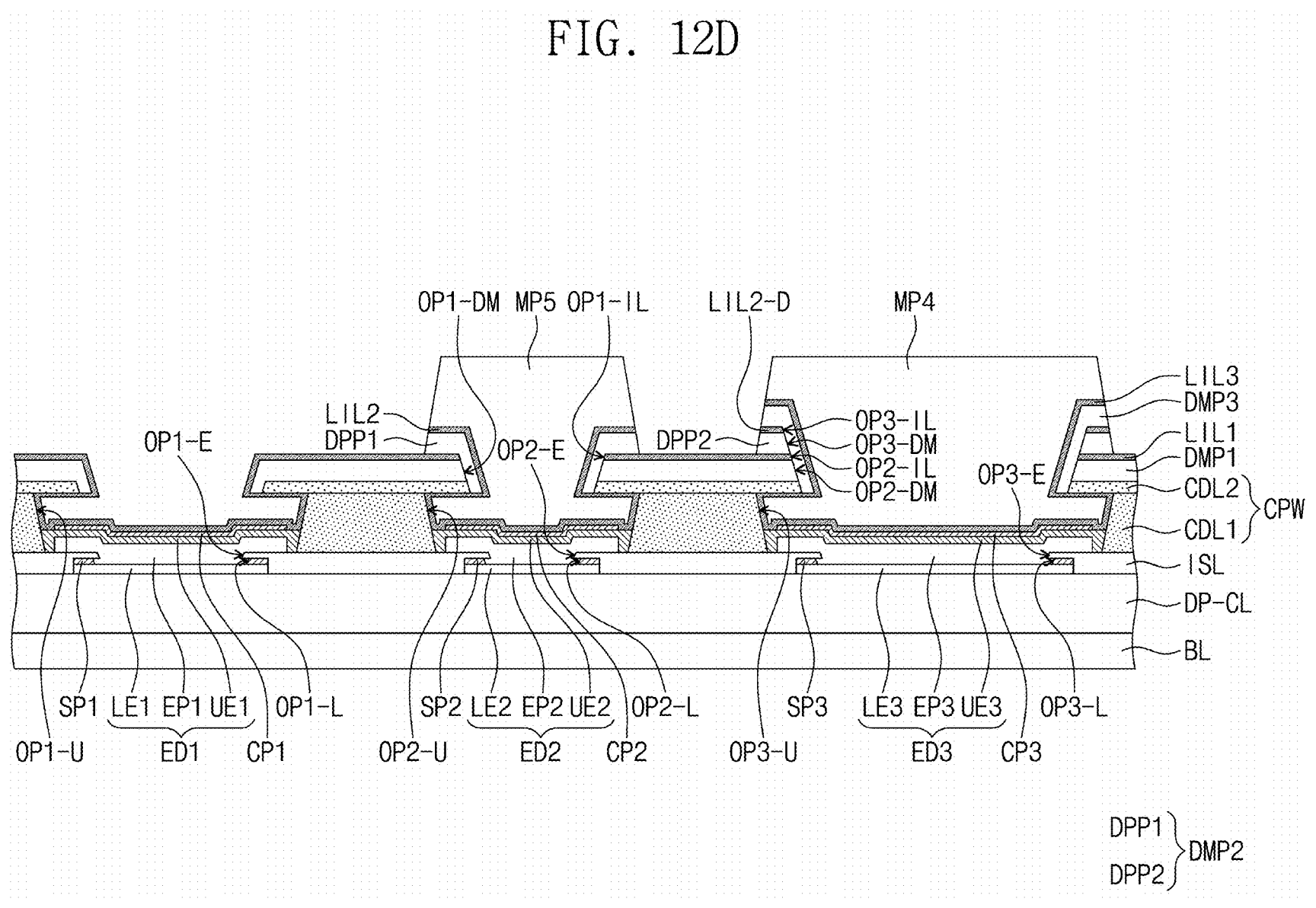

LIL3 DMP3 LIL1 DMP1 CDL2 CDL1 CPW ISL DP-CL BL
DPP1 DMP2 DPP2
MP4 OP3-IL OP3-DM OP2-IL OP2-DM OP3-E OP3-L CP3 UE3 EP3 LE3 ED3
LIL2-D DPP2 SP3 OP3-U
MP5 OP1-IL OP1-DM OP2-E OP2-L CP2 UE2 EP2 LE2 ED2 SP2 OP2-U
LIL2 DPP1 OP1-E OP1-L CP1 UE1 EP1 LE1 ED1 SP1 OP1-U

FIG. 12E

DISPLAY PANEL AND METHOD OF MANUFACTURING THE SAME

CROSS-REFERENCE TO RELATED APPLICATION(S)

This application claims priority to and benefits of Korean Patent Application No. 10-2022-0109424 under 35 U.S.C. § 119, filed on Aug. 30, 2022, in the Korean Intellectual Property Office, the entire contents of which are incorporated hereby by reference.

BACKGROUND

1. Technical Field

Embodiments relate to a display panel with a conductive bank and a method of manufacturing the display panel.

2. Description of the Related Art

A multimedia electronic device such as a television, a mobile phone, a tablet, a computer, a navigation device, and a game machine has a display panel for displaying an image.

The display panel includes a light emitting element and a pixel circuit for driving the light emitting element. The light emitting element included in the display panel emits light in response to a voltage applied from the pixel circuit and generates an image.

For improving reliability of the display panel, research on a method of patterning the light emitting element is in progress, and recently, a study on a method of patterning a light emitting material which is commonly provided in a pixel unit by using an open mask has been conducted.

SUMMARY

Embodiments provide a display panel capable of improving reliability by forming a conductive bank in contact with an electrode of a pixel. For example, an embodiment provides a display panel with a simplified process.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display pattern layer may include a base layer, a first lower electrode disposed on the base layer, a first sacrificial pattern layer disposed on the first lower electrode and defining a first lower opening exposing a portion of an upper surface of the first lower electrode, an insulating layer disposed on the base layer, covering at least a portion of the first sacrificial pattern layer, and defining a first emission opening overlapping the first lower opening, a conductive bank disposed on the insulating layer and defining a first upper opening overlapping the first emission opening, a first emission pattern layer disposed inside the first lower opening, the first emission opening, and the first upper opening and disposed on the first lower electrode, and a first upper electrode disposed on the first emission pattern layer and in contact with an inner surface of the conductive bank defining the first upper opening, wherein a thickness of the first emission pattern layer may be greater than a sum of a thickness of the first sacrificial pattern layer and a thickness of a portion of the insulating layer disposed on the first sacrificial pattern layer.

The first sacrificial pattern layer may include an amorphous transparent conductive oxide.

The first lower electrode may include a first layer including a metallic material and a second layer disposed on the first layer, exposed through the first lower opening, and including a crystallized transparent conductive oxide.

The conductive bank may include a first conductive layer having a first conductivity and a second conductive layer having a second conductivity lower than the first conductivity and disposed on the first conductive layer.

The first conductive layer may have a first thickness, and the second conductive layer may have a second thickness smaller than the first thickness.

An inner surface of the first conductive layer may define a first opening portion of the first upper opening, and an inner surface of the second conductive layer may define a second opening portion of the first upper opening, and the inner surface of the second conductive layer defining the second opening portion may be closer to a center portion of the first lower electrode than the inner surface of the first conductive layer defining the first opening portion, in a plan view.

The conductive bank may further include a third conductive layer disposed under the first conductive layer, and the second conductive layer and the third conductive layer may include a same material, and the first conductive layer may include a different material from the material of the second and third conductive layers.

The first conductive layer may have a first thickness, and the third conductive layer may have a third thickness smaller than the first thickness.

An inner surface of the third conductive layer defining a third opening portion of the first upper opening may be closer to a center portion of the first lower electrode than an inner surface of the first conductive layer defining a first opening portion of the first upper opening, in a plan view, and a thickness of the first emission pattern layer in a portion of the first emission pattern layer in contact with the first lower electrode may be greater than a sum of a thickness of the first sacrificial pattern layer, a thickness of the insulating layer, and a thickness of the third conductive layer.

The display panel may further include a first lower encapsulation inorganic layer disposed on the first upper electrode and the conductive bank, an encapsulation organic layer disposed on the first lower encapsulation inorganic layer, and an upper encapsulation inorganic layer disposed on the encapsulation organic layer, wherein the first lower encapsulation inorganic layer may be disposed inside the first upper opening and may be in contact with the inner surface of the conductive bank defining the first upper opening.

The display panel may further include a capping pattern layer disposed between the first upper electrode and the first lower encapsulation inorganic layer.

The display panel may further include a second lower electrode spaced apart from the first lower electrode, the first lower electrode and the second lower electrode disposed on a same layer, a second sacrificial pattern layer disposed on the second lower electrode and defining a second lower opening exposing a portion of an upper surface of the second lower electrode, a second emission pattern layer disposed on the second lower electrode and spaced apart from the first emission pattern layer, and a second upper electrode disposed on the second emission pattern layer and spaced apart from the first upper electrode, wherein a second emission opening spaced apart from the first emission opening may be defined in the insulating layer, and a second upper opening spaced apart from the first upper opening may be defined in the conductive bank, and the second emission pattern layer may be disposed inside the second lower opening, the second emission opening, and the second upper opening, and the second upper electrode may be in contact with the inner surface of the conductive bank defining the second upper opening.

The display panel may further include a first dummy pattern layer having an integral shape, completely covering an upper surface of the conductive bank, and spaced apart from the first emission pattern layer and the second emission pattern layer, wherein the first dummy pattern layer may include an organic layer, and the organic layer of the first dummy pattern layer and the first emission pattern layer may include a same material.

The first dummy pattern layer may further include a conductive layer disposed on the organic layer, and the conductive layer of the first dummy pattern layer and the first upper electrode may include a same material.

The display panel may further include a first lower encapsulation inorganic layer disposed on the first upper electrode and the first dummy pattern layer, having an integral shape, and defining a first encapsulation opening overlapping the second upper opening.

The display panel may further include a second lower encapsulation inorganic layer disposed on the second upper electrode and in contact with the inner surface of the conductive bank defining the second upper opening, wherein the second lower encapsulation inorganic layer may be disposed on the first lower encapsulation inorganic layer on the upper surface of the conductive bank.

A first dummy pattern opening overlapping the second upper opening may be defined in the first dummy pattern layer.

The display panel may further include a second dummy pattern layer overlapping an inner surface of the first dummy pattern layer defining the first dummy pattern opening and disposed on the first dummy pattern layer on the upper surface of the conductive bank.

The second dummy pattern layer may include an organic layer spaced apart from the second emission pattern layer, the organic layer of the second dummy pattern layer and the second emission pattern layer including a same material and a conductive layer disposed on the organic layer of the second dummy pattern layer, the conductive layer and the second upper electrode including a same material.

The display panel may further include a third lower electrode spaced apart from the first lower electrode and the second lower electrode, the third lower electrode and the first lower electrode disposed on a same layer, a third sacrificial pattern layer disposed on the third lower electrode and defining a third lower opening exposing a portion of an upper surface of the third lower electrode, a third emission pattern layer disposed on the third lower electrode and spaced apart from the first and second emission pattern layers, and a third upper electrode disposed on the third emission pattern layer and spaced apart from the first and second upper electrodes, wherein a third emission opening spaced apart from the first and second emission openings may be defined in the insulating layer, and a third upper opening spaced apart from the first and second upper openings may be defined in the conductive bank, and the third emission pattern layer may be disposed inside the third lower opening, the third emission opening, and the third upper opening, and the third upper electrode may be in contact with the inner surface of the conductive bank defining the third upper opening.

A second dummy pattern opening overlapping the third upper opening may be defined in the first dummy pattern layer, and the second dummy pattern layer may include a first dummy part overlapping the inner surface of the first dummy pattern layer defining the first dummy pattern opening, and a second dummy part spaced apart from the first dummy part and defining a third dummy pattern opening overlapping the third upper opening.

The display panel may further include a third dummy pattern layer disposed on the second dummy pattern layer, wherein the third dummy pattern layer may overlap the inner surface of the first dummy pattern layer defining the second dummy pattern opening and an inner surface of the second dummy part defining the third dummy pattern opening, and may be disposed on the second dummy part on the upper surface of the conductive bank.

The display panel may further include a first lower encapsulation inorganic layer disposed on the first upper electrode and the first dummy pattern layer, wherein the first lower encapsulation inorganic layer may have an integral shape, and a first encapsulation opening overlapping the second upper opening and a second encapsulation opening overlapping the third upper opening may be defined in the first lower encapsulation inorganic layer.

The display panel may further include a second lower encapsulation inorganic layer disposed on the second upper electrode and the first dummy part and in contact with the inner surface of the conductive bank defining the second upper opening, and a dummy inorganic layer spaced apart from the second lower encapsulation inorganic layer and disposed on the second dummy part, the dummy inorganic layer and the second lower encapsulation inorganic layer including a same material, wherein the dummy inorganic layer may overlap the first lower encapsulation inorganic layer, and a dummy inorganic opening overlapping the third upper opening may be defined in the dummy inorganic layer.

The display panel may further include a third lower encapsulation inorganic layer disposed on the third upper electrode and the second dummy part and in contact with the inner surface of the conductive bank defining the third upper opening, wherein the third lower encapsulation inorganic layer may be disposed on the first lower encapsulation inorganic layer and the dummy inorganic layer on the upper surface of the conductive bank.

The conductive bank may be configured to receive a bias voltage.

An inner surface of the insulating layer defining the first emission opening may be closer to a center portion of the first lower electrode than an inner surface of the first sacrificial pattern layer defining the first lower opening.

In an embodiment, a display panel may include a base layer, a lower electrode disposed on the base layer, a sacrificial pattern layer disposed on the lower electrode and defining a lower opening exposing a portion of an upper surface of the lower electrode, an insulating layer disposed on the base layer, covering at least a portion of the sacrificial pattern layer, and defining an emission opening overlapping the lower opening, a conductive bank disposed on the insulating layer, defining an upper opening overlapping the emission opening, and including a first conductive layer and a second conductive layer disposed on the first conductive layer, an emission pattern layer disposed on the lower electrode and covering an inner surface of the insulating layer defining the emission opening, and an upper electrode disposed on the emission pattern layer and in contact with an inner surface of the conductive bank defining the upper opening, wherein the upper opening defined in the second conductive layer may overlap the upper opening defined in the first conductive layer, and a size of the upper opening of the second conductive layer may be smaller than a size of the upper opening of the first conductive layer, in a plan view, and a minimum separation distance from the upper surface of the lower electrode to the upper surface of the emission pattern layer in a thickness direction may be greater than a maximum separation distance from the upper surface of the lower electrode to the upper surface of the insulating layer in the thickness direction.

In an embodiment, a method of manufacturing a display panel may include forming a preliminary display panel including a base layer, a first lower electrode disposed on the base layer, a first sacrificial pattern layer disposed on the first lower electrode, an insulating layer disposed on the base layer to cover the first lower electrode and the first sacrificial pattern layer, and a conductive bank layer disposed on the insulating layer, forming a first upper opening overlapping the first lower electrode in the conductive bank layer, forming a first emission opening in the insulating layer, forming a first lower opening in the first sacrificial pattern layer, forming a first emission pattern layer on the first lower electrode inside the first upper opening, the first emission opening, and the first lower opening, and forming a first upper electrode on the first emission pattern layer to be in contact with an inner surface of the conductive bank defining the first upper opening, wherein in the forming of the first emission pattern layer, the first emission pattern layer is formed to have a thickness greater than a sum of a thickness of the first sacrificial pattern layer and a thickness of the insulating layer.

The conductive bank layer may include a first conductive layer and a second conductive layer disposed on the first conductive layer, and the forming of the first upper opening may include dry etching the first and second conductive layers to form a first preliminary upper opening in the conductive bank layer and wet etching the first and second conductive layers to form a conductive bank from the conductive bank layer and to form the first upper opening from the first preliminary upper opening, and an inner surface of the second conductive layer defining a second opening portion of the first upper opening may be closer to a center portion of the first lower electrode than an inner surface of the first conductive layer defining a first opening portion of the first upper opening, in a plan view.

The forming of the first emission opening may be performed by a dry etching process, and the forming of the first lower opening is performed by a wet etching process, and an inner surface of the insulating layer defining the first emission opening may be closer to a center portion of the first lower electrode than an inner surface of the first sacrificial pattern layer defining the first lower opening.

In the forming of the first lower opening, an etch rate of the first lower electrode may be smaller than an etch rate of the first sacrificial pattern layer.

In the forming of the preliminary display panel, the preliminary display panel may further include a second lower electrode spaced apart from the first lower electrode and a second sacrificial pattern layer disposed on the second lower electrode.

After the forming of the first upper electrode, the method may further include forming a first lower encapsulation inorganic layer on the conductive bank and the first upper electrode, forming a first encapsulation opening overlapping the second lower electrode in the first lower encapsulation inorganic layer, forming a second upper opening spaced apart from the first upper opening and overlapping the first encapsulation opening in the conductive bank, forming a second emission opening spaced apart from the first emission opening in the insulating layer, forming a second lower opening in the second sacrificial pattern layer, forming a second emission pattern layer on the second lower electrode inside the second upper opening, the second emission opening, and the second lower opening, and forming a second upper electrode on the second emission pattern layer to be in contact with an inner surface of the conductive bank defining the second upper opening.

In the forming of the first emission pattern layer, a first dummy pattern layer spaced apart from the first emission pattern layer may be further formed on the conductive bank, the first dummy pattern layer and the first emission pattern layer including a same material, and the method may further include forming a first dummy pattern opening overlapping the first encapsulation opening in the first dummy pattern layer between the forming of the first encapsulation opening in the first lower encapsulation inorganic layer and the forming of the second upper opening in the conductive bank.

After the forming of the second upper electrode, the method may further include forming a second preliminary lower encapsulation inorganic layer on the conductive bank and the first and second upper electrodes and removing a portion of the second preliminary lower encapsulation inorganic layer overlapping the first emission opening to form a second lower encapsulation inorganic layer from the second preliminary lower encapsulation inorganic layer.

In the forming of the preliminary display panel, the preliminary display panel may further include a third lower electrode spaced apart from the first and second lower electrodes, and a third sacrificial pattern layer disposed on the third lower electrode.

After the forming of the second upper electrode, the method may further include forming a second preliminary lower encapsulation inorganic layer on the conductive bank and the second upper electrode, forming a third encapsulation opening overlapping the third lower electrode in the second preliminary lower encapsulation inorganic layer, forming a second encapsulation opening overlapping the third encapsulation opening in the first lower encapsulation inorganic layer, forming a third upper opening spaced apart from the first and second upper openings and overlapping the third encapsulation opening in the conductive bank, forming a third emission opening spaced apart from the first and second emission openings in the insulating layer, forming a third lower opening in the third sacrificial pattern layer, forming a third emission pattern layer on the third lower electrode inside the third upper opening, the third emission opening, and the third lower opening, and forming a third upper electrode on the third emission pattern layer to be in contact with an inner surface of the second conductive layer defining the third upper opening.

In the forming of the first emission pattern layer, a first dummy pattern layer spaced apart from the first emission pattern layer may be further formed on the conductive bank, the first dummy pattern layer and the first emission pattern layer including a same material, and, in the forming of the second emission pattern layer, a second dummy pattern layer spaced apart from the second emission pattern layer may be further formed on the conductive bank, the second dummy pattern layer and the second emission pattern layer including a same material, and the method may further include forming a third dummy pattern opening overlapping the third encapsulation opening in the second dummy pattern layer between the forming of the third encapsulation opening in the second preliminary lower encapsulation inorganic layer and the forming of the second encapsulation opening in the first lower encapsulation inorganic layer and forming a second dummy pattern opening overlapping the second encapsulation opening in the first dummy pattern layer between the forming of the second encapsulation opening in the first lower encapsulation inorganic layer and the forming of the third upper opening in the conductive bank.

After the forming of the third upper electrode, the method may further include forming a third preliminary lower encapsulation inorganic layer on the conductive bank and the first to third upper electrodes, removing a portion of the third preliminary lower encapsulation inorganic layer overlapping the first and second emission openings to form a third lower encapsulation inorganic layer from the third preliminary lower encapsulation inorganic layer, removing a portion of the second preliminary lower encapsulation inorganic layer overlapping the first emission opening and a portion of the second preliminary lower encapsulation inorganic layer overlapping the conductive bank adjacent to the second emission opening to form the second lower encapsulation inorganic layer and a dummy inorganic layer from the second preliminary lower encapsulation inorganic layer, and forming an encapsulation organic layer and an upper encapsulation inorganic layer on the first and second lower encapsulation inorganic layers, wherein the second lower encapsulation inorganic layer may overlap the second emission opening, and the dummy inorganic layer may be spaced apart from the second lower encapsulation inorganic layer and disposed under the third lower encapsulation inorganic layer and may include the third encapsulation opening.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1A is a schematic perspective view of a display device according to an embodiment.

FIG. 5B is a schematic cross-sectional view of a display panel according to an embodiment taken along II-Ir of FIG. 4.

FIG. 5D is a schematic enlarged plan view of a part of a display panel according to an embodiment.

FIGS. 9A to 9I are schematic cross-sectional views illustrating some steps of a method of manufacturing a display panel according to an embodiment.

FIGS. 11A to 11E are schematic cross-sectional views illustrating some steps of a method of manufacturing a display panel according to an embodiment.

FIGS. 12A to 12E are schematic cross-sectional views illustrating some steps of a method of manufacturing a display panel according to an embodiment.

DETAILED DESCRIPTION OF THE EMBODIMENTS

Figure 1B:
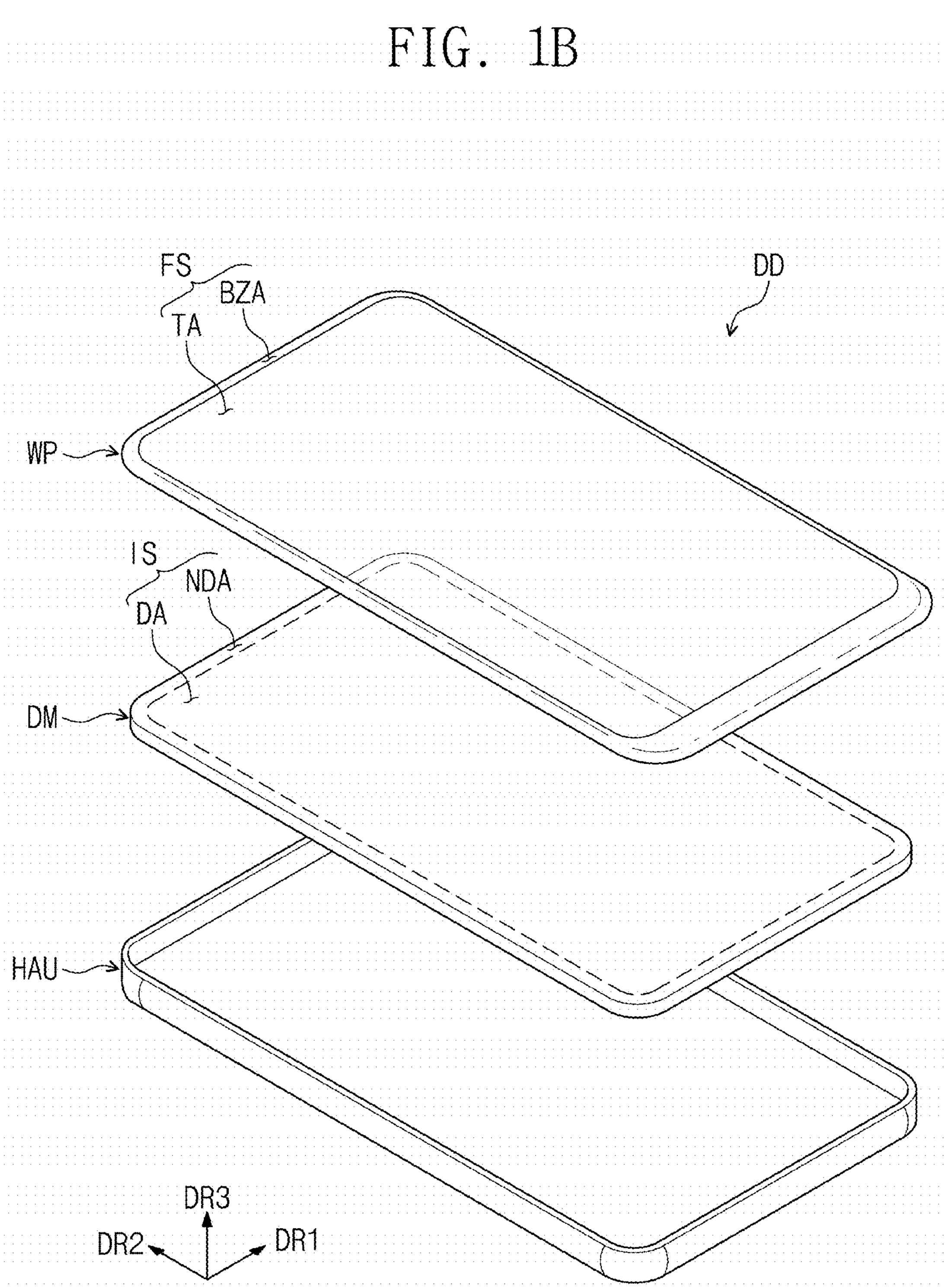
FIG. 1B is a schematic exploded perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to drawings.

Figure 2:
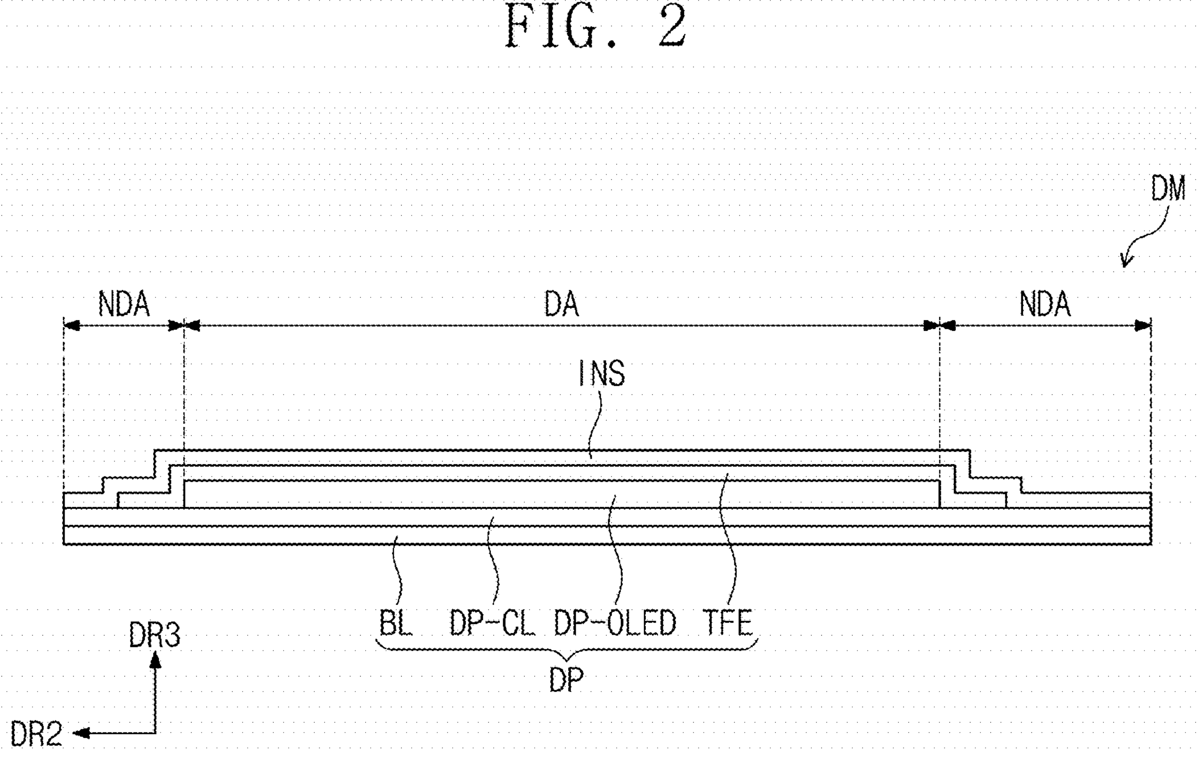
FIG. 2 is a schematic cross-sectional view of a display panel according to an embodiment.

FIG. 1A is a schematic perspective view of a display device according to an embodiment. FIG. 1B is an exploded perspective view of a display device according to an embodiment. FIG. 2 is a schematic cross-sectional view of a display panel according to an embodiment.

In an embodiment, a display device DD may be a large electronic device such as a television, a monitor, or an external billboard. For example, the display device DD may be a small or medium-sized electronic device such as a personal computer, a notebook computer, a personal digital terminal, a car navigation unit, a game machine, a smart phone, a tablet, and a camera. These are merely presented as examples, and other display devices may be employed without departing from the invention. In this embodiment, the display device DD is shown to be a smart phone.

Referring to FIGS. 1A, 1B, and 2, the display device DD may display an image IM toward a third direction DR3 on a display surface FS, which is parallel to each of a first direction DR1 and a second direction DR2. The image IM may include a still image as well as a dynamic image. In FIG. 1B, a watch window and icons are illustrated as an example of the image IM. The display surface FS on which the image IM is displayed may correspond to a front surface of the display device DD.

In an embodiment, a front surface (or upper surface) and a rear surface (or lower surface) of each member are defined based on a direction in which the image IM is displayed. The front surface and the rear surface may be opposite to each other in the third direction DR3, and a normal direction of each of the front surface and the rear surface may be parallel to the third direction DR3. The directions that the first to third directions DR1, DR2, and DR3 indicate may be converted to other directions as a relative concept. In the description, "in a plan view" may mean when viewed in the third direction DR3.

As shown in FIG. 1B, the display device DD according to an embodiment may include a window WP, a display module DM, and a housing HAU. The window WP and the housing HAU may be assembled to each other to form an exterior of the display device DD.

The window WP may include an optically transparent insulating material. For example, the window WP may include glass or plastic. A front surface of the window WP may define (or form) the display surface FS of the display device DD. The display surface FS may include a transmission area TA and a bezel area BZA. The transmission area TA may be an optically transparent area. For example, the transmission area TA may be an area having a visible light transmittance of about 90% or more.

The bezel area BZA may be an area having relatively low light transmittance as compared to the transmission area TA. The bezel area BZA may define (or determine) a shape of the transmission area TA. The bezel area BZA may be adjacent to the transmission area TA and surround the transmission area TA. This is illustrated by way of example, and in the window WP according to an embodiment, the bezel area BZA may be omitted. The window WP may include at least one functional layer of an anti-fingerprint layer, a hard coating layer, and an anti-reflection layer, and embodiment are not limited thereto.

The display module DM may be disposed under the window WP. The display module DM may generate the image IM. The image IM generated by the display module DM may be displayed on a display surface IS of the display module DM, and may be visually recognized by a user from the outside through the transmission area TA.

The display module DM may include a display area DA and a non-display area NDA. The display area DA may be an area activated in response to an electrical signal. The non-display area NDA is adjacent to the display area DA. The non-display area NDA may surround the display area DA. The non-display area NDA may be an area covered by the bezel area BZA and may not be visually recognized from the outside.

As shown in FIG. 2, the display module DM according to an embodiment may include a display panel DP and an input sensor INS. For example, the display device DD according to an embodiment may further include a protection member disposed on a lower surface of the display panel DP or an anti-reflection member and/or a window member disposed on an upper surface of the input sensor INS.

The display panel DP may be a light emitting display panel, but embodiments are not limited thereto. For example, the display panel DP may be an organic light emitting display panel or an inorganic light emitting display panel. An emission layer in the organic light emitting display panel may include an organic light emitting material. An emission layer in the inorganic light emitting display panel may include quantum dots, quantum rods, or micro LEDs. Hereinafter, the display panel DP will be described as an organic light emitting display panel.

The display panel DP may include a base layer BL, a circuit element layer DP-CL, a display element layer DP-OLED, and a thin film encapsulation layer TFE which are disposed on the base layer BL. The input sensor INS may be disposed (e.g., directly disposed) on the thin film encapsulation layer TFE. As used herein, "configuration A is disposed directly on configuration B" means that no adhesive layer is disposed between configuration A and configuration B.

The base layer BL may include at least one plastic film. The base layer BL may be a flexible substrate and may include a plastic substrate, a glass substrate, a metal substrate, or an organic/inorganic composite substrate. In the description, the display area DA and the non-display area NDA may be defined in the base layer BL, and components disposed on the base layer BL may overlap the display area DA or the non-display area NDA.

The circuit element layer DP-CL may include at least one insulating layer and a circuit element. The insulating layer may include at least one inorganic layer and at least one organic layer. The circuit element may include signal lines, a driving circuit of a pixel, and the like.

The display element layer DP-OLED may include a conductive bank (e.g., a conductive partition wall) and a light emitting element. The light emitting element may include a lower electrode, an emission pattern layer, and an upper electrode.

The thin film encapsulation layer TFE may include thin films. Some thin films may be arranged to improve optical efficiency, and some thin films may be arranged to protect organic light emitting diodes.

The input sensor INS may obtain coordinate information of an external input. The input sensor INS may have a multi-layered structure. The input sensor INS may include a single conductive layer or a multiple conductive layers. The input sensor INS may include a single-layered insulating layer or a multi-layered insulating layer. The input sensor INS may sense an external input, for example, in a capacitive manner. However, an operation manner of the input sensor INS is not limited thereto, and in an embodiment, the input sensor INS may also sense an external input by using an electromagnetic induction manner or a pressure sensing manner. In another example, the input sensor INS may be omitted.

As shown in FIG. 1B, the housing HAU may be assembled to the window WP. The housing HAU may be assembled to the window WP to provide a predetermined internal space. The display module DM may be accommodated in the internal space.

The housing HAU may include a material having relatively high rigidity. For example, the housing HAU may include frames and/or plates made of glass, plastic, metal, or a combination thereof. The housing HAU may stably protect components of the display device DD accommodated in the internal space from external impact.

Figure 3:
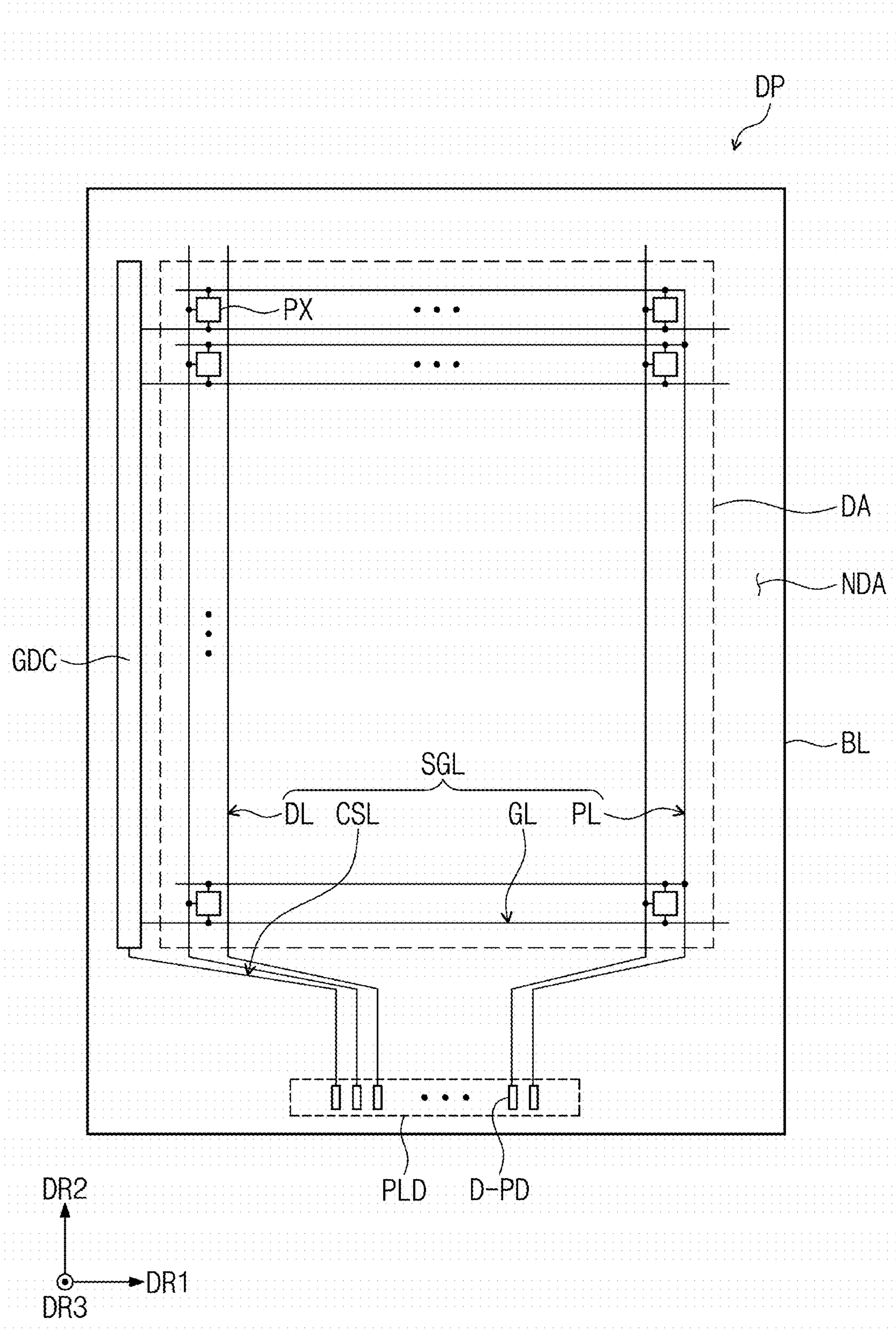
FIG. 3 is a schematic plan view of a display panel according to an embodiment.

FIG. 3 is a schematic plan view of a display panel according to an embodiment.

Referring to FIG. 3, a display panel DP may include a base layer BL divided into a display area DA and a non-display area NDA described with reference to FIG. 2.

The display panel DP may include pixels PX disposed in the display area DA and signal lines SGL connected (e.g., electrically connected) to the pixels PX. The display panel DP may include a driving circuit GDC and a pad part PLD disposed in the non-display area NDA.

The pixels PX may be arranged in a first direction DR1 and a second direction DR2. The pixels PX may include pixel rows extending in the first direction DR1 and arranged in the second direction DR2, and pixels columns extending in the second direction DR2 and arranged in the first direction DR1.

The signal lines SGL may include gate lines GL, data lines DL, a power line PL, and a control signal line CSL.

Each of the gate lines GL may be connected (e.g., electrically connected) to a corresponding one of the pixels PX, and each of the data lines DL may be connected (e.g., electrically connected) to a corresponding one of the pixels PX. The power line PL may be connected (e.g., electrically connected) to the pixels PX. The control signal line CSL may be connected (e.g., electrically connected) to the driving circuit GDC to provide control signals to the driving circuit GDC.

The driving circuit GDC may include a gate driving circuit. The gate driving circuit may generate gate signals and sequentially output the generated gate signals to the gate lines GL. The gate driving circuit may further output another control signal to the pixel driving circuit.

The pad part PLD may be a part to which a flexible circuit board is connected. The pad part PLD may include pixel pads D-PD, and the pixel pads D-PD may be pads for connecting the flexible circuit board to the display panel DP. Each of the pixel pads D-PD may be connected (e.g., electrically connected) to a corresponding signal line among the signal lines SGL. The pixel pads D-PD may be connected (e.g., electrically connected) to the corresponding pixels PX through the signal lines SGL. For example, one of the pixel pads D-PD may be connected (e.g., electrically connected) to the driving circuit GDC.

For example, the pad part PLD may further include input pads. The input pads may be pads for connecting the flexible circuit board to an input sensor INS (refer to FIG. 2). However, embodiments are not limited thereto, and the input pads may be disposed on the input sensor INS (refer to FIG. 2) and may be connected (e.g., electrically connected) to a circuit board separate from the pixel pads D-PD. In another example, the input sensor INS (refer to FIG. 2) may be omitted and may not further include input pads.

Figure 4:
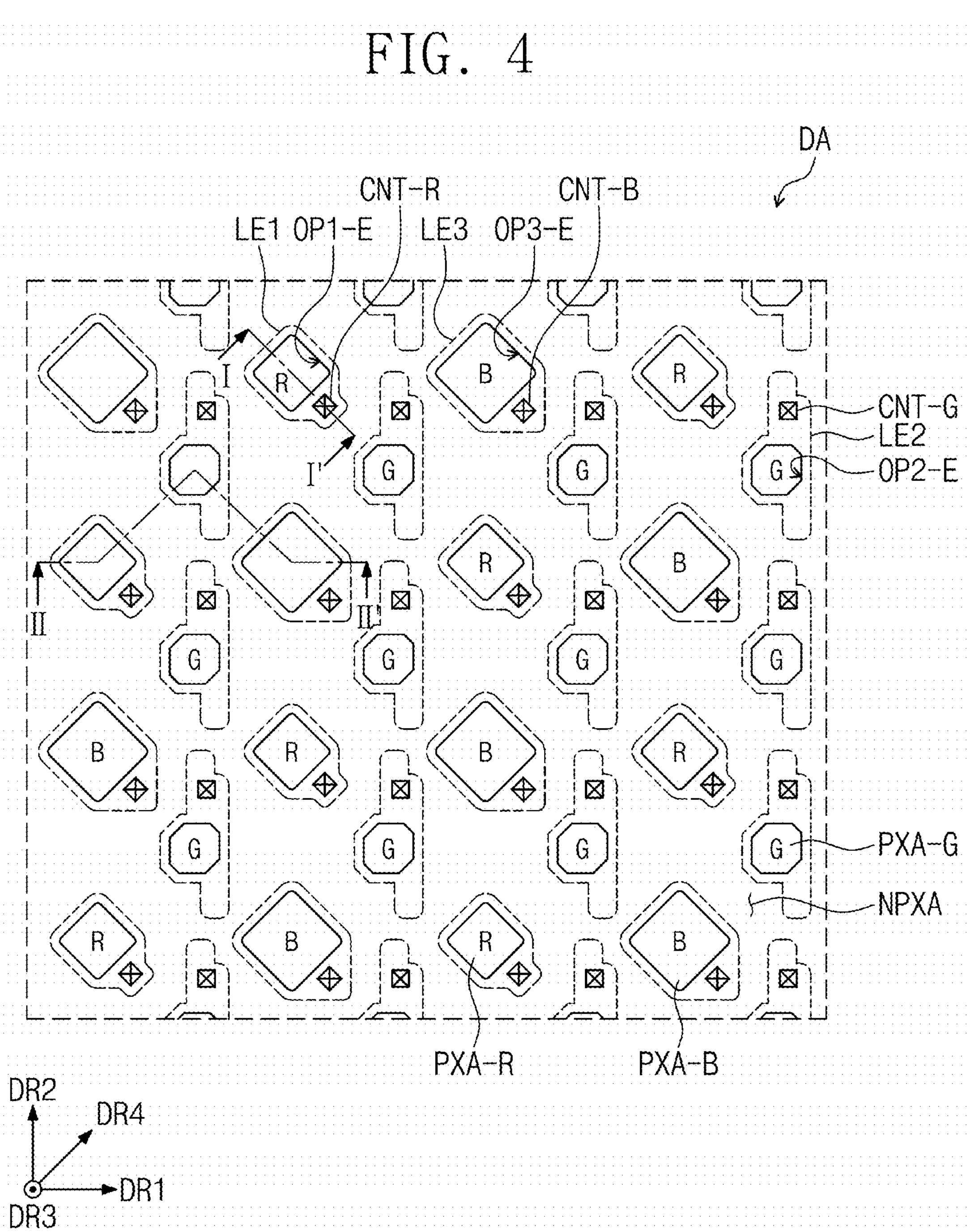
FIG. 4 is a schematic enlarged plan view of a part of a display area of a display panel according to an embodiment.

FIG. 4 is a schematic enlarged plan view of a part of a display area of a display panel according to an embodiment. FIG. 4 is a schematic plan view of a display module DM (refer to FIG. 2) viewed from a display surface IS (refer to FIG. 2) of the display module DM (refer to FIG. 2), and illustrates an arrangement of emission areas PXA-R, PXA-G, and PXA-B.

Referring to FIG. 4, a display area DA may include first to third emission areas PXA-R, PXA-G, and PXA-B and a non-emission area NPXA surrounding the first to third emission areas PXA-R, PXA-G, and PXA-B. The first to third emission areas PXA-R, PXA-G, and PXA-B may correspond to regions emitting light provided from light emitting elements ED1, ED2, and ED3 (refer to FIG. 5B), respectively. In FIG. 4, for the descriptive convenience, only lower electrodes LE1, LE2, and LE3 among configurations of the light emitting elements ED1, ED2, and ED3 (refer to FIG. 5B) are illustrated. The first to third emission areas PXA-R, PXA-G, and PXA-B may be classified according to color of light emitted toward the outside of the display module DM (refer to FIG. 2).

The first to third emission areas PXA-R, PXA-G, and PXA-B may provide first to third color lights having different colors, respectively. For example, a first color light may be red light, a second color light may be green light, and a third color light may be blue light. However, examples of the first to third color lights are not limited thereto.

Each of the first to third emission areas PXA-R, PXA-G, and PXA-B may be defined as an area exposed by each of corresponding emission openings OP1-E, OP2-E, and OP3-E of upper surfaces of the corresponding lower electrodes LE1, LE2, and LE3. In an embodiment, the emission openings OP1-E, OP2-E, and OP3-E may be defined in an insulating layer ISL (refer to FIG. 5B) that covers a portion of the lower electrodes LE1, LE2, and LE3, and a detailed description thereof will be given below.

The first emission area PXA-R is defined as an area exposed by the first emission opening OP1-E among the upper surface of the first lower electrode LE1, and the second emission area PXA-G is defined as an area exposed by the second emission opening OP2-E among the upper surface of the lower electrode LE2, and the third emission area PXA-B is defined as an area exposed by the third emission opening OP3-E among the upper surface of the third lower electrode LE3.

The non-emission area NPXA may set a boundary between the first to third emission areas PXA-R, PXA-G, and PXA-B, and prevent color mixing between the first to third emission areas PXA-R, PXA-G, and PXA-B.

Each of the first to third emission areas PXA-R, PXA-G, and PXA-B may be provided in plurality to have a certain arrangement and may be repeatedly disposed in the display area DA. For example, the first and third emission areas PXA-R and PXA-B may be alternately arranged in the first direction DR1 to form a 'first group'. The second emission areas PXA-G may be arranged in the first direction DR1 to form a 'second group'. Each of the 'first group' and the 'second group' may be provided in plurality, and the 'first groups' and the 'second groups' may be alternately arranged in the second direction DR2.

A single second emission area PXA-G may be spaced apart from a single first emission area PXA-R or a single third emission area PXA-B in a fourth direction DR4. The fourth direction DR4 may be defined as a direction between the first and second directions DR1 and DR2.

FIG. 4 illustrates an arrangement of the first to third emission areas PXA-R, PXA-G, and PXA-B, but embodiments are not limited thereto and may be arranged in various forms. In an embodiment, the first to third emission areas PXA-R, PXA-G, and PXA-B may have a Pentile™ arrangement as shown in FIG. 4. In another example, the first to third emission areas PXA-R, PXA-G, and PXA-B may have a stripe arrangement or a Diamond Pixel™ arrangement.

The first to third emission areas PXA-R, PXA-G, and PXA-B may have various shapes in a plan view. For example, the first to third emission areas PXA-R, PXA-G, and PXA-B may have a polygonal shape, a circular shape, or an elliptical shape. FIG. 4 illustrates first and third emission areas PXA-R and PXA-B having a tetragonal shape (or a rhombus shape) and a second emission area PXA-G having an octagonal shape, in a plan view.

The first to third emission areas PXA-R, PXA-G, and PXA-B may have the same shape in a plan view, or at least some of them may have different shapes. FIG. 4 illustrates first and third emission areas PXA-R and PXA-B having the same shape in a plan view and a second emission areas PXA-G having a different shape from the shape of the first and third emission areas PXA-R and PXA-B.

At least some of the first to third emission areas PXA-R, PXA-G, and PXA-B may have different areas in a plan view. In an embodiment, an area of the first emission area PXA-R emitting red light may be greater than an area of the second emission area PXA-G emitting green light, and may be smaller than an area of the third emission area PXA-B emitting blue light. However, a relationship between a size of the areas between the first to third emission areas PXA-R, PXA-G, and PXA-B according to the outgoing color is not limited thereto, and may be various according to a design of the display module DM (refer to FIG. 2). For example, embodiments are not limited thereto, and the first to third emission areas PXA-R, PXA-G, and PXA-B may have the same area as each other, in a plan view.

The shape, area, arrangement, or the like of the first to third emission areas PXA-R, PXA-G, and PXA-B of the display module DM (refer to FIG. 2) may be designed in various ways according to the color of the emitted light or the size and configuration of the display module DM (refer to FIG. 2), and is not limited to the embodiment illustrated in FIG. 4.

The lower electrodes LE1, LE2, and LE3 may be connected (e.g., electrically connected) to driving circuits of pixels in a circuit element layer DP-CL (refer to FIG. 2) through connection contact holes CNT-R, CNT-G, and CNT-B. The connection contact holes CNT-R, CNT-G, and CNT-B may include a first connection contact hole CNT-R, a second connection contact hole CNT-G, and a third connection contact hole CNT-B. The first connection contact hole CNT-R may be defined as an opening portion where the first lower electrode LE1 is connected (e.g., electrically connected) to the driving circuit of the corresponding pixel, and the second connection contact hole CNT-G may be defined as an opening portion where the second lower electrode LE2 is connected (e.g., electrically connected) to the driving circuit of the corresponding pixel, and the third connection contact hole CNT-B may be defined as an opening portion where the third lower electrode LE3 is connected (e.g., electrically connected) to the driving circuit of the corresponding pixel.

The connection contact holes CNT-R, CNT-G, and CNT-B may be spaced apart from the emission areas PXA-R, PXA-G, and PXA-B defined in the lower electrodes LE1, LE2, and LE3, respectively. However, this is only an example, and the connection contact holes CNT-R, CNT-G, and CNT-B may overlap the emission areas PXA-R, PXA-G, and PXA-B defined in the lower electrodes LE1, LE2, and LE3. A detailed description of the connection contact holes CNT-R, CNT-G, and CNT-B will be described below.

Figure 5A:
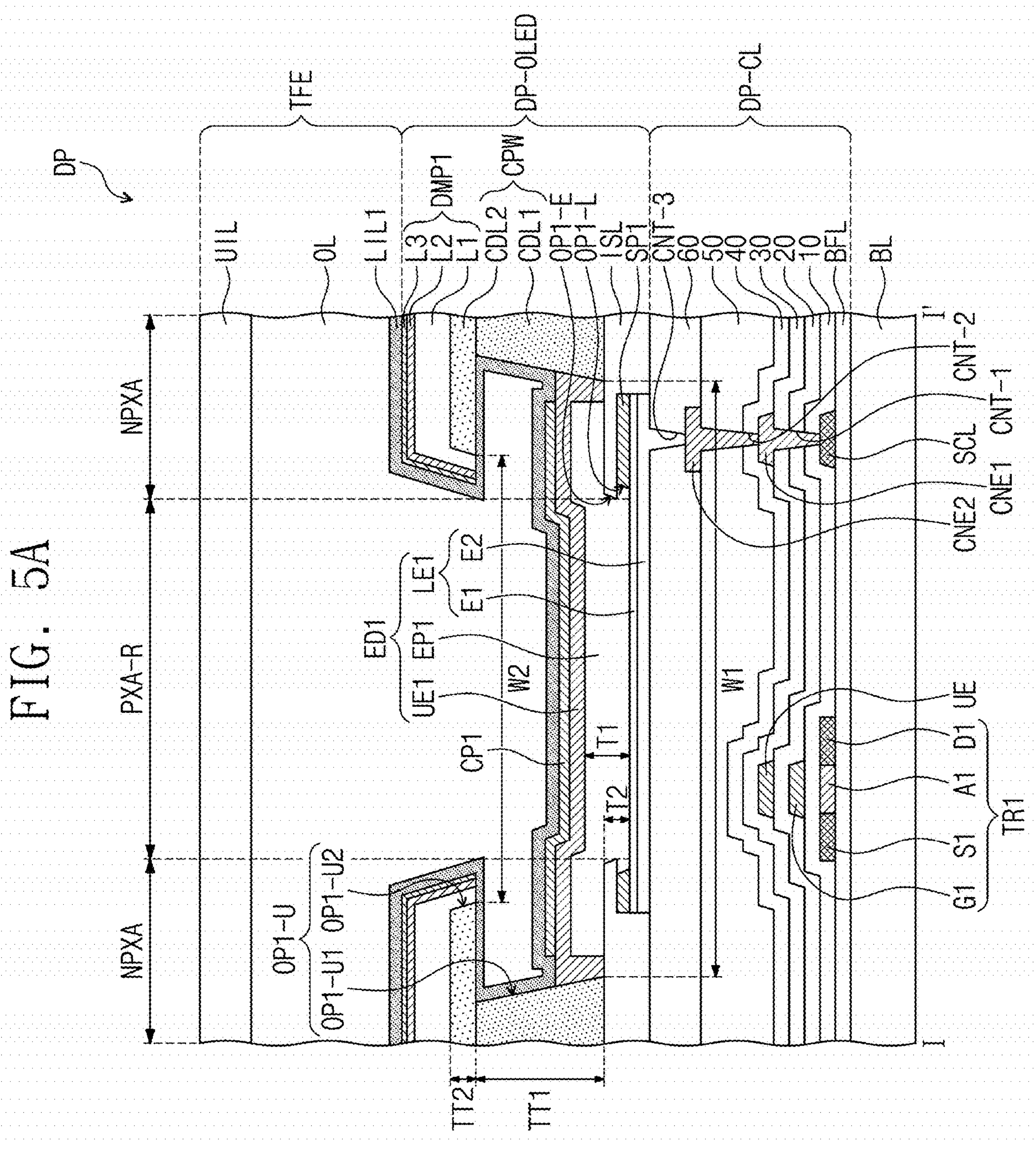
FIG. 5A is a schematic cross-sectional view of a display panel according to an embodiment taken along line I-I' of FIG. 4.
Figure 5B:
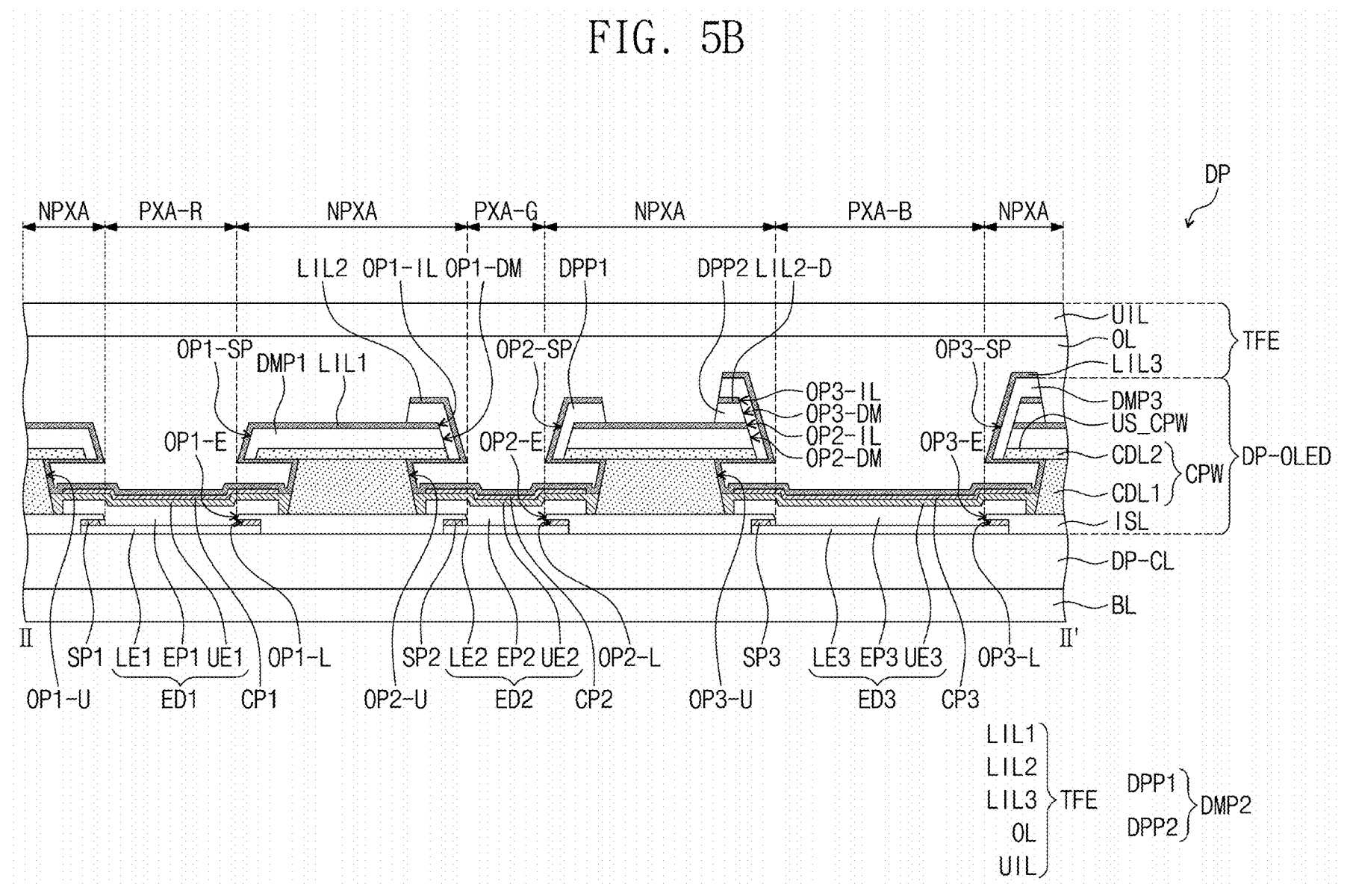
Figure 5C:
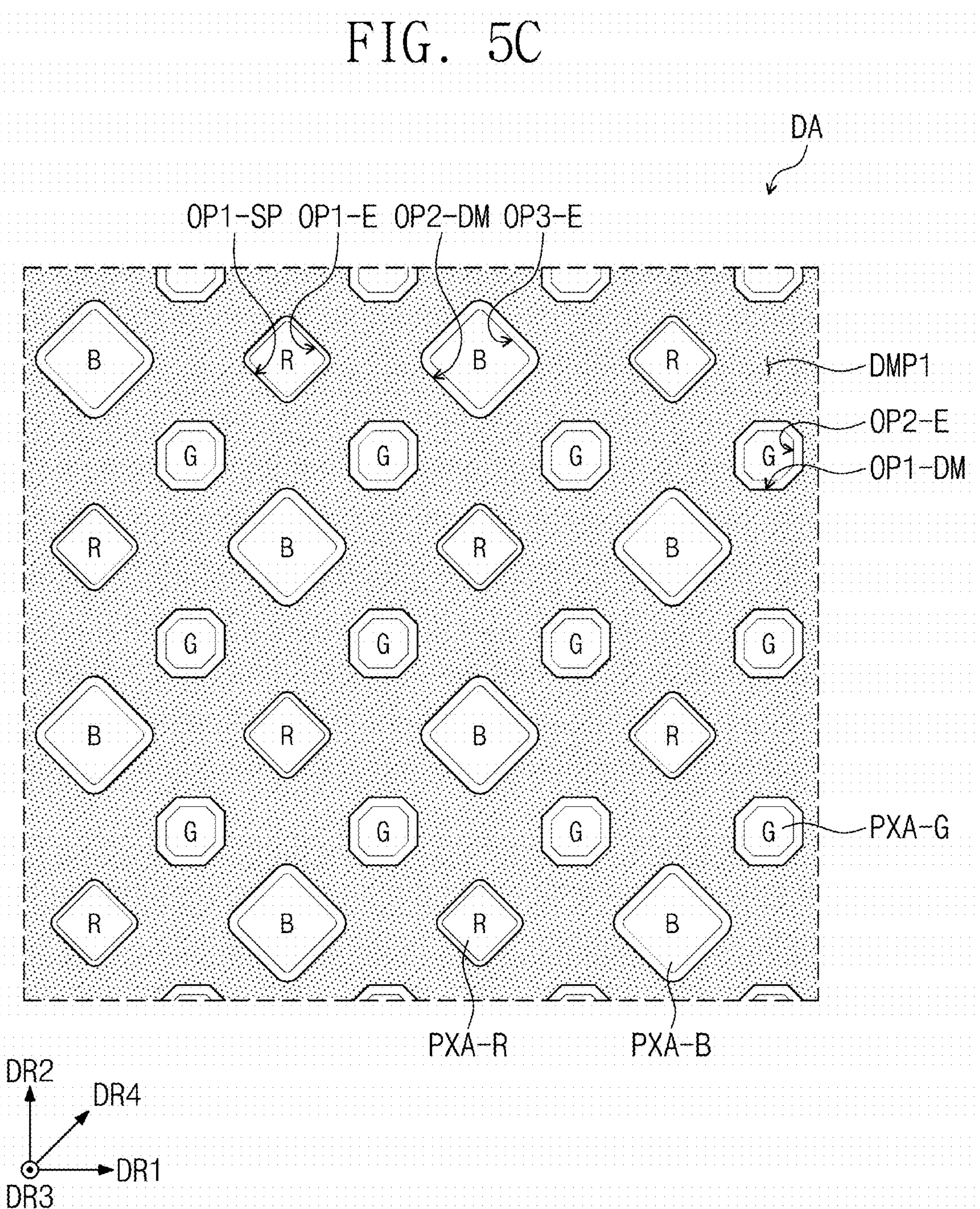
FIG. 5C is a schematic enlarged plan view of a part of a display panel according to an embodiment.
Figure 5D:
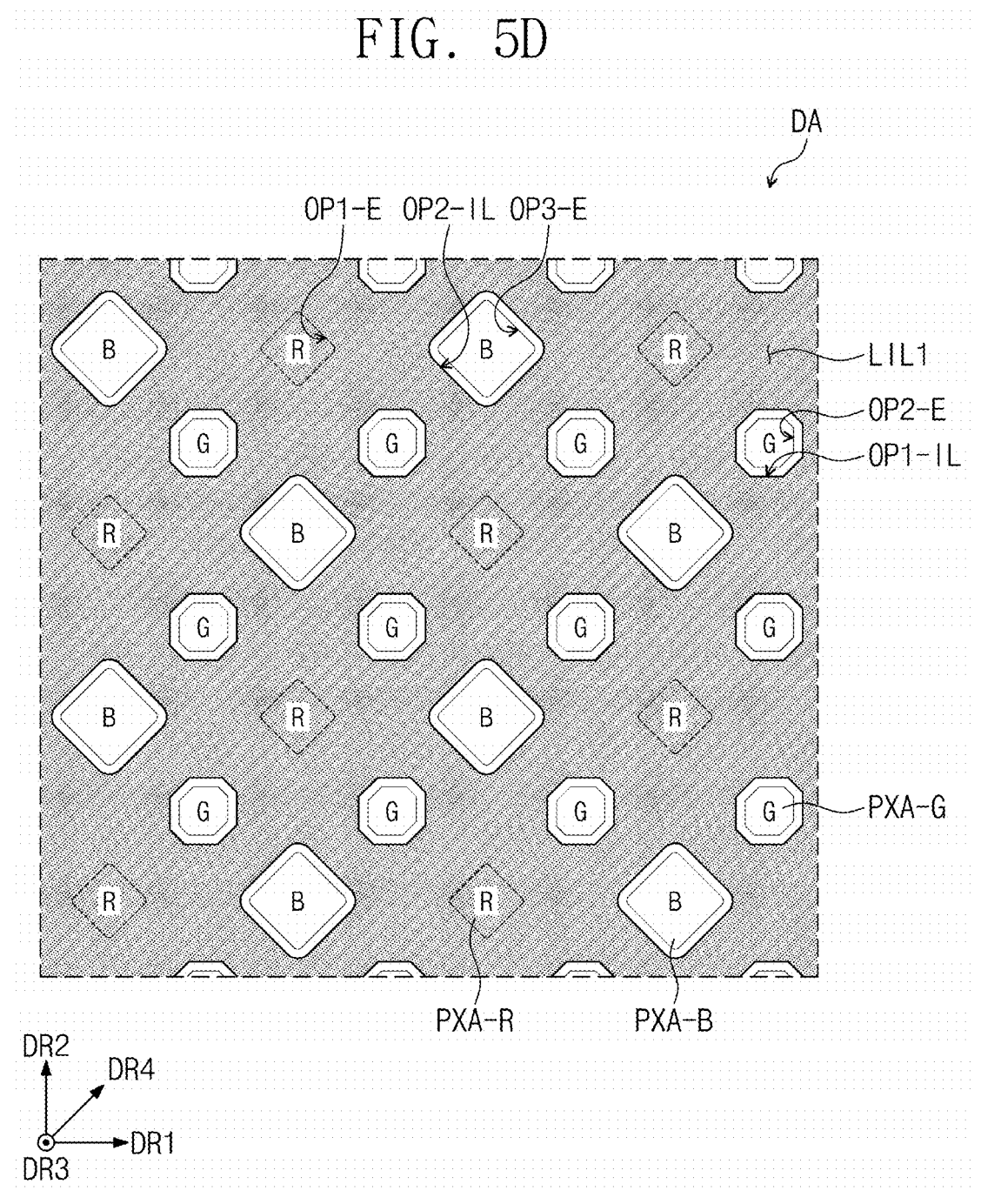

FIG. 5A is a schematic cross-sectional view of a display panel according to an embodiment taken along line I-I' of FIG. 4. FIG. 5B is a schematic cross-sectional view of a display panel according to an embodiment taken along II-II' of FIG. 4. FIG. 5C is a schematic enlarged plan view of a part of a display panel according to an embodiment. FIG. 5D is a schematic enlarged plan view of a part of a display panel according to an embodiment.

Referring to FIGS. 5A and 5B, a display panel DP may include a base layer BL, a circuit element layer DP-CL, a display element layer DP-OLED, and a thin film encapsulation layer TFE.

The base layer BL may include a synthetic resin film. For example, the base layer BL may include a glass substrate, a metal substrate, or an organic/inorganic composite material substrate.

At least one inorganic layer may be disposed on an upper surface of the base layer BL. A buffer layer BFL improves a bonding force between the base layer BL and a semiconductor pattern layer. The buffer layer BFL may include a silicon oxide layer and a silicon nitride layer. The silicon oxide layer and the silicon nitride layer may be alternately stacked.

The display panel DP may include insulating layers, a semiconductor pattern layer, a conductive pattern layer, a signal line, and the like. An insulating layer, a semiconductor layer, and a conductive layer may be formed by coating, vapor deposition, or the like. Thereafter, the insulating layer, the semiconductor layer, and the conductive layer may be selectively patterned by photolithography and etching processes. For example, the semiconductor pattern layer, the conductive pattern layer, the signal line, and the like included in the circuit element layer DP-CL and the display element layer DP-OLED may be formed.

A semiconductor pattern layer may be disposed on the buffer layer BFL. The semiconductor pattern layer may include polysilicon. However, embodiments are not limited thereto, and the semiconductor pattern layer may include amorphous silicon or metal oxide.

FIG. 5A is only a partial semiconductor pattern layer, and another semiconductor pattern layer may be further disposed in emission areas PXA-R, PXA-G, and PXA-B. The semiconductor pattern layer may be arranged in a specific rule over the emission areas PXA-R, PXA-G, and PXA-B. The semiconductor pattern layer may have different electrical characteristics according to whether the semiconductor pattern layer is doped or not. The semiconductor pattern layer may include a first region having a high doping concentration and a second region having a low doping concentration. The first region may be doped with an N-type dopant or a P-type dopant. A P-type transistor may include a first region doped with a P-type dopant.

The first region may have higher conductivity than the second region, and may have a substantially role of an electrode or a signal line. The second region may substantially correspond to an active (or channel) of a transistor. For example, a portion of the semiconductor pattern layer may be an active of the transistor, another portion thereof may be a source or drain of the transistor, and another portion thereof may be a conductive region.

A source Si, an active A1, and a drain D1 of the transistor TR1 may be formed from a semiconductor pattern layer. FIG. 5A illustrates a part of a signal transmission region SCL formed from the semiconductor pattern layer. For example, the signal transmission region SCL may be connected (e.g., electrically connected) to the drain D1 of the transistor TR1 in a plan view.

First to sixth insulating layers 10 to 60 may be disposed on the buffer layer BFL. The first to sixth insulating layers 10 to 60 may be an inorganic layer or an organic layer. A gate G1 may be disposed on the first insulating layer 10. An upper electrode UE may be disposed on the second insulating layer 20. A first connection electrode CNE1 may be disposed on the third insulating layer 30. The first connection electrode CNE1 may be connected (e.g., electrically connected) to the signal transmission region SCL through a contact hole CNT-1 passing through the first to third insulating layers 10 to 30. The fourth insulating layer 40 may be disposed on the third insulating layer 30 to cover the first connection electrode CNE1. The fifth and sixth insulating layers 50 and 60 may be disposed on the fourth insulating layer 40. In an embodiment, the fifth and sixth insulating layers 50 and 60 may be organic layers.

A second connection electrode CNE2 may be disposed on the fifth insulating layer 50. The second connection electrode CNE2 may be connected (e.g., electrically connected) to the first connection electrode CNE1 through a contact hole CNT-2 passing through the fourth and fifth insulating layers 40 and 50.

The display element layer DP-OLED may be disposed on the circuit element layer DP-CL. According to an embodiment, the display element layer DP-OLED may include light emitting elements ED1, ED2, and ED3, sacrificial pattern layers SP1, SP2, and SP3, an insulating layer ISL, a conductive bank CPW, dummy pattern layers DMP1, DMP2, and DMP3, and a dummy inorganic layer LIL2-D.

The light emitting elements ED1, ED2, and ED3 may include a first light emitting element ED1, a second light emitting element ED2, and a third light emitting element ED3. The first light emitting element ED1 may include a first lower electrode LE1, a first emission pattern layer EP1, and a first upper electrode UE1, the second light emitting element ED2 may include a second lower electrode LE2, a second emission pattern layer EP2, and a second upper electrode UE2, and the third light emitting element ED3 may include a third lower electrode LE3, a third emission pattern layer EP3, and a third upper electrode UE3.

The first to third lower electrodes LE1, LE2, and LE3 may be provided in a plurality of pattern layers. Hereinafter, the first lower electrode LE1 will be mainly described, and the description of the first lower electrode LE1 may be substantially equally applied to the second and third lower electrodes LE2 and LE3. The first lower electrode LE1, the second lower electrode LE2 and the third lower electrode LE3 may be disposed on a same layer.

The first lower electrode LE1 may be disposed on the sixth insulating layer 60 of the circuit element layer DP-CL. The first lower electrode LE1 may be connected (e.g., electrically connected) to the second connection electrode CNE2 through a connection contact hole CNT-3 defined through the sixth insulating layer 60. Accordingly, the first lower electrode LE1 may be connected (e.g., electrically connected) to the signal transmission region SCL through the first and second connection electrodes CNE1 and CNE2 to be connected (electrically connected) to a corresponding circuit device. A connection contact hole CNT-3 of FIG. 5A may correspond to the first connection contact hole CNT-R of FIG. 4.

The first lower electrode LE1 may be a transmissive electrode, a semi-transmissive electrode, or a reflective electrode. In this embodiment, the first lower electrode LE1 may include a first layer E1 and a second layer E2.

The first layer E1 may include a metal material. For example, the first layer E1 may be a reflective layer formed of silver (Ag), magnesium (Mg), aluminum (Al), platinum (Pt), palladium (Pd), gold (Au), nickel (Ni), or neodymium (Nd), iridium (Ir), chromium (Cr), or a compound thereof.

The second layer E2 may be disposed on the first layer E1. The second layer E2 may include a transparent conductive oxide. For example, the second layer E2 may be a transparent or semi-transparent electrode layer including at least one selected from the group consisting of indium tin oxide (ITO), indium zinc oxide (IZO), indium gallium zinc oxide (IGZO), zinc oxide (ZnO), indium oxide ($In_2O_3$), and aluminum doped zinc oxide (AZO). In an embodiment, the second layer E2 may include a crystallized transparent conductive oxide, for example, the transparent conductive oxide may include poly-ITO.

In an embodiment, the first lower electrode LE1 may further include a third layer under the first layer E1. The third layer may include a transparent conductive oxide. For example, the third layer may include the same material as or a different material from the second layer E2.

The sacrificial pattern layers SP1, SP2, and SP3 may include a first sacrificial pattern layer SP1 disposed on an upper surface of the first lower electrode LE1 and a second sacrificial pattern layer SP2 disposed on an upper surface of the second lower electrode LE2, and a third sacrificial pattern layer SP3 disposed on an upper surface of the third lower electrode LE3.

A first lower opening OP1-L exposing a portion of the upper surface of the first lower electrode LE1 may be defined in the first sacrificial pattern layer SP1, a second lower opening OP2-L exposing a portion of the upper surface of the second lower electrode LE2 may be defined in the second sacrificial pattern layer SP2, and a third lower opening OP3-L exposing a portion of the upper surface of the third lower electrode LE3 may be defined in the third sacrificial pattern layer SP3.

In an embodiment, each of the first to third sacrificial pattern layers SP1, SP2, and SP3 may include an amorphous transparent conductive oxide. According to an embodiment, in an etching process of the first sacrificial pattern layer SP1 for forming the first lower openings OP1-L, the first lower electrode LE1 may be prevented from being etched and damaged. This description may be substantially equally applied to the second sacrificial pattern layer SP2 and the third sacrificial pattern layer SP3.

The insulating layer ISL may be disposed on the sixth insulating layer 60 of the circuit element layer DP-CL. The insulating layer ISL may cover the first to third lower electrodes LE1, LE2, and LE3 and the first to third sacrificial pattern layers SP1, SP2, and SP3. For example, the insulating layer ISL may cover an upper surface of each of the first to third sacrificial pattern layers SP1, SP2, and SP3.

First to third emission openings OP1-E, OP2-E, and OP3-E may be defined in the insulating layer ISL. The first emission opening OP1-E may correspond to the first lower opening OP1-L of the first sacrificial pattern layer SP1, the second emission opening OP2-E may correspond to the second lower opening OP2-L of the second sacrificial pattern layer SP2, and the third emission opening OP3-E may correspond to the third lower opening OP3-L of the third sacrificial pattern layer SP3.

According to an embodiment, in a plan view, the first emission openings OP1-E may overlap the first lower openings OP1-L, and the area of the first emission openings OP1-E may be smaller than the area of the first lower openings OP1-L. For example, an inner surface of the insulating layer ISL may be closer to a center portion of the first lower electrode LE1 than an inner surface of the first sacrificial pattern layer SP1 defining the first lower opening OP1-L, e.g., in a plan view. For example, a portion of the insulating layer ISL that is closer to the center portion of the first lower electrode LE1 than the inner surface of the first sacrificial pattern layer SP1 defining the first lower openings OP1-L may define a tip portion. The description of the first emission opening OP1-E and the first lower opening OP1-L may be substantially equally applied to the second emission opening OP2-E and the second lower opening OP2-L, and the third emission opening OP3-E and the third lower opening OP3-L.

The insulating layer ISL may include an inorganic insulating material, for example, silicon nitride ($SiN_x$). The insulating layer ISL may be disposed between the first to third lower electrodes LE1, LE2, and LE3 and the conductive bank CPW, and thus first to third lower electrodes LE1, LE2, and LE3 may be blocked from being connected to the conductive bank CPW.

The conductive bank CPW may be disposed on the insulating layer ISL. First to third upper openings OP1-U, OP2-U, and OP3-U may be defined in the conductive bank CPW. The first upper opening OP1-U may correspond to the first emission opening OP1-E, the second upper opening OP2-U may correspond to the second emission opening OP2-E, and the third upper opening OP3-U may correspond to the third emission opening OP3-E.

In an embodiment, the conductive bank CPW may include a first conductive layer CDL1 and a second conductive layer CDL2. Each of the first conductive layer CDL1 and the second conductive layer CDL2 may include a conductive material. The first conductive layer CDL1 may be disposed on the insulating layer ISL and may have a first conductivity and a first thickness TT1. The second conductive layer CDL2 may be disposed on the first conductive layer CDL1 and may have a second conductivity lower than the first conductivity and a second thickness TT2 smaller than the first thickness.

An etch rate of the first conductive layer CDL1 may be greater than an etch rate of the second conductive layer CDL2. For example, the first conductive layer CDL1 may include a material having a higher etch selectivity than an etch selectivity of the second conductive layer CDL2.

In an embodiment, each of the first and second conductive layers CDL1 and CDL2 may include a metal material. For example, in an embodiment, the second conductive layer CDL2 may include a material having a lower reflectance than a reflectance of the first conductive layer CDL1, and the reflectance on an upper surface of the second conductive layer CDL2 forming an upper surface US_CPW of the conductive bank CPW may be substantially reduced, thereby improving display quality of the display panel DP. For example, the first conductive layer CDL1 may include aluminum (Al), and the second conductive layer CDL2 may include titanium (Ti). However, materials of the first and second conductive layers CDL1 and CDL2 are not limited thereto.

In an embodiment, the conductive bank CPW may receive a bias voltage. Accordingly, the bias voltage may be applied to each of the first to third upper electrodes UE1, UE2, and UE3 in contact with the conductive bank CPW.

In an embodiment, in a plan view, the first upper opening OP1-U defined in the second conductive layer CDL2 (or the second opening portion OP1-U2 of the first upper opening OP1-U) may overlap the first upper opening OP1-U defined in the first conductive layer CDL1 (or the first opening portion OP1-U1 of the first upper opening OP1-U), the area of the first upper opening OP1-U defined in the second conductive layer CDL2 may be smaller than the area of the first upper opening OP1-U defined in the first conductive layer CDL1.

As shown in FIG. 5A, in a cross-section view, the first upper openings OP1-U may include a first opening portion OP1-U1 defined by an inner surface of the first conductive layer CDL1 and a second opening portion OP1-U2 defined by an inner surface of the second conductive layer CDL2. In a cross-sectional view, a width W1 (or size) of the first opening portion OP1-U1 may be greater than a width W2 (or size) of the second opening portion OP1-U2. In a cross-sectional view, the inner surface of the second conductive layer CDL2 defining the second opening portion OP1-U2 may be closer to a center portion of the first lower electrode LE1 than the inner surface of the first conductive layer CDL1 defining the first opening portion OP1-U1. In an embodiment, in the conductive bank CPW, a portion of the second conductive layer CDL2 that is closer to the center portion of the first lower electrode LE1 than the inner surface of the first conductive layer CDL1 defining the first opening portion OP1-U1 may be defined as a tip portion, e.g., in a plan view.

According to an embodiment, the area of the first upper openings OP1-U defined in the first conductive layer CDL1 may be larger than the area of the first emission openings OP1-E defined in the insulating layer ISL in a plan view. For example, the first conductive layer CDL1 may expose a portion of the upper surface of the insulating layer ISL through the first upper openings OP1-U.

Each of the first to third emission pattern layers EP1, EP2, and EP3 may be disposed on a corresponding lower electrode among the first to third lower electrodes LE1, LE2, and LE3. The first emission pattern layer EP1 may be disposed on the first lower electrode LE1, the second emission pattern layer EP2 may be disposed on the second lower electrode LE2, and the third emission pattern layer EP3 may be disposed on the third lower electrode LE3. In an embodiment, the first emission pattern layer EP1 may provide red light, the second emission pattern layer EP2 may provide green light, and the third emission pattern layer EP3 may provide blue light.

Each of the first to third emission pattern layers EP1, EP2, and EP3 may include an emission layer including a light emitting material. Each of the first to third emission pattern layers EP1, EP2, and EP3 may further include a hole injection layer (HIL) and an hole transport layer (HTL) disposed between the emission layer and a corresponding lower electrode of the first to third lower electrodes LE1, LE2, and LE3, and further include an electron transport layer (ETL) and an electron injection layer (EIL) disposed on the emission layer, and each of the first to third emission pattern layers EP1, EP2, and EP3 may be referred to as an 'organic pattern layer'.

According to an embodiment, the first to third emission pattern layers EP1, EP2, and EP3 may be patterned by the tip portion defined in the conductive bank CPW. The first emission pattern layer EP1 may be disposed inside the first lower opening OP1-L, the first emission opening OP1-E, and the first upper opening OP1-U. The first emission pattern layer EP1 may cover a portion of the upper surface of the insulating layer ISL exposed from the first upper opening OP1-U. The second emission pattern layer EP2 may be disposed inside the second lower opening OP2-L, the second emission opening OP2-E, and the second upper opening OP2-U. The second emission pattern layer EP2 may cover a portion of the upper surface of the insulating layer ISL exposed through the second upper opening OP2-U. The third emission pattern layer EP3 may be disposed inside the third lower opening OP3-L, the third emission opening OP3-E, and the third upper opening OP3-U. The third emission pattern layer EP3 may cover a portion of the upper surface of the insulating layer ISL exposed through the third upper opening OP3-U.

According to an embodiment, first emission pattern layers EP1 may be patterned and deposited with a pixel as a unit by the tip portion defined in the conductive bank CPW. For example, the first emission pattern layers EP1 may be commonly formed by using an open mask, but may be easily divided with a pixel as a unit by the conductive bank CPW.

In case that the first emission pattern layers EP1 are patterned by using a separate mask, e.g., a fine metal mask (FMM), a support spacer (or referring to as spacer) protruding from the bank should be provided to support the separate mask. For example, as the separate mask is spaced apart by a height of the bank and the spacer from a base surface on which the patterning is performed, there may be a limitation in improving the resolution.

For example, as the mask comes into contact with the spacer, a foreign material may remain in the spacer after the patterning process of the first emission pattern layers EP1, and the spacer damaged by mask dent may be provided. Accordingly, a defective display panel may be formed.

In an embodiment, the first emission pattern layers EP1 may be patterned without a separate mask in contact with the internal configuration of the display panel DP, and thus a defect rate may be reduced and the display panel DP with improved reliability may be provided. In manufacturing a large size display panel DP, manufacturing cost of the large-area mask may be reduced by omitting forming a large-area mask, and the display panel DP may not be affected by defects occurring in the large-area mask, thereby providing the display panel DP with improved reliability.

According to an embodiment, a thickness T1 of the first emission pattern layer EP1 may be greater than a sum T2 of a thickness of the first sacrificial pattern layer SP1 and a thickness of the portion of the insulating layer ISL disposed on the first sacrificial pattern layer SP1. In the descriptions, a 'thickness of an emission pattern layer' refers to an average thickness of a portion of the first emission pattern layer EP1 in contact with the upper surface of the first lower electrode LE1. A 'thickness of a sacrificial pattern layer' refers to an average thickness of a portion of the first sacrificial pattern layer SP1 in contact with the upper surface of the first lower electrode LE1, and a 'thickness of an insulating layer' refers to an average thickness of a portion of the insulating layer ISL in contact with the upper surface of the first sacrificial pattern layer SP1.

For example, in a thickness direction (e.g., the third direction DR3), the minimum separation distance (e.g., T1) from the upper surface of the first lower electrode LE1 to the upper surface of the first emission pattern layer EP1 may be greater than the maximum separation distance (e.g., T2) from the upper surface of the first lower electrode LE1 to the upper surface of the insulating layer ISL.

For example, in an embodiment, the sum T2 of the thickness of the first sacrificial pattern layer SP1 and the thickness of the insulating layer ISL may be designed to be thinner (or smaller) than the thickness T1 of the first emission pattern layer EP1. Accordingly, separation of the first emission pattern layer EP1 may be prevented at a portion covering the inner surface of the first sacrificial pattern layer SP1 defining the first lower openings OP1-L among the first emission pattern layers EP1. Accordingly, formation of the defective first emission pattern layer EP1 may be prevented, and the first light emitting element ED1 with improved reliability may be provided.

FIGS. 5A and 5B illustrate that the first emission pattern layer EP1 is not in contact with the inner surface of the first conductive layer CDL1 defining the first upper opening OP1-U, but embodiments are not limited thereto. For example, the first emission pattern layer EP1 may be in contact with the inner surface of the first conductive layer CDL1 defining the first upper opening OP1-U.

The above description of the first emission pattern layer EP1 may be substantially equally applied to the second and third emission pattern layers EP2 and EP3.

The first to third upper electrodes UE1, UE2, and UE3 may be disposed on corresponding emission pattern layers among the first to third emission pattern layers EP1, EP2, and EP3. The first upper electrode UE1 may be disposed on the first emission pattern layer EP1, the second upper electrode UE2 may be disposed on the second emission pattern layer EP2, and the third upper electrode UE3 may be disposed on the third emission pattern layer EP3. The first to third upper electrodes UE1, UE2, and UE3 may be patterned by the tip portion defined in the conductive bank CPW.

For example, the first upper electrode UE1 may be in contact with the inner surface of the first conductive layer CDL1 defining the first opening portion OP1-U1 of the first upper opening OP1-U. Therefore, the first upper electrode UE1 may be connected (e.g., electrically connected) to the conductive bank CPW to receive a bias voltage through the conductive bank CPW.

According to an embodiment, as the first upper electrode UE1 is disposed on the first emission pattern layer EP1 thicker (or greater) than the thickness of the first sacrificial pattern layer SP1 and the insulating layer ISL, the first upper electrode UE1 may not be formed separately from the inside of the first upper opening OP1-U. Accordingly, a portion of the first upper electrode UE1 that blocks electrical connection with the conductive bank CPW may not be formed, thereby preventing the defective first light emitting element ED1 from being provided. The above description of the first upper electrode UE1 may be substantially equally applied to the second and third upper electrodes UE2 and UE3.

For example, according to an embodiment, as the first to third upper electrodes UE1, UE2, and UE3 may not be provided in a form of a common layer overlapping all of the first to third emission pattern layers EP1, EP2, and EP3, a lateral leakage current generated through the common layer may not occur. For example, as the upper electrodes UE1, UE2, and UE3 are connected (e.g., electrically connected) to the conductive bank CPW having a relatively large thickness, a driving resistance may be reduced to increase luminous efficiency and first to third light emitting elements ED1, ED2, and ED3 with increased lifespan may be provided.

Capping pattern layers CP1, CP2, and CP3 may include a first capping pattern layer CP1 disposed on the first upper electrode UE1 inside the first upper opening OP1-U, a second capping pattern layer CP2 disposed on the second upper electrode UE2 inside the second upper opening OP2-U, and a third capping pattern layer CP3 disposed on the third upper electrode UE3 inside the third upper opening OP3-U. The first to third capping pattern layers CP1, CP2, and CP3 may be patterned by the tip portion defined in the conductive bank CPW. In another example, the first to third capping pattern layers CP1, CP2, and CP3 may be omitted.

FIGS. 5A and 5B illustrate that the first capping pattern layer CP1 is not in contact with the inner surface of the first conductive layer CDL1 defining the first upper opening OP1-U (e.g., the first opening portion OP1-U1), but embodiments are not limited thereto. For example, the first capping pattern layer CP1 may be in contact with the inner surface of the first conductive layer CDL1 defining the first upper opening OP1-U.

The dummy pattern layers DMP1, DMP2, and DMP3 may be disposed on the conductive bank CPW. The dummy pattern layers DMP1, DMP2, and DMP3 may include a first dummy pattern layer DMP1, a second dummy pattern layer DMP2, and a third dummy pattern layer DMP3.

The first dummy pattern layer DMP1 may cover (e.g., completely cover) an upper surface US_CPW of the conductive bank CPW. The first dummy pattern layer DMP1 may cover at least a portion of the inner surface of the second conductive layer CDL2 defining the first upper opening OP1-U (e.g., the second opening portion OP1-U2).

FIG. 5C is a schematic plan view illustrating relationship between the first dummy pattern layer DMP1 and the emission areas PXA-R, PXA-G, and PXA-B in a plan view. Referring to FIG. 5C together, the first dummy pattern layer DMP1 may have an integral shape. First separation openings OP1-SP, first dummy pattern openings OP1-DM, and second dummy pattern openings OP2-DM may be defined in the first dummy pattern layer DMP1. The first separation openings OP1-SP, the first dummy pattern openings OP1-DM, and the second dummy pattern openings OP2-DM respectively may be disposed to correspond to (or may overlap) the first to third emission areas PXA-R, PXA-G, and PXA-B in a plan view.

A first separation opening OP1-SP may overlap the corresponding first upper opening OP1-U. A portion of an inner surface of the first dummy pattern layer DMP1 defining the first separation opening OP1-SP may be disposed in the second opening portion OP1-U2 defined by the inner surface of the second conductive layer CDL2 among the first upper openings OP1-U. A portion of the first dummy pattern layer DMP1 may overlap the inner surface of the second conductive layer CDL2 defining the second opening portion OP1-U2.

The first dummy pattern opening OP1-DM may overlap the second upper opening OP2-U. In an embodiment, the inner surface of the first dummy pattern layer DMP1 defining the first dummy pattern opening OP1-DM may be disposed to be parallel to the inner surface of the second conductive layer CDL2 defining the second upper opening OP2-U. For example, the inner surface of the first dummy pattern layer DMP1 defining the first dummy pattern opening OP1-DM and the inner surface of the second conductive layer CDL2 defining the second upper opening OP2-U may be formed by etching by using the same mask.

The second dummy pattern opening OP2-DM may overlap the third upper opening OP3-U. In an embodiment, the inner surface of the first dummy pattern layer DMP1 defining the second dummy pattern opening OP2-DM may be disposed to be parallel to the inner surface of the second conductive layer CDL2 defining the third upper opening OP3-U. For example, the inner surface of the first dummy pattern layer DMP1 defining the second dummy pattern opening OP2-DM and the inner surface of the second conductive layer CDL2 defining the third upper opening OP3-U may be formed by etching by using the same mask.

As shown in FIG. 5A, the first dummy pattern layer DMP1 may include a first organic layer L1, a first conductive layer L2, and a first capping layer L3.

The first organic layer L1 may be formed by the same process as the first emission pattern layer EP1 to have the same structure and the same material. The first organic layer L1 may be spaced apart from the first to third emission pattern layers EP1, EP2, and EP3. The first organic layer L1 may correspond to a residue separated from the first emission pattern layer EP1 by the conductive bank CPW in case that the first emission pattern layer EP1 is commonly formed.

The first conductive layer L2 may be disposed on the first organic layer L1. The first conductive layer L2 and the first upper electrode UE1 may be formed by the same process to have the same structure and the same material. The first conductive layer L2 may be spaced apart from the first to third upper electrodes UE1, UE2, and UE3. The first conductive layer L2 may correspond to a residue separated from the first upper electrode UE1 by the conductive bank CPW in case that the first upper electrode UE1 is commonly formed.

The first capping layer L3 may be disposed on the first conductive layer L2. The first capping layer L3 and the first capping pattern layer CP1 may be formed by the same process to have the same structure and the same material. The first capping layer L3 may be spaced apart from the first to third capping pattern layers CP1, CP2, and CP3. The first capping layer L3 may correspond to a residue separated from the first capping pattern layer CP1 by the conductive bank CPW in case that the first capping pattern layer CP1 is commonly formed.

The second dummy pattern layer DMP2 may include a first dummy part DPP1 and a second dummy part DPP2.

A second separation opening OP2-SP may be defined in the first dummy part DPP1. The second separation opening OP2-SP may correspond to the second upper opening OP2-U.

A portion of the inner surface of the first dummy part DPP1 defining the second separation opening OP2-SP may be disposed in a second opening portion defined by the inner surface of the second conductive layer CDL2 among the second upper openings OP2-U and the first dummy pattern openings OP1-DM. A portion of the first dummy part DPP1 may overlap the inner surface of the second conductive layer CDL2 defining the second upper opening OP2-U and the inner surface of the first dummy pattern layer DMP1 defining the first dummy pattern opening OP1-DM.

A remaining portion of the first dummy part DPP1 may be disposed on the first dummy pattern layer DMP1 on the upper surface of the conductive bank CPW. The first dummy part DPP1 may have a closed-line shape surrounding the second emission areas PXA-G in a plan view.

The second dummy part DPP2 may be spaced apart from the first dummy part DPP1 and may be disposed on the first dummy pattern layer DMP1 on the upper surface of the conductive bank CPW. A third dummy pattern opening OP3-DM may be defined in the second dummy part DPP2. The third dummy pattern opening OP3-DM may overlap the second dummy pattern opening OP2-DM and the third upper opening OP3-U. The second dummy part DPP2 may have a closed-line shape surrounding the third emission area PXA-B in a plan view.

Each of the first and second dummy parts DPP1 and DPP2 of the second dummy pattern layer DMP2 may include a second organic layer, a second conductive layer, and a second capping layer. The descriptions of the first organic layer L1, the first conductive layer L2, and the first capping layer L3 may be similarly applied to the second organic layer, the second conductive layer, and the second capping layer.

The second organic layer and the second emission pattern layer EP2 may include (or may be formed of) the same material. The second organic layer may be spaced apart from the first to third emission pattern layers EP1, EP2, and EP3. The second conductive layer may be disposed on the second organic layer. The second conductive layer and the second upper electrode UE2 may include (or may be formed of) the same material. The second conductive layer may be spaced apart from the first to third upper electrodes UE1, UE2, and UE3. The second capping layer may be disposed on the second conductive layer. The second capping layer and the second capping pattern layer CP2 may include (or may be formed of) the same material. The second capping layer may be spaced apart from the first to third capping pattern layers CP1, CP2, and CP3.

A third separation opening OP3-SP may be defined in the third dummy pattern layer DMP3. The third separation opening OP3-SP may correspond to the third upper opening OP3-U. A portion of an inner surface of the third dummy pattern layer DMP3 defining the third separation opening OP3-SP may be disposed in the second opening portion defined by an inner surface of the second conductive layer CDL2 among the third upper openings OP3-U, the second dummy pattern opening OP2-DM, and the third dummy pattern opening OP3-DM. A portion of the third dummy pattern layer DMP3 may overlap an inner surface of the first dummy pattern layer DMP1 defining the second dummy pattern opening OP2-DM, an inner surface of the second dummy part DPP2 defining the third dummy pattern opening OP3-DM, and an inner surface of the second conductive layer CDL2 defining the third upper opening OP3-U. Another portion of the third dummy pattern layer DMP3 may be disposed on the first dummy pattern layer DMP1 and the second dummy pattern layer DMP2 on the upper surface of the conductive bank CPW. The third dummy pattern layer DMP3 may have a closed-line shape surrounding the third emission area PXA-B in a plan view.

The third dummy pattern layer DMP3 may include a third organic layer, a third conductive layer disposed on the third organic layer, and a third capping layer disposed on the third conductive layer. The third organic layer and the third emission pattern layer EP3 may include (or may be formed of) the same material. The third conductive layer and the third upper electrode UE3 may include (or may be formed of) the same material. The third capping layer and the third capping pattern layer CP3 may include (or may be formed of) the same material. The descriptions of the first organic layer L1, the first conductive layer L2, and the first capping layer L3 may be similarly applied to the third organic layer, the third conductive layer, and the third capping layer.

A dummy inorganic layer LIL2-D may be disposed between the second dummy part DPP2 and the third dummy pattern layer DMP3. A dummy inorganic opening OP3-IL may be defined in the dummy inorganic layer LIL2-D. The dummy inorganic opening OP3-IL may overlap the second dummy pattern opening OP2-DM, the third dummy pattern opening OP3-DM, and the third upper opening OP3-U.

In an embodiment, an inner surface of the dummy inorganic layer LIL2-D defining the dummy inorganic opening OP3-IL may be disposed to be parallel to an inner surface of the second dummy part DPP2 defining the third dummy pattern opening OP3-DM. For example, the inner surface of the dummy inorganic layer LIL2-D defining the dummy inorganic opening OP3-IL and the inner surface of the second dummy part DPP2 defining the third dummy pattern opening OP3-DM may be formed by etching by using the same mask.

The dummy inorganic layer LIL2-D may be disposed on a first lower encapsulation inorganic layer LIL1 to be described below. The dummy inorganic layer LIL2-D may overlap the first lower encapsulation inorganic layer LIL1.

The thin film encapsulation layer TFE may be disposed on the display element layer DP-OLED. The thin film encapsulation layer TFE may include a first lower encapsulation inorganic layer LIL1, a second lower encapsulation inorganic layer LIL2, a third lower encapsulation inorganic layer LIL3, an encapsulation organic layer OL, and an upper encapsulation inorganic layer UIL.

The first lower encapsulation inorganic layer LIL1 may be formed on the conductive bank CPW and the first upper electrode UE1, and may be disposed an inner surface of the first upper opening OP1-U. For example, the first lower encapsulation inorganic layer LIL1 may cover the first dummy pattern layer DMP1 and the first upper electrode UE1 (or the first capping pattern layer CP1). For example, the first lower encapsulation inorganic layer LIL1 may be in contact with the inner surface of the first conductive layer CDL1 defining the first upper opening OP1-U.

FIG. 5D is a schematic plan view illustrating relationship between the first lower encapsulation inorganic layer LIL1 and the emission areas PXA-R, PXA-G, and PXA-B in a plan view. Referring to FIGS. 5A to 5D, the first lower encapsulation inorganic layer LIL1 may cover (e.g., completely cover) an upper surface of the first dummy pattern layer DMP1. The first lower encapsulation inorganic layer LIL1 may have an integral shape. A first encapsulation opening OP1-IL and a second encapsulation opening OP2-IL may be defined in the first lower encapsulation inorganic layer LIL1. The first and second encapsulation openings OP1-IL and OP2-IL may be disposed to correspond to (or may overlap) the second and third emission areas PXA-G and PXA-B, respectively, in a plan view. The first lower encapsulation inorganic layer LIL1 may overlap the first emission areas PXA-R.

The first encapsulation opening OP1-IL may overlap the first dummy pattern opening OP1-DM and the second upper opening OP2-U. In an embodiment, an inner surface of the first lower encapsulation inorganic layer LIL1 defining the first encapsulation openings OP1-IL may be disposed to be parallel to an inner surface of the first dummy pattern layer DMP1 defining the first dummy pattern openings OP1-DM. For example, the inner surface of the first lower encapsulation inorganic layer LIL1 defining the first encapsulation opening OP1-IL and the inner surface the first dummy pattern layer DMP1 defining the first dummy pattern opening OP1-DM may be formed by etching by using the same mask.

The second encapsulation opening OP2-IL may overlap the second dummy pattern opening OP2-DM and the third upper opening OP3-U. In an embodiment, the inner surface of the first lower encapsulation inorganic layer LIL1 defining the second encapsulation opening OP2-IL may be disposed to be parallel to the inner surface of the first dummy pattern layer DMP1 defining the second dummy pattern opening OP2-DM. For example, the inner surface of the second dummy part DPP2 defining the third dummy pattern opening OP3-DM may be disposed to be parallel to the inner surface of the first lower encapsulation inorganic layer LIL1 defining the second encapsulation opening OP2-IL. For example, the inner surface of the second dummy part DPP2 defining the third dummy pattern opening OP3-DM, the inner surface of the first lower encapsulation inorganic layer LIL1 defining the second encapsulation opening OP2-IL, and the inner surface of the first dummy pattern layer DMP1 defining the first dummy pattern openings OP1-DM may be etched by using the same mask.

The second lower encapsulation inorganic layer LIL2 may be disposed on the second upper electrode UE2 and the first dummy part DPP1 of the second dummy pattern layer DMP2, and may be disposed inside the second upper opening OP2-U. For example, the second lower encapsulation inorganic layer LIL2 may cover the second upper electrode UE2 (or the second capping pattern layer CP2). For example, the second lower encapsulation inorganic layer LIL2 may be in contact with the inner surface of the first conductive layer CDL1 defining the second upper opening OP2-U. The second lower encapsulation inorganic layer LIL2 may cover an inner surface of the first dummy part DPP1 defining the second separation opening OP2-SP.

For example, the second lower encapsulation inorganic layer LIL2 may overlap an inner surface of the first dummy pattern layer DMP1 defining the first dummy pattern opening OP1-DM and an inner surface of the second conductive layer CDL2 defining the second upper opening OP2-U. For example, the second lower encapsulation inorganic layer LIL2 may overlap an inner surface of the first lower encapsulation inorganic layer LIL1 defining the first encapsulation opening OP1-IL. A portion of the second lower encapsulation inorganic layer LIL2 may be disposed on the first lower encapsulation inorganic layer LIL1 on the upper surface of the conductive bank CPW.

The third lower encapsulation inorganic layer LIL3 may be disposed on the third upper electrode UE3 and the third dummy pattern layer DMP3, and may be disposed inside the third upper opening OP3-U. For example, the third lower encapsulation inorganic layer LIL3 may cover the third upper electrode UE3 (or the third capping pattern layer CP3). For example, the third lower encapsulation inorganic layer LIL3 may be in contact with the inner surface of the first conductive layer CDL1 defining the third upper opening OP3-U. The third lower encapsulation inorganic layer LIL3 may cover an inner surface of the third dummy pattern layer DMP3 defining the third separation opening OP3-SP.

The third lower encapsulation inorganic layer LIL3 may overlap an inner surface of the first dummy pattern layer DMP1 defining the second dummy pattern opening OP2-DM, an inner surface of the second dummy pattern layer DMP2 defining the third dummy pattern opening OP3-DM, and an inner surface of the second conductive layer CDL2 defining the third upper opening OP3-U. For example, the third lower encapsulation inorganic layer LIL3 may overlap an inner surface of the dummy inorganic layer LIL2-D defining the dummy inorganic opening OP3-IL. A portion of the third lower encapsulation inorganic layer LIL3 may be disposed on the first lower encapsulation inorganic layer LIL1 and the dummy inorganic layer LIL2-D on the upper surface of the conductive bank CPW.

In an embodiment, each of the first lower encapsulation inorganic layer LIL1, the second lower encapsulation inorganic layer LIL2, and the third lower encapsulation inorganic layer LIL3 may also be in contact with a lower surface of the second conductive layer CDL2 exposed from the first conductive layer CDL1.

The first to third lower encapsulation inorganic layers LIL1, LIL2, and LIL3 and the upper encapsulation inorganic layer UIL may protect the display element layer DP-OLED from moisture/oxygen, and the encapsulation organic layer OL may protect the display element layer DP-OLED from foreign substances such as dust particles.

Figure 6A:
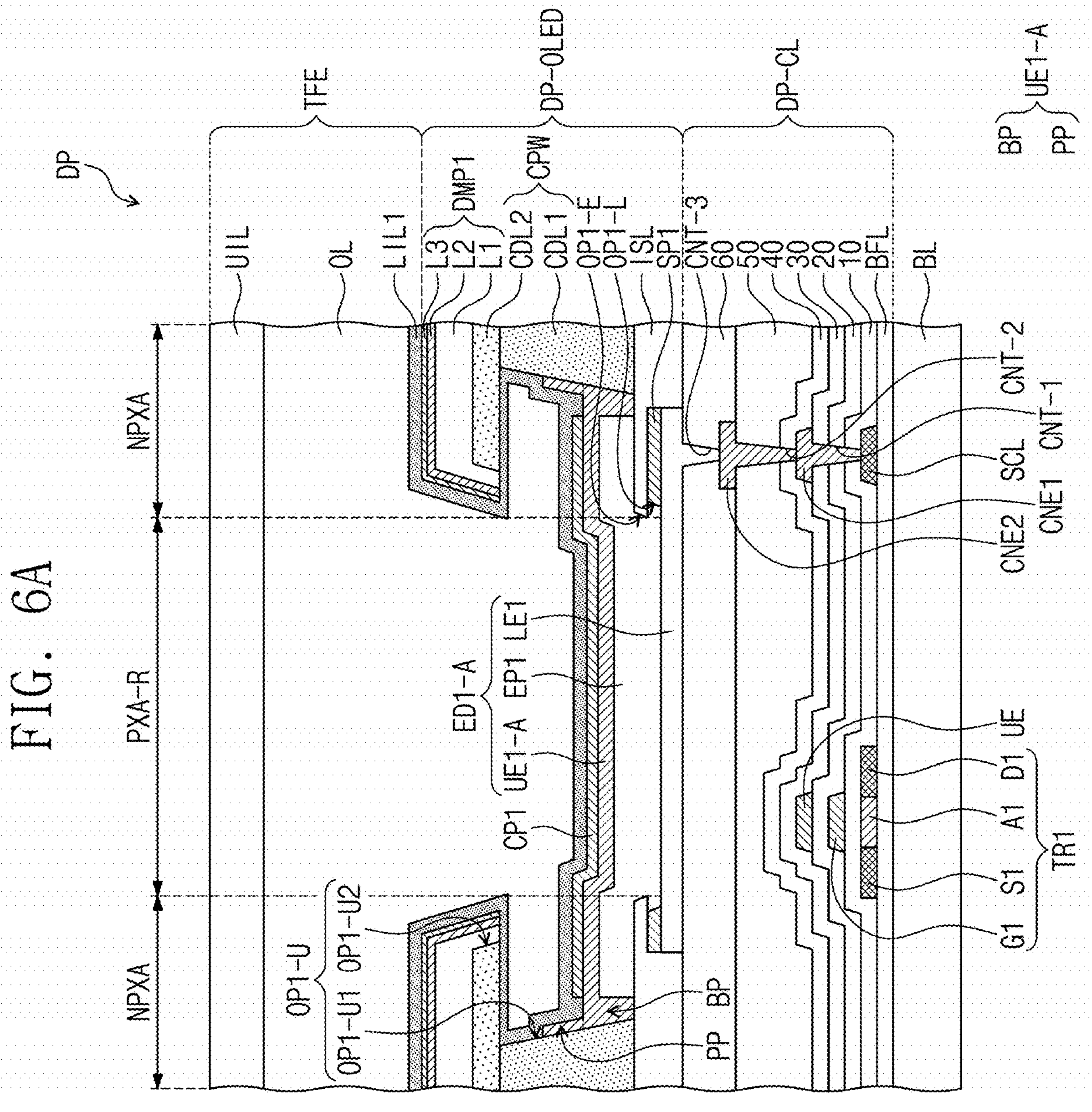
FIGS. 6A and 6B are schematic enlarged cross-sectional views of a part of a display panel according to an embodiment.
Figure 6B:
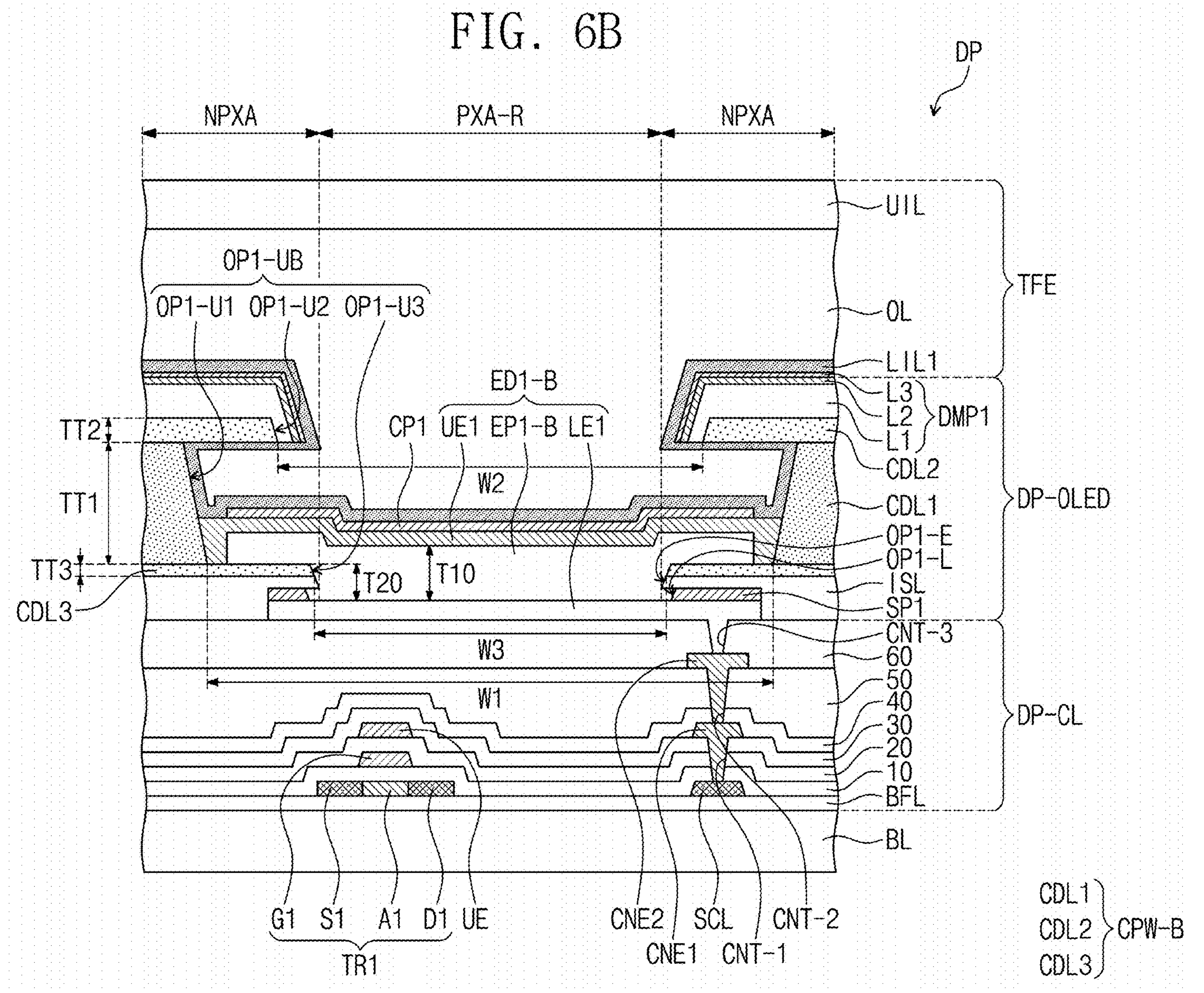

FIGS. 6A and 6B are schematic enlarged cross-sectional views of a display panel according to an embodiment. Each of the enlarged cross-sectional views of FIGS. 6A and 6B corresponds to the cross-sectional view taken along line I-I' of FIG. 4. The same/similar reference numerals are used for components that are the same as/similar to those described in FIGS. 5A to 5D, and repeated descriptions will be omitted.

Referring to FIG. 6A, a display element layer DP-OLED according to an embodiment may include a first light emitting element ED1-A, and the first light emitting element ED1-A may include a first lower electrode LE1, a first emission pattern layer EP1, and a first upper electrode UE1-A.

In an embodiment, the first upper electrode UE1-A may include a first part BP and a second part PP. The first part BP may be a part that covers the first emission pattern layer EP1 and may correspond to a shape of the first upper electrode UE1 of FIG. 5A. The second part PP may be a part protruding from the first portion BP in a direction adjacent to the second conductive layer CDL2 along the inner surface of the first conductive layer CDL1 defining the first opening portion OP1-U1 of the first upper opening OP1-U. As the first upper electrode UE1-A further includes the second part PP, the area in which the first upper electrode UE1-A is in contact with the conductive bank CPW may be increased, and a connection area to which a bias voltage is supplied may be increased, thereby preventing a voltage drop phenomenon.

Referring to FIG. 6B, the display element layer DP-OLED according to an embodiment may include a first light emitting element ED1-B, a first sacrificial pattern layer SP1, an insulating layer ISL, a conductive bank CPW-B, and a first dummy pattern layer DMP1, and the first light emitting element ED1-B may include a first lower electrode LE1, a first emission pattern layer EP1-B, and a first upper electrode UE1.

In this embodiment, the conductive bank CPW-B may include a first conductive layer CDL1, a second conductive layer CDL2, and a third conductive layer CDL3. The third conductive layer CDL3 may be disposed under the first conductive layer CDL1. The third conductive layer CDL3 may have a third conductivity lower than the first conductivity and a third thickness TT3 smaller than the first thickness TT1. Although FIG. 6B illustrates that the third thickness TT3 is thinner (or smaller) than the second thickness TT2, this is illustrated as an example, and the third thickness TT3 may be substantially the same as the second thickness TT2.

The third conductive layer CDL3 may include a conductive material. In an embodiment, the third conductive layer CDL3 and the second conductive layer CDL2 may include (or may be formed of) the same material, and the first conductive layer CDL1 may include a material different from a material of the second and third conductive layers CDL2 and CDL3. For example, the second and third conductive layers CDL2 and CDL3 may include titanium (Ti), and the first conductive layer CDL1 may include aluminum (Al). For example, the third conductivity and the second conductivity may be substantially the same as each other.

In an embodiment, the third conductive layer CDL3 may include a material having a greater adhesive strength to the insulating layer ISL than the second conductive layer CDL2. Accordingly, the conductive bank CPW-B may be adhered to the insulating layer ISL with high adhesion, and the conductive bank CPW-B with improved process reliability may be provided, thereby improving reliability of the light emitting elements ED1-B including the emission pattern layers EP1-B patterned by the conductive bank CPW-B and the upper electrodes UE1.

An etch rate of the third conductive layer CDL3 may be smaller than an etch rate of the first conductive layer CDL1. For example, the first conductive layer CDL1 may include a material having a higher etch selectivity than the third conductive layer CDL3.

In a cross-section view, first upper openings OP1-UB may include a first opening portion OP1-U1 defined by the inner surface of the first conductive layer CDL1, a second opening portion OP1-U2 defined by the inner surface of the second conductive layer CDL2, and a third opening portion OP1-U3 defined by an inner surface of the third conductive layer CDL3. For example, in an embodiment, the first upper openings OP1-UB may further include third opening portions OP1-U3.

In a cross-section view, the width W3 (or size) of the third opening portion OP1-U3 may be smaller than the width W1 (or size) of the first opening portion OP1-U1. In an embodiment, the width W3 (or size) of the third opening portion OP1-U3 may be smaller than the width W2 (or size) of the second opening portion OP1-U2, but embodiments are not limited thereto, and the width W3 (or size) of the third opening portion OP1-U3 may be substantially equal to the width W2 (or size) of the second opening portion OP1-U2.

In an embodiment, as the conductive bank CPW-B further includes the third conductive layer CDL3, a portion of the first emission pattern layer EP1-B may be disposed on the upper surface of the third conductive layer CDL3 exposed from the first conductive layer CDL1. Accordingly, a thickness T10 of the first emission pattern layers EP1-B may be designed to be greater than a sum T20 of a thickness of the first sacrificial pattern layer SP1, a thickness of the insulating layer ISL (e.g., a thickness of the portion of the insulating layer ISL disposed on the first sacrificial pattern layer SP1), and a thickness of the third conductive layer CDL3.

Figure 7:
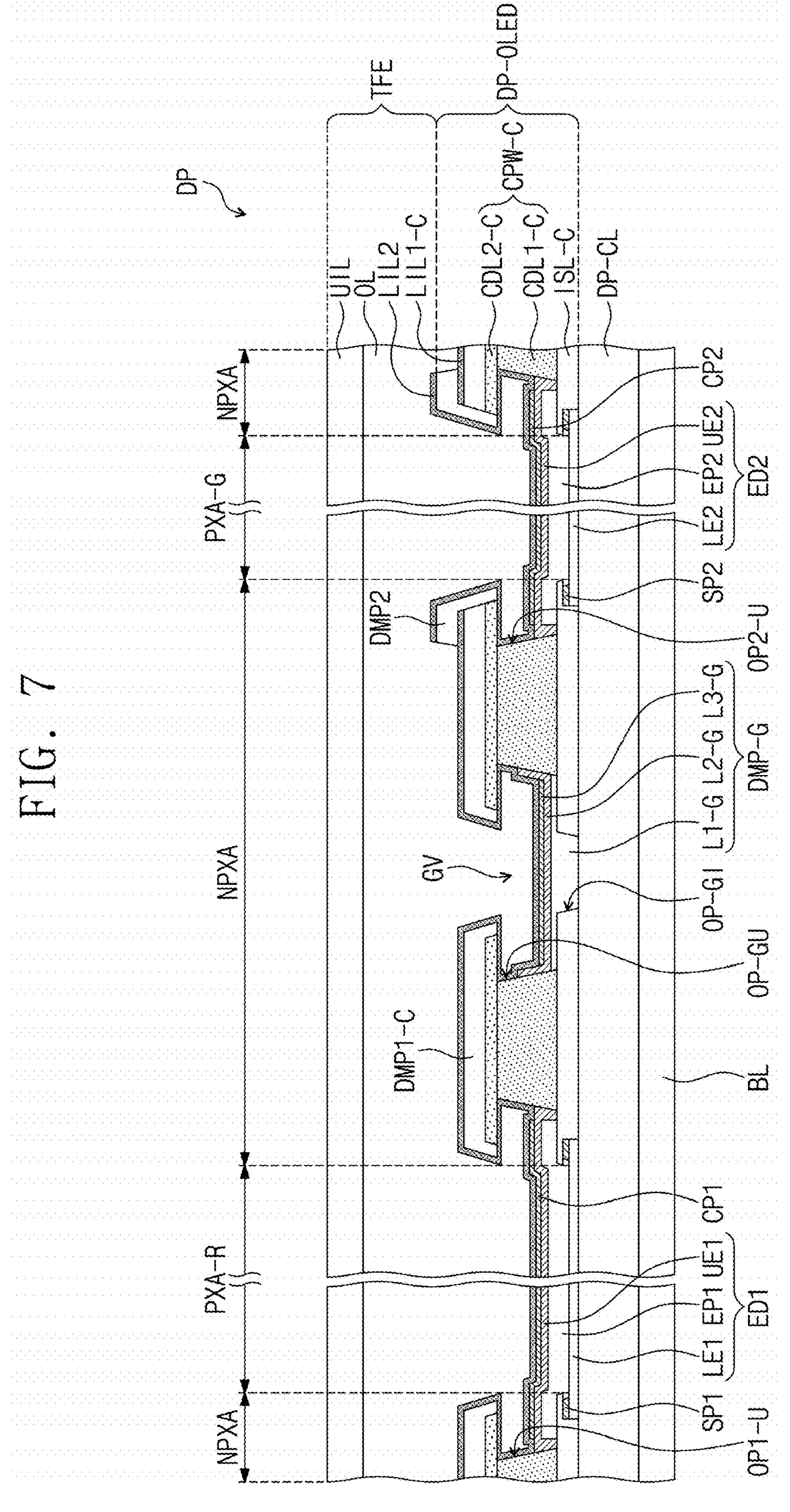
FIG. 7 is a schematic enlarged cross-sectional view of a part of a display panel according to an embodiment.

FIG. 7 is a schematic enlarged cross-sectional view of a portion of a display panel according to an embodiment. FIG. 7 is a schematic enlarged cross-sectional view of a single first emission area PXA-R and a single second emission area PXA-G adjacent thereto. The same/similar reference numerals are used for the same/similar components as those described with reference to FIGS. 1A to 6B, and redundant descriptions are omitted.

Referring to FIG. 7, the display panel DP according to an embodiment may include a base layer BL, a circuit element layer DP-CL, a display element layer DP-OLED, and a thin film encapsulation layer TFE. The display element layer DP-OLED may include first and second light emitting elements ED1 and ED2, first and second sacrificial pattern layers SP1 and SP2, an insulating layer ISL-C, a conductive bank CPW-C, a first dummy pattern layer DMP1-C, a second dummy pattern layer DMP2, and a fourth dummy pattern layer DMP-G.

In an embodiment, an additional lower opening OP-GI may be further defined in the insulating layer ISL-C. The additional lower opening OP-GI may be defined between the adjacent emission areas PXA-R and PXA-G, and the insulating layer ISL-C may be partially removed in a thickness direction to expose an insulating layer (e.g., the sixth insulating layer 60 (refer to FIG. 5A)) disposed on the uppermost side of the circuit element layer DP-CL.

The conductive bank CPW-C may include a first conductive layer CDL1-C and a second conductive layer CDL2-C. An additional upper opening OP-GU may be further defined in the conductive bank CPW-C. The additional upper opening OP-GU may be defined between the adjacent emission areas PXA-R and PXA-G. The second conductive layer CDL2-C defining the additional upper opening OP-GU may protrude toward the uppermost layer (or an additional lower opening OP-GI) of the circuit element layer DP-CL exposed from the additional lower opening OP-GI as compared to the first conductive layer CDL1-C defining the additional upper opening OP-GU.

In an embodiment, a groove GV may be defined in the display panel DP. The groove GV may be defined between the emission areas PXA-R and PXA-G. The groove GV may surround the first emission area PXA-R in a plan view. The groove GV may surround an emission area formed earlier among the two emission areas PXA-R and PXA-G disposed adjacent to each other.

The groove GV may be defined by openings OP-GI and OP-GU passing through some components of the display element layer DP-OLED, respectively. Each of the openings OP-GI and OP-GU may have a closed-line shape in a plan view. A bottom surface of the groove GV may be provided by the uppermost insulating layer (e.g., the sixth insulating layer 60 in, e.g., FIG. 5A) of the circuit element layer DP-CL. The openings OP-GI and OP-GU may include the additional lower opening OP-GI defined in the insulating layer ISL-C and the additional upper opening OP-GU defined in the conductive bank CPW-C.

The display element layer DP-OLED may further include the fourth dummy pattern layer DMP-G. The fourth dummy pattern layer DMP-G may be disposed inside the additional lower opening OP-GI and the additional upper opening OP-GU. The fourth dummy pattern layer DMP-G may include an additional organic layer L1-G, an additional conductive layer L2-G, and an additional capping layer L3-G. The additional organic layer L1-G and the first emission pattern layer EP1 may include (or may be formed of) the same material. The additional conductive layer L2-G may be disposed on the additional organic layer L1-G, and may include (or may be formed of) the same material as a material of the first upper electrode UE1. The additional capping layer L3-G may be disposed on the additional conductive layer L2-G. The additional capping layer L3-G and the first capping pattern layer CP1 may include (or may be formed of) the same material. In another example, the additional capping layer L3-G may be omitted.

For example, the fourth dummy pattern layer DMP-G may correspond to a residue separated from each of the first emission pattern layer EP1, the first upper electrode UE1, and the first capping pattern layer CP1 by the conductive bank CPW-C in case that the first emission pattern layer EP1, the first upper electrode UE1, and the first capping pattern layer CP1 may be commonly formed.

The first dummy pattern layer DMP1-C may cover an inner surface of the second conductive layer CDL2-C defining the additional upper opening OP-GU. The first dummy pattern layers DMP1-C may be spaced apart from the fourth dummy pattern layers DMP-G.

The thin film encapsulation layer TFE may include a first lower encapsulation inorganic layer LILT-C, a second lower encapsulation inorganic layer LIL2, an encapsulation organic layer OL, and an upper encapsulation inorganic layer UIL. In an embodiment, the first lower encapsulation inorganic layer LIL1-C may be disposed inside the additional upper opening OP-GU. For example, the first lower encapsulation inorganic layer LIL1-C may be in contact with an inner surface of the first conductive layer CDL1-C defining the additional upper opening OP-GU.

According to an embodiment, the additional upper opening OP-GU may be further formed in the conductive bank CPW-C between the adjacent emission areas PXA-R and PXA-G and thus the first lower encapsulation inorganic layer LIL1-C may cover the inside of the additional upper opening OP-GU, thereby blocking a moisture permeation path for external moisture from extending from one emission area to an adjacent emission area. For example, a lower surface of the second conductive layer CDL2 exposed from the first conductive layer CDL1 may be in contact with the first lower encapsulation inorganic layer LIL1-C, thereby minimizing inflow of external moisture. Accordingly, occurrence of damage to the light emitting elements ED1 and ED2 due to moisture may be minimized, thereby forming the light emitting elements ED1 and ED2 with improved reliability.

Figures 8A, 8B:
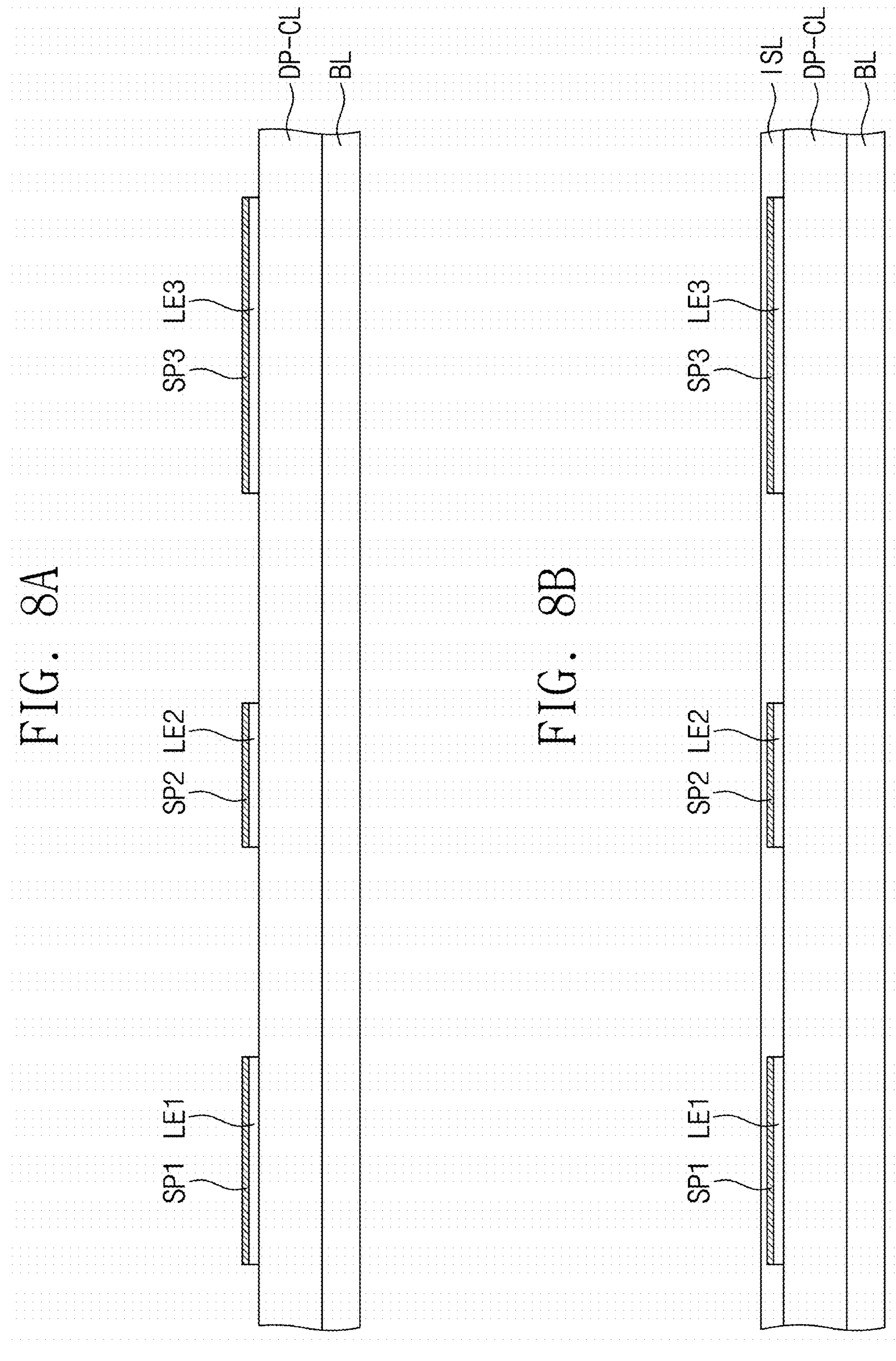
FIGS. 8A to 8C are schematic cross-sectional views illustrating some steps of a method of manufacturing a display panel according to an embodiment.
Figure 8C:
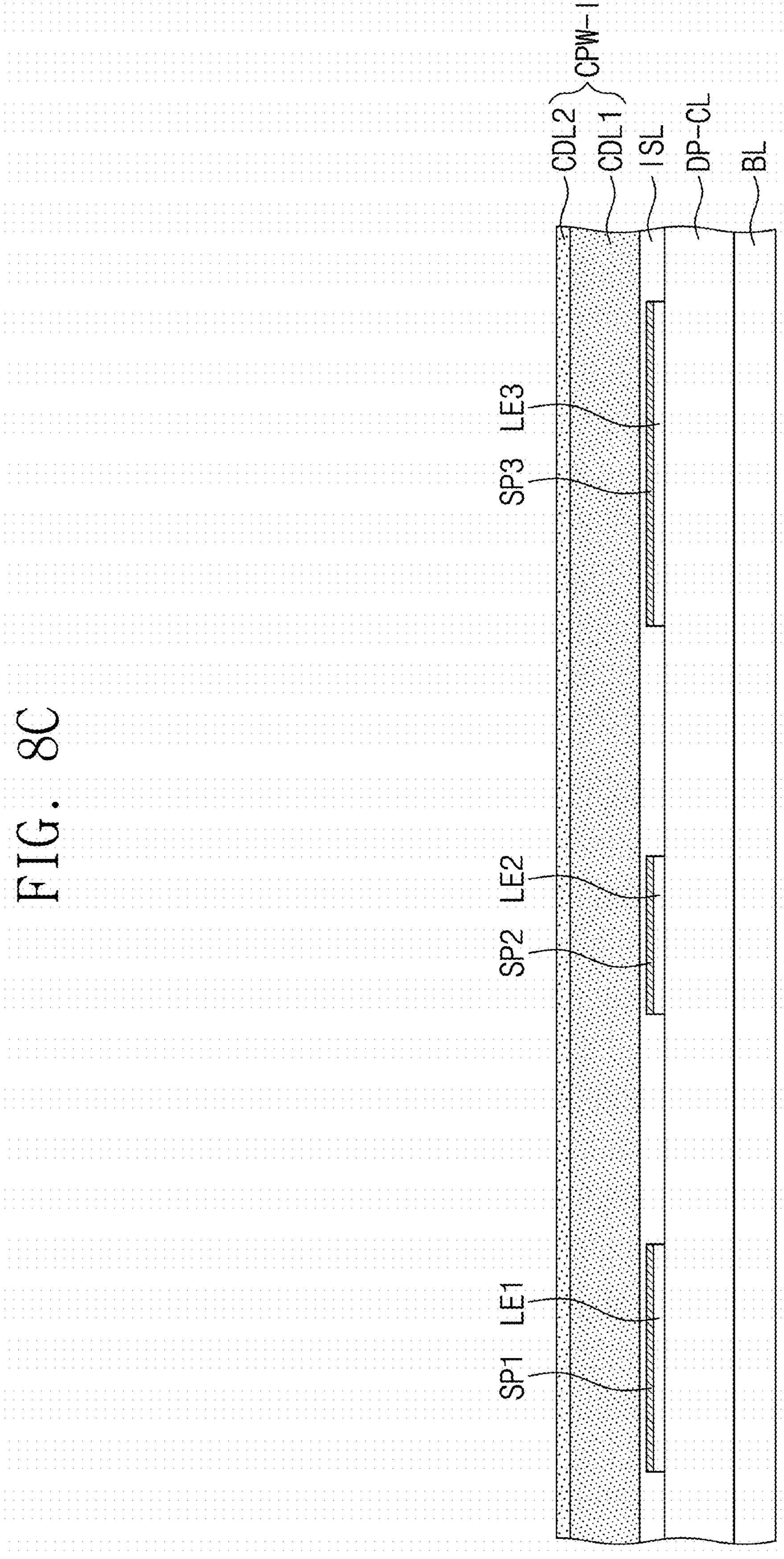

FIGS. 8A to 8C are schematic cross-sectional views illustrating some steps of a method of manufacturing a display panel according to an embodiment. FIGS. 9A to 9I are schematic cross-sectional views illustrating some steps of a method of manufacturing a display panel according to an embodiment. FIGS. 10A to 10F are schematic cross-sectional views illustrating some steps of a method of manufacturing a display panel according to an embodiment. FIGS. 11A to 11E are schematic cross-sectional views illustrating some steps of a method of manufacturing a display panel according to an embodiment. FIGS. 12A to 12E are schematic cross-sectional views illustrating some steps of a method of manufacturing a display panel according to an embodiment.

A method for manufacturing a display panel according to an embodiment may include a first group process, a second group process, a third group process, a fourth group process, and a fifth group process. The first group process (or pre-processing process) may be a process of preparing a preliminary display panel for forming a conductive bank CPW (refer to FIG. 9C), and the second to fourth group processes may be processes of forming first to third light emitting elements ED1, ED2, and ED3 (refer to FIG. 11D), respectively, and the fifth group process (or post-processing process) may be a process of completing a display panel DP (refer to FIG. 12E) by removing some of the components formed by the second to fourth group processes.

For example, the first group process will be described with reference to FIGS. 8A to 8C.

Referring to FIG. 8A, the first group process according to an embodiment may include patterning first to third lower electrodes LE1, LE2, and LE3 and first to third sacrificial pattern layers SP1, SP2, and SP3 on a base substrate. In an embodiment, the base substrate may include a base layer BL and a circuit element layer DP-CL disposed on the base layer BL. The circuit element layer DP-CL may be formed by a manufacturing process of a circuit element including forming an insulating layer, a semiconductor layer, and a conductive layer by methods, e.g., coating and vapor deposition processes, and forming a semiconductor pattern layer, a conductive pattern layer, a signal line, and the like by selectively patterning the insulating layer, the semiconductor layer, and the conductive layer by photolithography and etching processes.

The first to third lower electrodes LE1, LE2, and LE3 may be formed on a sixth insulating layer 60 (refer to FIG. 5A) of the circuit element layer DP-CL, and the first to third sacrificial pattern layers SP1, SP2, and SP3 may be formed on the first to third lower electrodes LE1, LE2, and LE3, respectively. The first to third lower electrodes LE1, LE2, and LE3 and the first to third sacrificial pattern layers SP1, SP2, and SP3 may be formed by the same patterning process.

Referring to FIG. 8B, the first group process according to an embodiment may include forming an insulating layer ISL on the base substrate. The insulating layer ISL may be formed on the sixth insulating layer 60 (refer to FIG. 5A) of the circuit element layer DP-CL and may cover the first to third lower electrodes LE1, LE2, and LE3 and the first to third sacrificial pattern layers SP1, SP2, and SP3.

According to an embodiment, the first sacrificial pattern layer SP1 and the insulating layer ISL may be designed such that a sum T2 (refer to FIG. 5A) of a thickness of the first sacrificial pattern layer SP1 and a thickness of a portion of the insulating layer ISL disposed on the first sacrificial pattern layer SP1 may be thinner (or smaller) than a thickness T1 (refer to FIG. 5A) of the first emission pattern layer EP1 (refer to FIG. 5A) to be formed later.

Referring to FIG. 8C, the first group process according to an embodiment may include forming a conductive bank layer CPW-I on the insulating layer ISL. The conductive bank layer CPW-I may include a first conductive layer CDL1 and a second conductive layer CDL2 formed on the first conductive layer CDL1. The first conductive layer CDL1 may have a first conductivity and a first thickness TT1 (refer to FIG. 5A), and the second conductive layer CDL2 may have a second conductivity lower than the first conductivity and a second thickness TT2 (refer to FIG. 5A) smaller than the first thickness TT1 (refer to FIG. 5A).

Through the first group process, a preliminary display panel including the base layer BL, the circuit element layer DP-CL, the first to third lower electrodes LE1, LE2, and LE3, the first to third sacrificial pattern layers SP1, SP2, and SP3, the insulating layer ISL, and the conductive bank layer CPW-I may be formed.

After the first group process, the second group process may be performed. In an embodiment, by the second group process, a first light emitting element ED1 (refer to FIG. 9I) and a first lower encapsulation inorganic layer LIL1 (refer to FIG. 9I) covering the first light emitting element ED1 may be formed. Hereinafter, the second group process will be described with reference to FIGS. 9A to 9I.

Figure 9A:
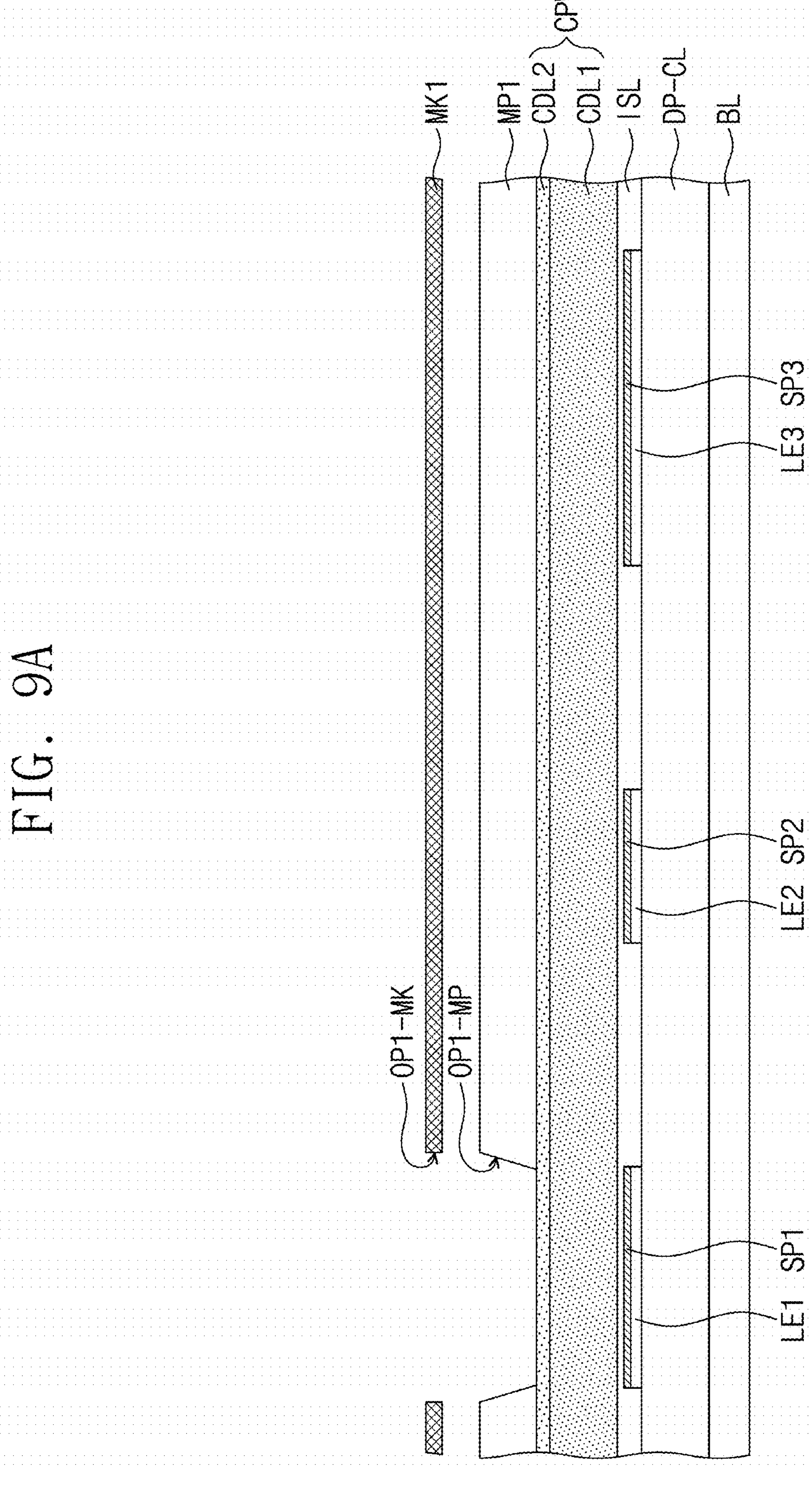

Referring to FIG. 9A, the second group process according to an embodiment may include forming a first mask pattern layer MP1 on the preliminary display panel formed by the first group process. The first mask pattern layer MP1 may be formed by exposure and development processes by using a first photomask MK1 having a first mask opening OP1-MK. A first photo opening OP1-MP corresponding to the first mask opening OP1-MK may be formed in the first mask pattern layer MP1. The first mask opening OP1-MK and the first photo opening OP1-MP may overlap the first lower electrode LE1.

Figure 9B:
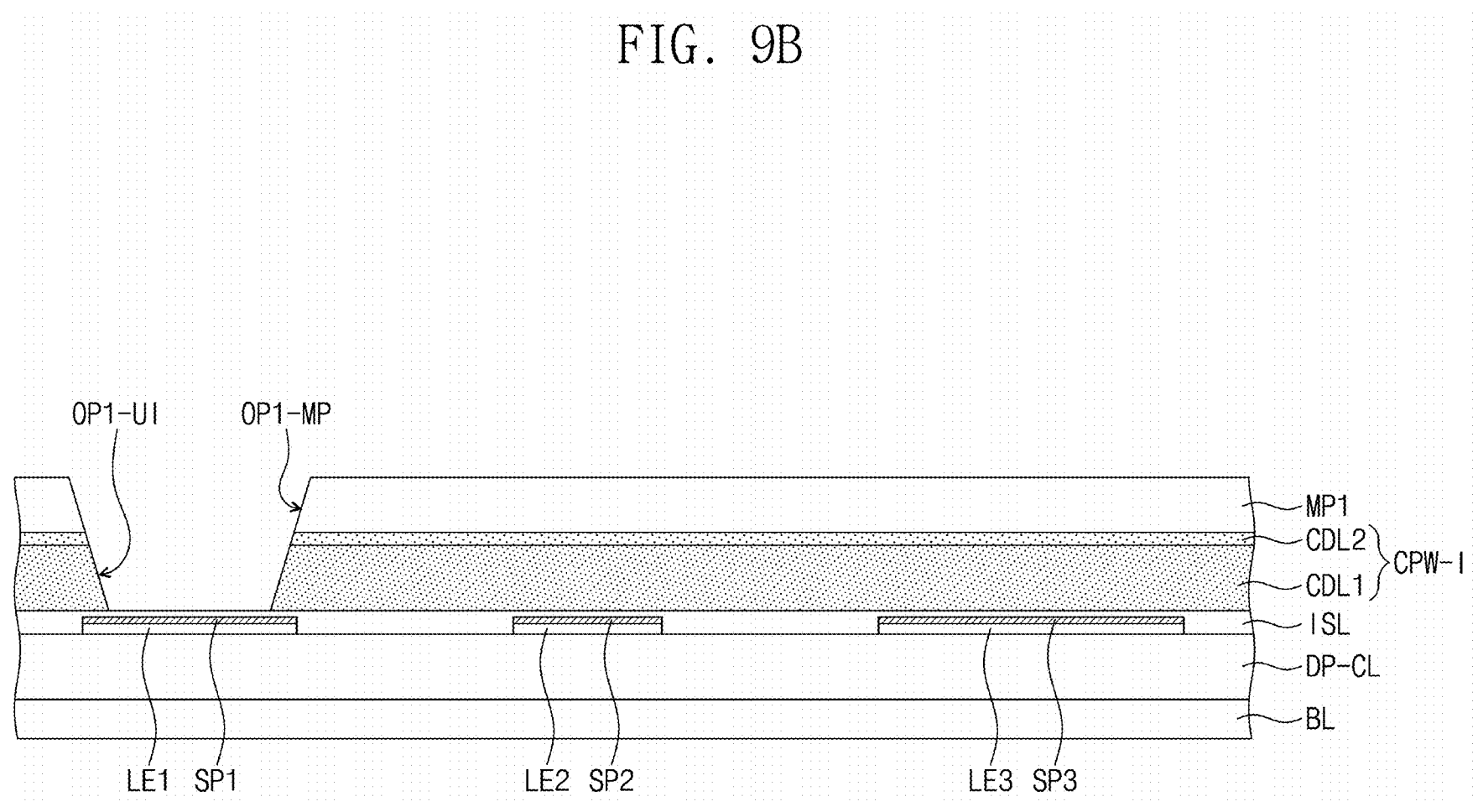
Figure 9C:
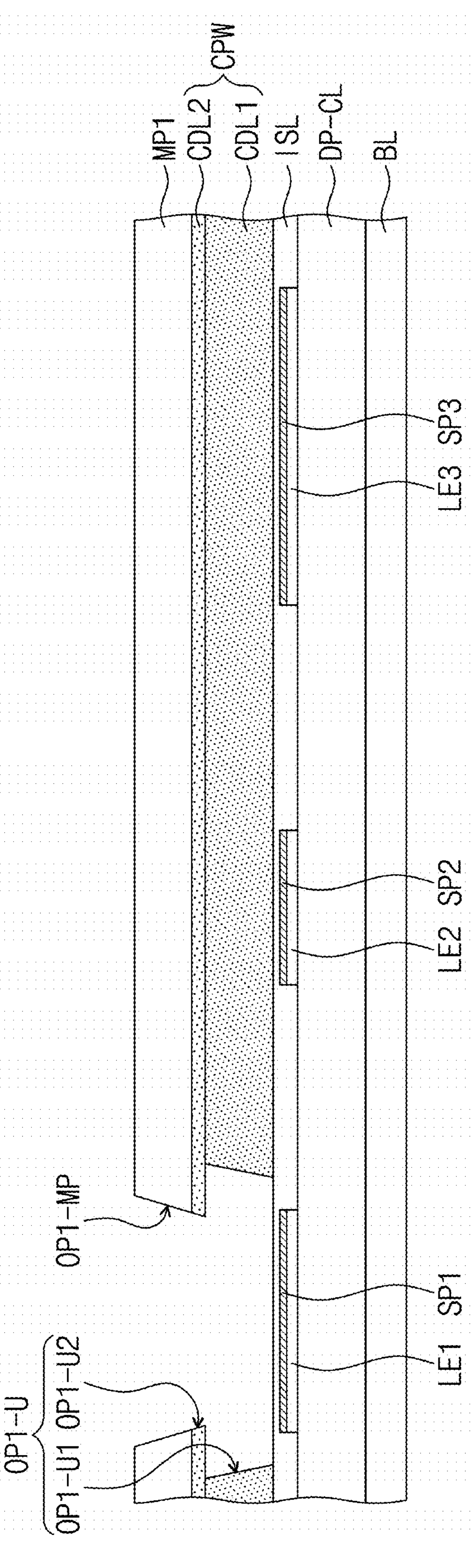

Referring to FIGS. 9A to 9C, the second group process according to an embodiment may include forming a conductive bank CPW defining a first upper opening OP1-U from the conductive bank layer CPW-I by a first etching process.

As shown in FIG. 9B, the first etching process may include dry etching the first and second conductive layers CDL1 and CDL2 by using the first mask pattern layer MP1 as a mask to form a first preliminary upper opening OP1-UI in the conductive bank layer CPW-I.

Thereafter, as shown in FIG. 9C, the first etching process may include wet etching the first and second conductive layers CDL1 and CDL2 by using the first mask pattern layer MP1 as a mask to form the conductive bank CPW in which the first upper openings OP1-U are formed. For example, in the first etching process, the wet-etched first and second conductive layers CDL1 and CDL2 may form the conductive bank CPW.

In the wet etching process of the first and second conductive layers CDL1 and CDL2, an etch rate of the first conductive layer CDL1 may be greater than an etch rate of the second conductive layer CDL2, with respect to an etching solution, and thus the first conductive layer CDL1 may be mainly etched. Accordingly, after the wet etching process is completed, an inner surface of the second conductive layer CDL2 defining a second opening portion OP1-U2 of the first upper opening OP1-U may be closer to a center portion of the first lower electrode LE1 than an inner surface of the first conductive layer CDL1 defining a first opening portion OP1-U1 of the first upper opening OP1-U, e.g., in a plan view. A tip portion may be formed at the second conductive layer CDL2 of the conductive bank CPW.

Figure 9D:
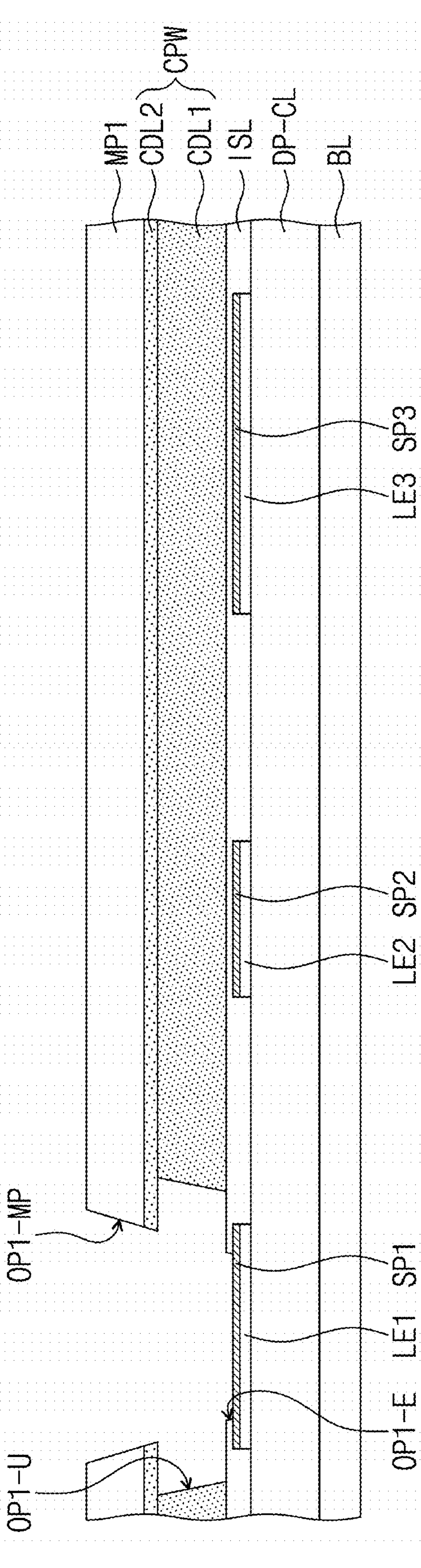

Referring to FIG. 9D, the second group process according to an embodiment may include forming a first emission openings OP1-E in the insulating layer ISL by a second etching process. The second etching process may be performed by a dry etching process, and may be performed by using the first mask pattern layer MP1 and the second conductive layer CDL2 as a mask.

Figure 9E:
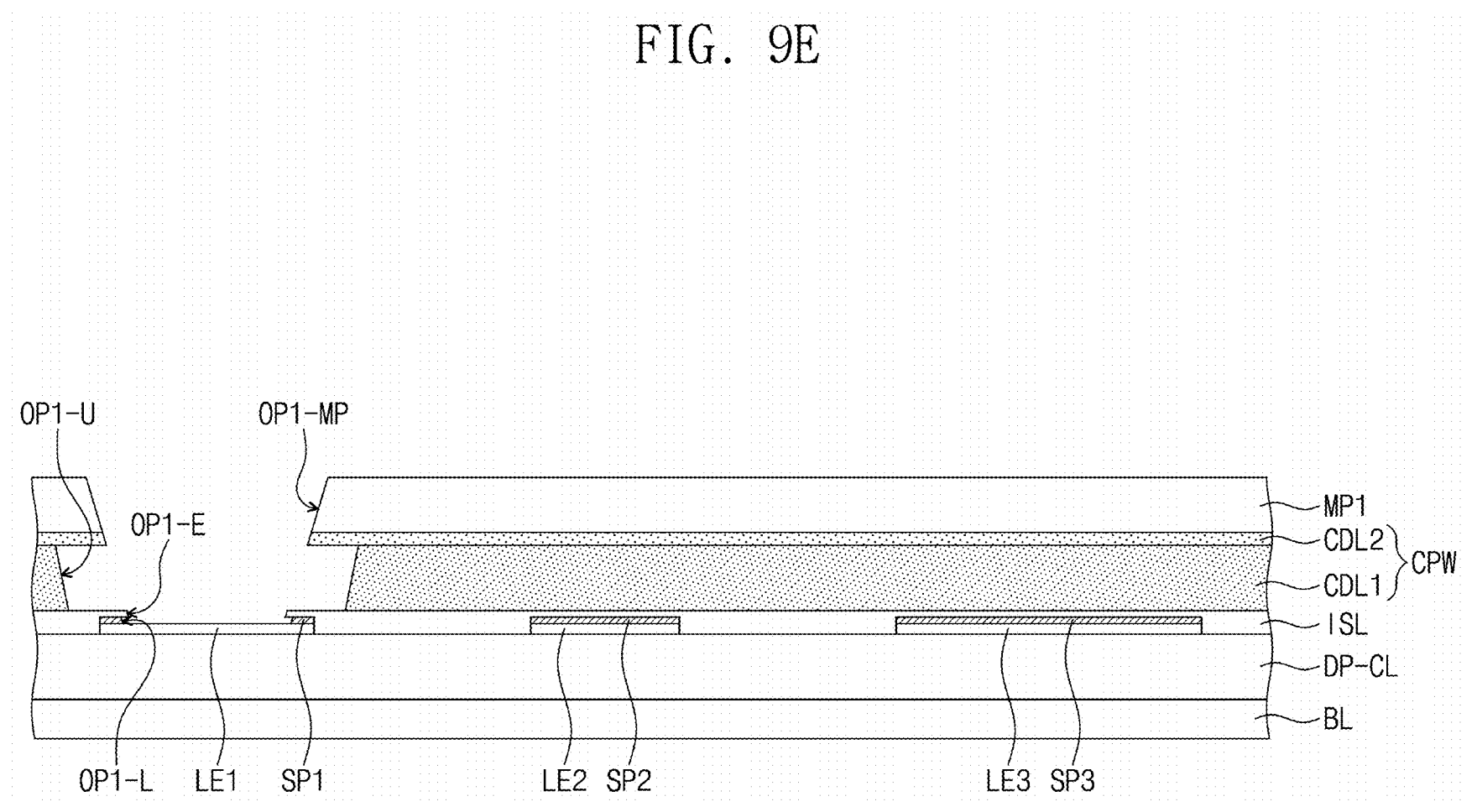

Referring to FIG. 9E, the second group process according to an embodiment may include forming a first lower openings OP1-L in the first sacrificial pattern layer SP1 by a third etching process. The third etching process may be performed by a wet etching process and may be performed by using the insulating layer ISL as a mask. For example, the first lower opening OP1-L may have the area larger than the area of the first emission opening OP1-E, and a tip portion may be formed in the insulating layer ISL.

According to an embodiment, according to the material properties of the first sacrificial pattern layer SP1 and the first lower electrode LE1, the etch rate of the first lower electrode LE1 may be very lower as compared to the etch rate of the first sacrificial pattern layer SP1 with respect to the etching solution. Accordingly, the first lower electrode LE1 may be prevented from being etched together in the etching process of the first sacrificial pattern layer SP1. For example, the first sacrificial pattern layer SP1 including a material having a high selectivity to the first lower electrode LE1 may be disposed between the first lower electrode LE1 and the insulating layer ISL, and may block the first lower electrode LE1 from being etched during the etching process, thereby preventing damage of the first lower electrode LE1.

Figure 9F:
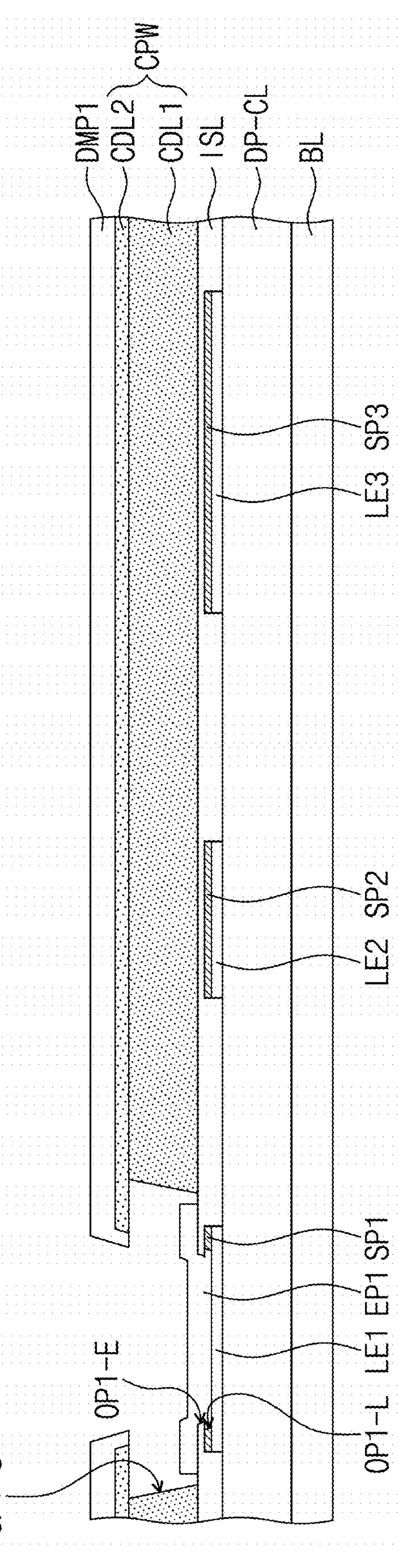

Referring to FIG. 9F, the second group process according to an embodiment may include forming a first emission pattern layer EP1. After the first mask pattern layer MP1 (refer to FIG. 9E) is removed, the first emission pattern layer EP1 may be formed by a thermal evaporation process. The first emission pattern layer EP1 may be formed inside the first lower opening OP1-L, the first emission opening OP1-E, and the first upper opening OP1-U, on the first lower electrode LE1.

According to an embodiment, the thickness T1 (refer to FIG. 5A) of the first emission pattern layer EP1 may be greater than the sum T2 (refer to FIG. 5A) of the thickness of the first sacrificial pattern layer SP1 and the thickness of a portion of the insulating layer ISL disposed on the first sacrificial pattern layer SP1, and thus a portion of the first emission pattern layer EP1 disposed on the first lower electrode LE1 and a portion of the first emission pattern layer EP1 disposed on the insulating layer ISL may be prevented from being separated from each other, at a portion covering the inner surface of the insulating layer ISL defining the first emission openings OP1-E. For example, the first emission pattern layer EP1 may be continuously formed inside the first lower opening OP1-L, the first emission opening OP1-E, and the first upper opening OP1-U.

In the forming of the first emission pattern layer EP1, the first dummy pattern layer DMP1 may be formed together. In the forming of the first emission pattern layer EP1, the first dummy pattern layer DMP1 may correspond to the above-described first organic layer L1 (refer to FIG. 5A). The first dummy pattern layer DMP1 and the first emission pattern layer EP1 may be formed of the same material, and may be formed to have the same structure as each other. The first emission pattern layer EP1 and the first dummy pattern layer DMP1 may be deposited to be separated from each other by the tip portion defined in the conductive bank CPW, and may be spaced apart from each other.

Figure 9G:
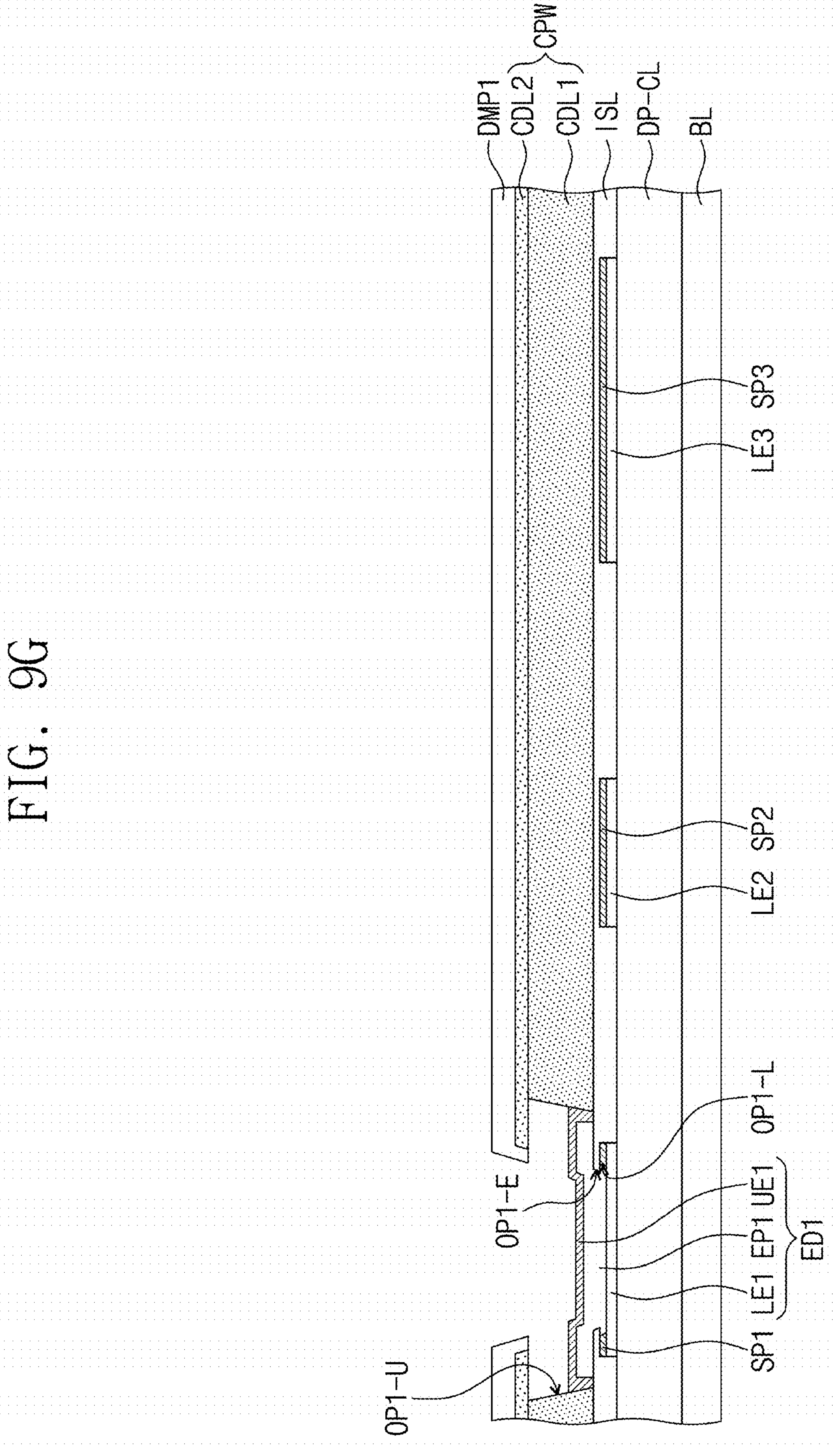

Referring to FIG. 9G, the second group process according to an embodiment may include forming a first upper electrode UE1. The first upper electrode UE1 may be formed by a sputtering process. The first upper electrode UE1 may be formed on the first emission pattern layer EP1 inside the first upper opening OP1-U.

A sputtering process may provide deposition material at a higher angle of incidence than a thermal evaporation process. Accordingly, for example, when the first emission pattern EP1 is formed through a thermal evaporation process and the first upper electrode UE1 may be formed by a sputtering process, the first upper electrode UE1 may be provided at higher incident angle than that of the first emission pattern layer EP1, and thus the first upper electrode UE1 may be in contact with the inner surface of the first conductive layer CDL1 defining the first upper opening OP1-U. In an embodiment, like the first upper electrode UE1-A described above with reference to FIG. 6A, the first upper electrode UE1 may include a first part BP that covers the first emission pattern layer EP1 (refer to FIG. 5C) and a second part PP (refer to FIG. 6A) protruding from the first part BP (refer to FIG. 6A).

According to an embodiment, as the first emission pattern layer EP1 is continuously formed, the first upper electrode UE1 may be continuously formed without being separated from the inside of the first upper opening OP1-U. Accordingly, the first upper electrode UE1 may be connected (e.g., electrically connected) to the conductive bank CPW and defective first light emitting element ED1 may not be provided.

In the forming of the first upper electrode UE1, a first conductive layer L2 (refer to FIG. 5A) may be further formed, and the first dummy pattern layer DMP1 may correspond to a structure including a first organic layer L1 (refer to FIG. 5A) and a first conductive layer L2 (refer to FIG. 5A) disposed on the first organic layer L1 (refer to FIG. 5A). As the first upper electrode UE1 and the first dummy pattern layer DMP1 including the first conductive layer L2 (refer to FIG. 5A) may be deposited to be separated from each other by the tip portion defined in the conductive bank CPW, the first upper electrode UE1 and the first dummy pattern layer DMP1 including the first conductive layer L2 (refer to FIG. 5A) may be formed to be spaced apart from each other.

Figure 9H:
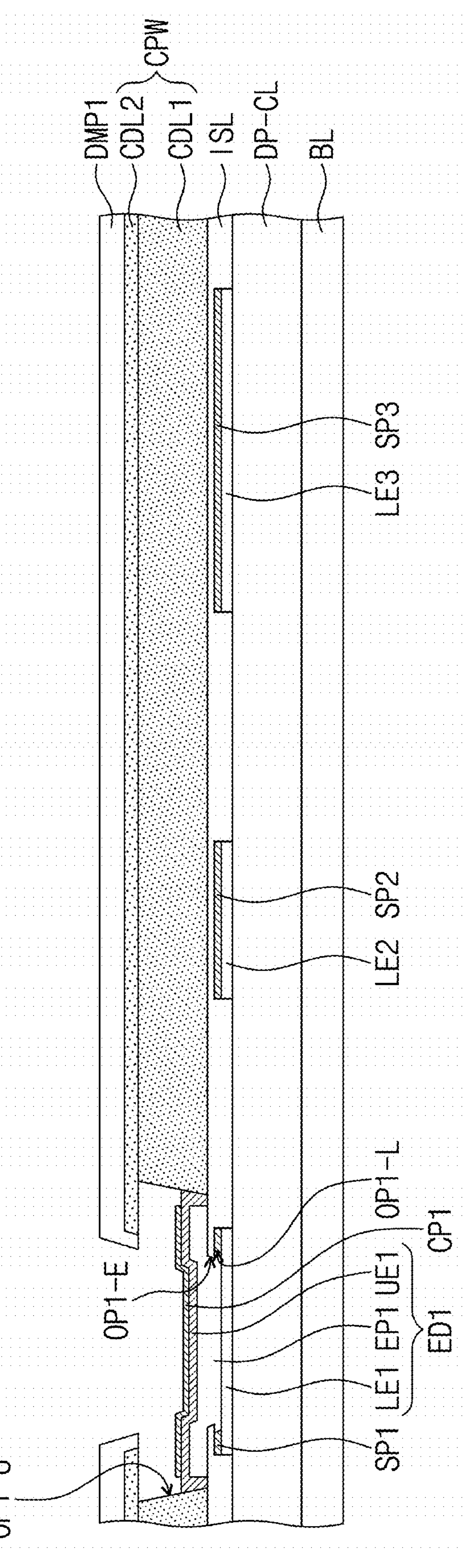

As shown in FIG. 9H, the second group process according to an embodiment may further include forming a capping pattern layer CP1 inside the first upper opening OP1-U on the first upper electrode UE1 after the forming of the first upper electrode UE1. For example, as the first capping layer L3 (refer to FIG. 5A) is further formed on the first conductive layer CDL1, the first dummy pattern layer DMP1 may correspond to a structure including a first organic layer L1 (refer to FIG. 5A), a first conductive layer L2 (refer to FIG. 5A) disposed on the first organic layer L1 (refer to FIG. 5A), and a first capping layer L3 (refer to FIG. 5A) disposed on the first conductive layer L2 (refer to FIG. 5A). In another example, the forming of the first capping pattern layer CP1 may be omitted.

Figure 9I:
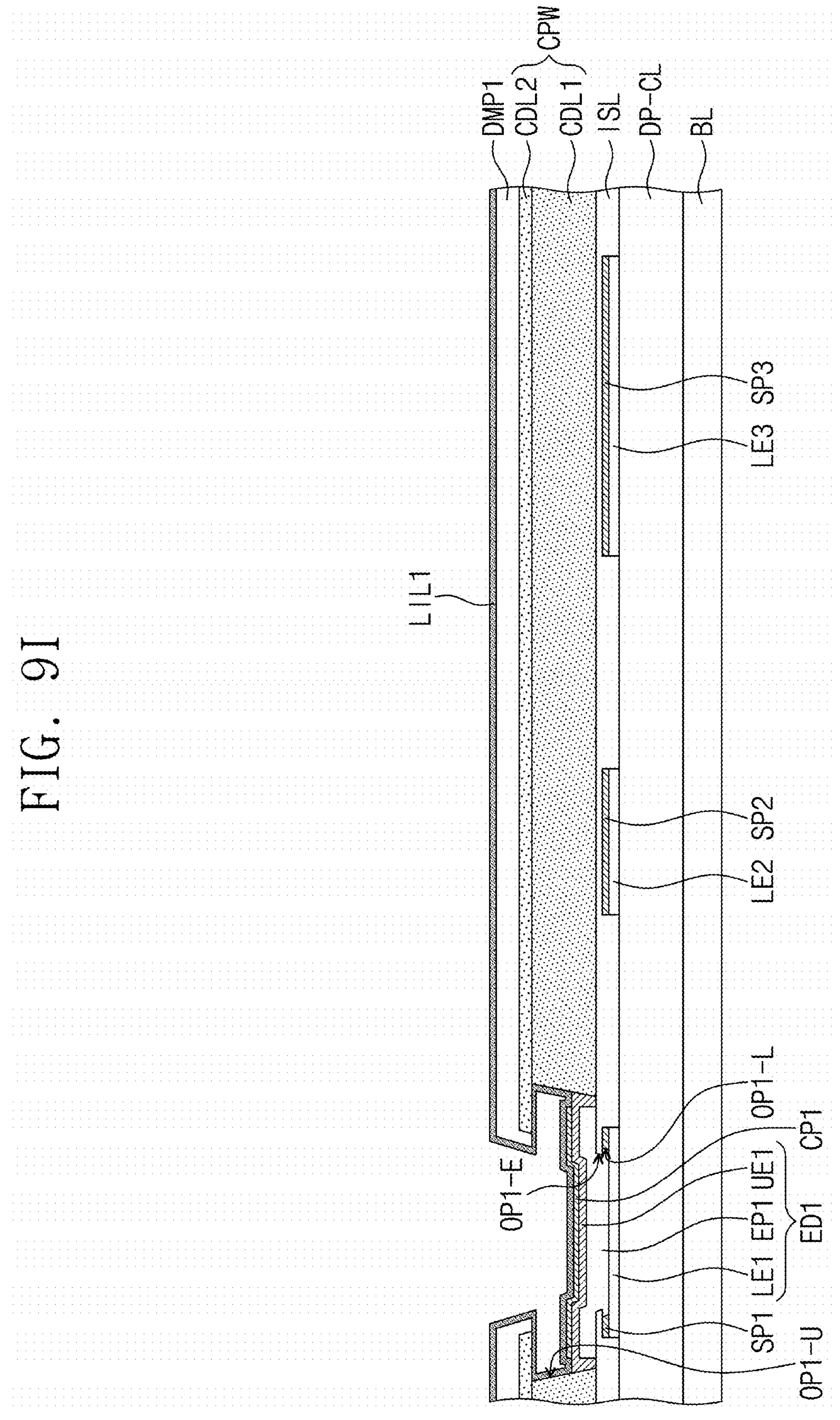

Referring to FIG. 9I, the second group process according to an embodiment may include forming a first lower encapsulation inorganic layer LIL1. The first lower encapsulation inorganic layer LIL1 may be formed by a chemical vapor deposition (CVD) process. The first lower encapsulation inorganic layer LIL1 may be formed on the conductive bank CPW and the first upper electrode UE1, and may be disposed inside the first upper opening OP1-U.

After the second group process, the third group process may be performed. In an embodiment, a second light emitting element ED2 (refer to FIG. 10F) and a second preliminary lower encapsulation inorganic layer LIL2-I (refer to FIG. 10F) covering the second light emitting element ED2 (refer to FIG. 10F) may be formed by the third group process. The third group process may include first to fifth etching processes. The third to fifth etching processes of the third group process may be performed in a similar manner to the first to third etching processes of the second group process, respectively. Accordingly, the first and second etching processes of the third group process may be more included as compared to the second group process. Hereinafter, the third group process will be described with reference to FIGS. 10A to 10F, and the same/similar reference numerals are used for the same/similar reference numerals as those described in FIGS. 8A to 9I, and redundant descriptions are omitted.

Figure 10A:
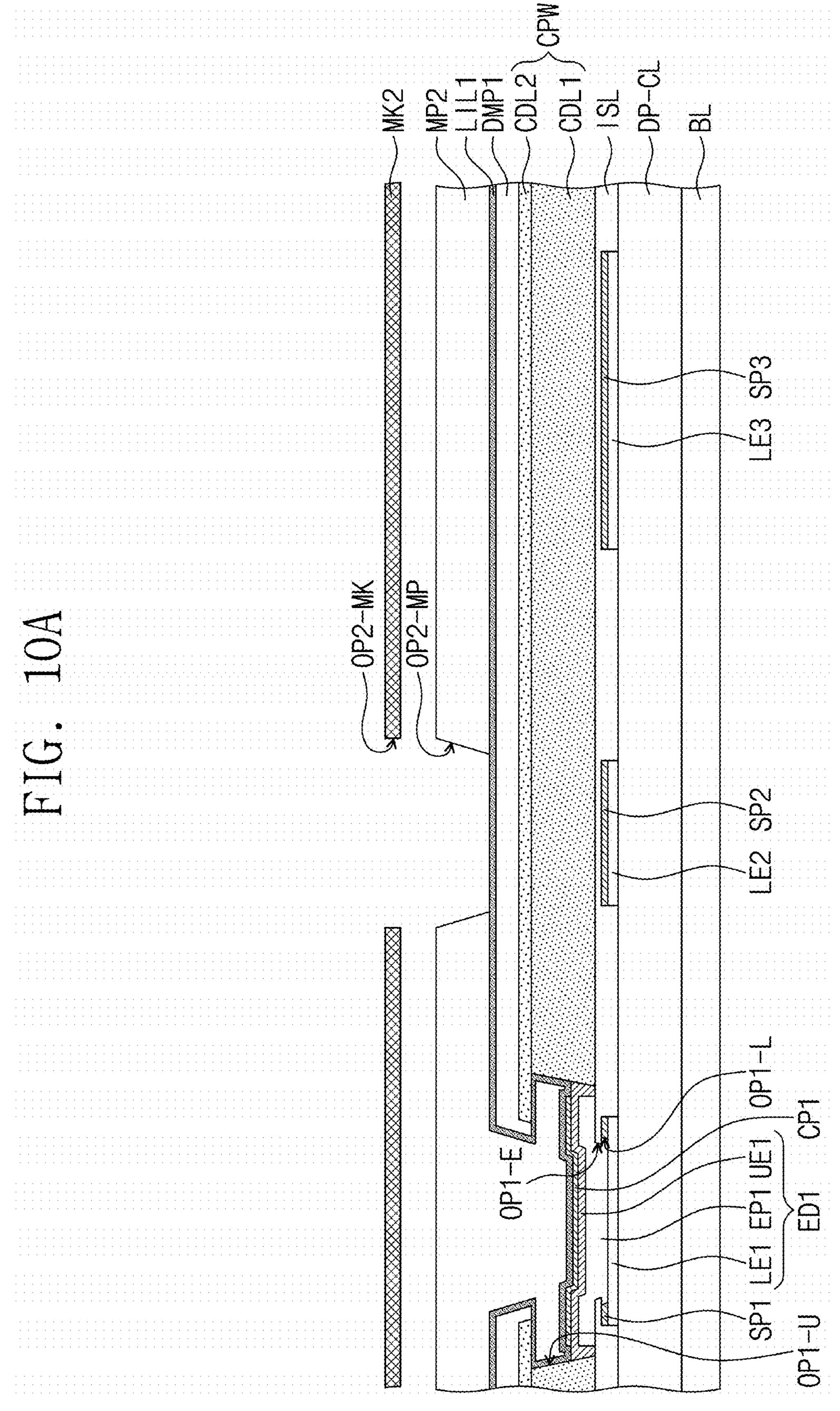
FIGS. 10A to 10F are schematic cross-sectional views illustrating some steps of a method of manufacturing a display panel according to an embodiment.

Referring to FIG. 10A, the third group process according to an embodiment may include forming a second mask pattern layer MP2. The second mask pattern layer MP2 may be formed by exposure and development processes by using a second photomask MK2 having a second mask openings OP2-MK. A second photo opening OP2-MP overlapping the second lower electrode LE2 may be formed in the second mask pattern layer MP2.

Figure 10B:
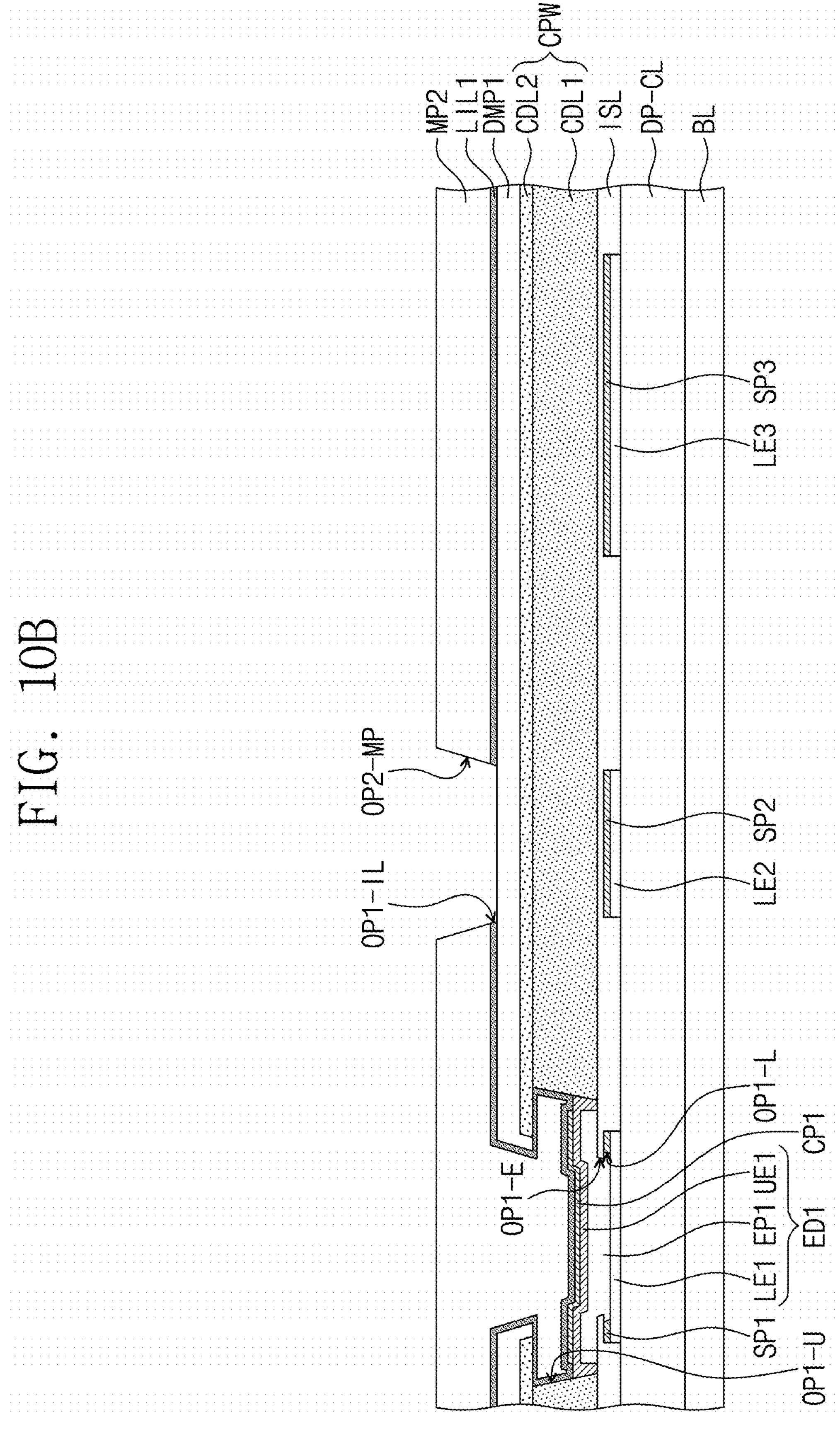
Figure 10C:
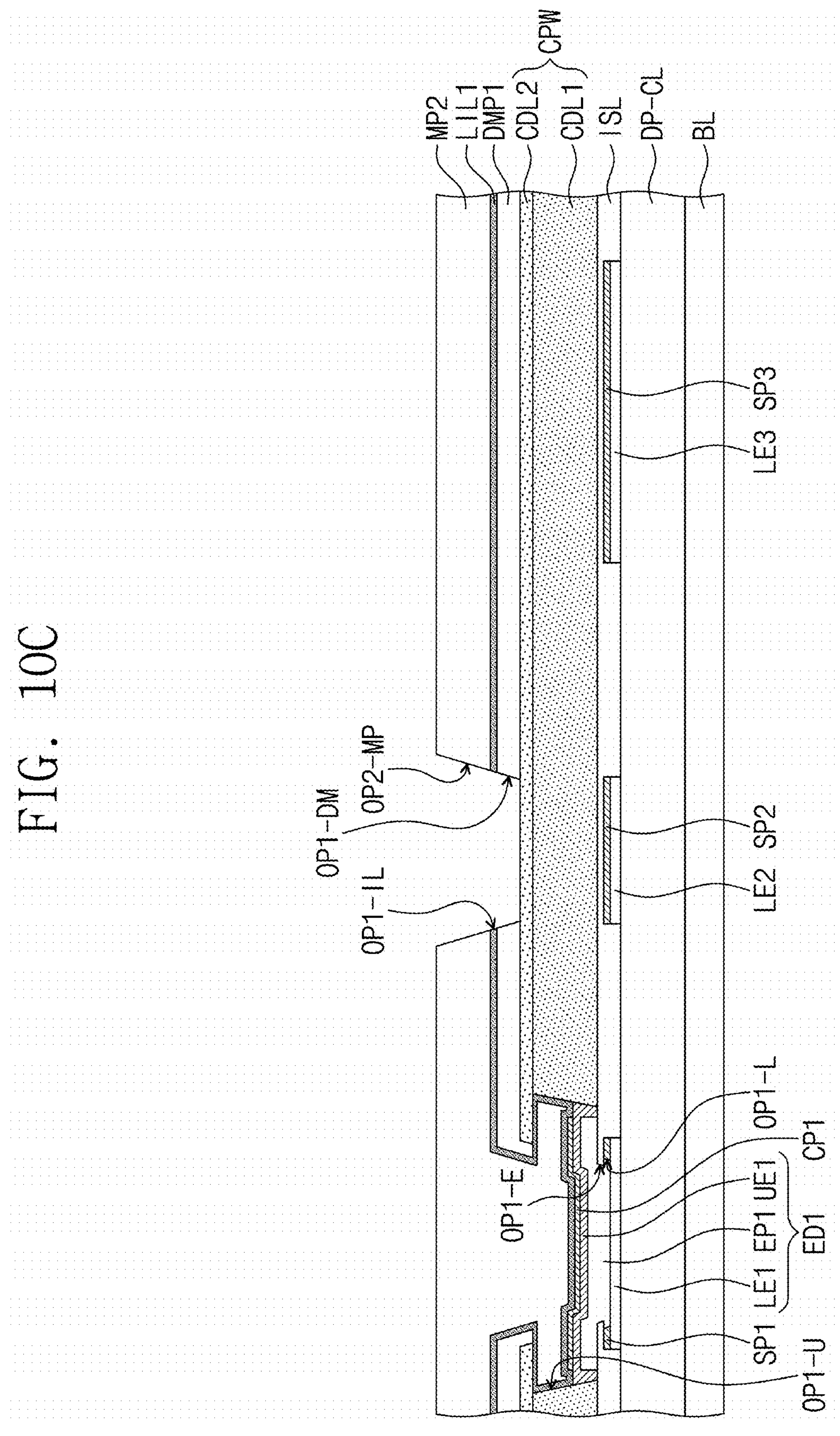

Referring to FIGS. 10B and 10C, the third group process according to an embodiment may include forming a first encapsulation opening OP1-IL in a first lower encapsulation inorganic layer LIL1 by a first etching process and forming a first dummy pattern opening OP1-DM in the first dummy pattern layer DMP1 by a second etching process.

As shown in FIG. 10B, the first etching process may include forming the first encapsulation openings OP1-IL in the first lower encapsulation inorganic layer LIL1 by using the second mask pattern layer MP2 as a mask. The etching of the first lower encapsulation inorganic layer LIL1 may be performed by a dry etching process. The first encapsulation opening OP1-IL may correspond to a second photo opening OP2-MP and may overlap the second lower electrode LE2.

Thereafter, as shown in FIG. 10C, the second etching process may include forming the first dummy pattern opening OP1-DM in the first dummy pattern layer DMP1 by using the second mask pattern layer MP2 and the first lower encapsulation inorganic layer LIL1 as a mask. The first dummy pattern opening OP1-DM may correspond to the first encapsulation opening OP1-IL.

The etching of the first dummy pattern layer DMP1 may be performed by one of a dry etching process and a wet etching process. For example, the dry and wet etching processes for each of the first organic layer L1 (refer to FIG. 5A), the first conductive layer L2 (refer to FIG. 5A), and the first capping layer L3 (refer to FIG. 5A) in the first dummy pattern layer DMP1 may be performed by adopting an appropriate process among the dry etching process and the wet etching process.

Figure 10D:
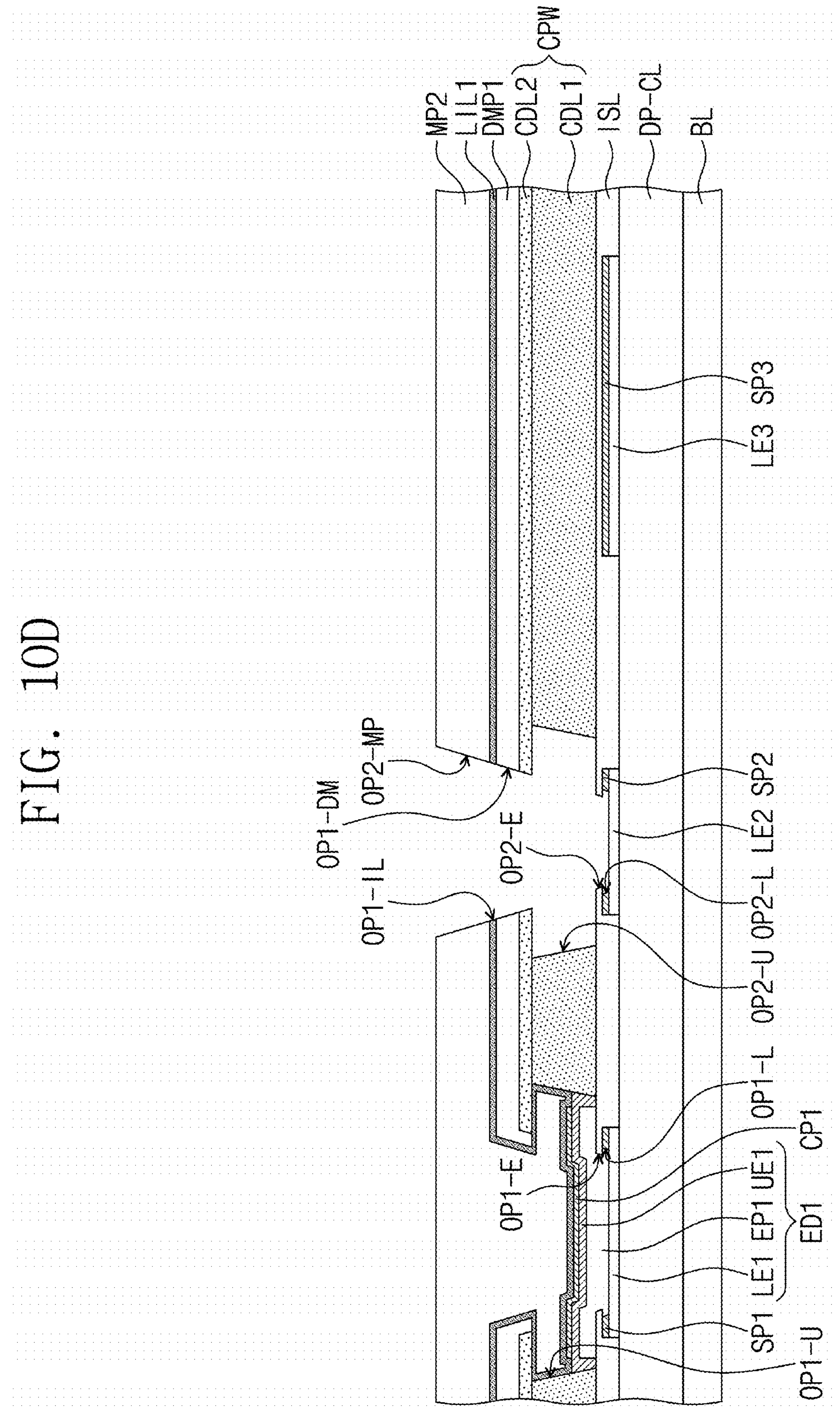

Referring to FIG. 10D, the third group process according to an embodiment may include forming a second upper opening OP2-U spaced apart from the first upper opening OP1-U and corresponding to the first encapsulation opening OP1-IL in the conductive bank CPW by the third etching process, forming a second emission opening OP2-E spaced apart from the first emission openings OP1-E in the insulating layer ISL by the fourth etching process, and forming a second lower opening OP2-L in the second sacrificial pattern layer SP2 through the fifth etching process. For example, the second upper opening OP2-U, the second emission opening OP2-E, and the second lower opening OP2-L may be formed in a similar manner as the first upper opening OP1-U, the first emission opening OP1-E, and the first lower opening OP1-L in the second group process, respectively.

According to an embodiment, a second upper opening OP2-U, a second emission opening OP2-E, and a second lower opening OP2-L may be formed in the conductive bank CPW, the insulating layer ISL, and the second sacrificial pattern layer SP2, respectively, after the forming of the first light emitting element ED1. Accordingly, in case that the first light emitting element ED1 is formed, the second and third lower electrodes LE2 and LE3 may be covered by the conductive bank CPW, the insulating layer ISL, and the second and third sacrificial pattern layers SP2 and SP3 and may not be exposed. Accordingly, damage to the second and third lower electrodes LE2 and LE3 may be prevented in the process of the forming of the first light emitting element ED1.

Figure 10E:
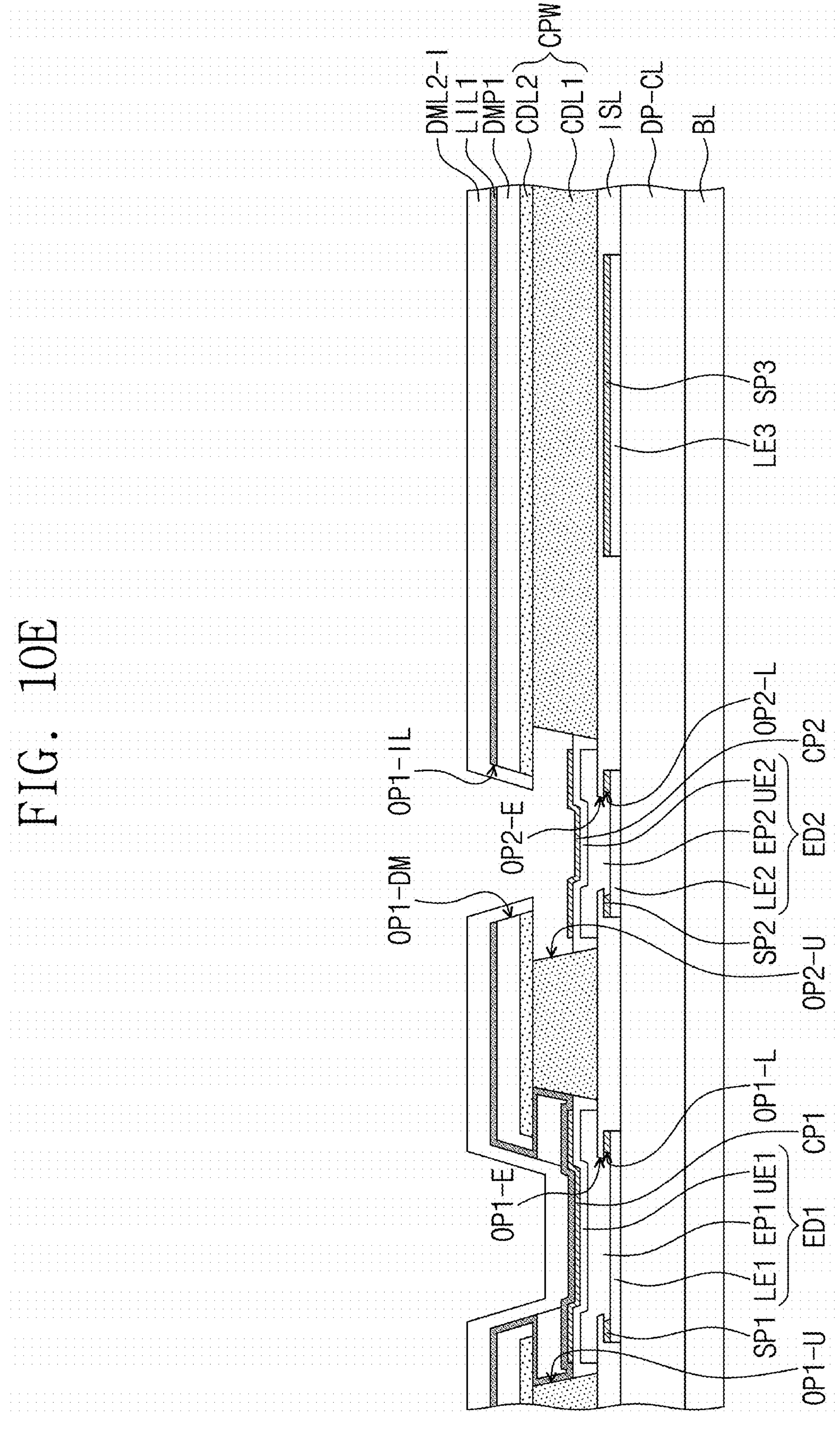

Referring to FIG. 10E, the third group process according to an embodiment may include forming a second emission pattern layer EP2 and forming a second upper electrode UE2. The second emission pattern layer EP2 and the second upper electrode UE2 may be formed in a manner similar to the method of forming the first emission pattern layer EP1 and the first upper electrode UE1 in the second group process, respectively.

For example, a second preliminary dummy layer DML2-I may be further formed. A portion of the second preliminary dummy layer DML2-I may be disposed on the conductive bank CPW to cover the first lower encapsulation inorganic layer LIL1 disposed on the conductive bank CPW. For example, another portion of the second preliminary dummy layer DML2-I may be disposed inside the first upper opening OP1-U to cover a portion of the first lower encapsulation inorganic layer LIL1 disposed inside the first upper opening OP1-U.

Although FIG. 10E illustrates that the second preliminary dummy layer DML2-I is continuously formed inside the first upper opening OP1-U, the second preliminary dummy layer DML2-I may be provided as a pattern layer separated from the inner surface of the first upper opening OP1-U by the tip portion of the conductive bank CPW.

Figure 10F:
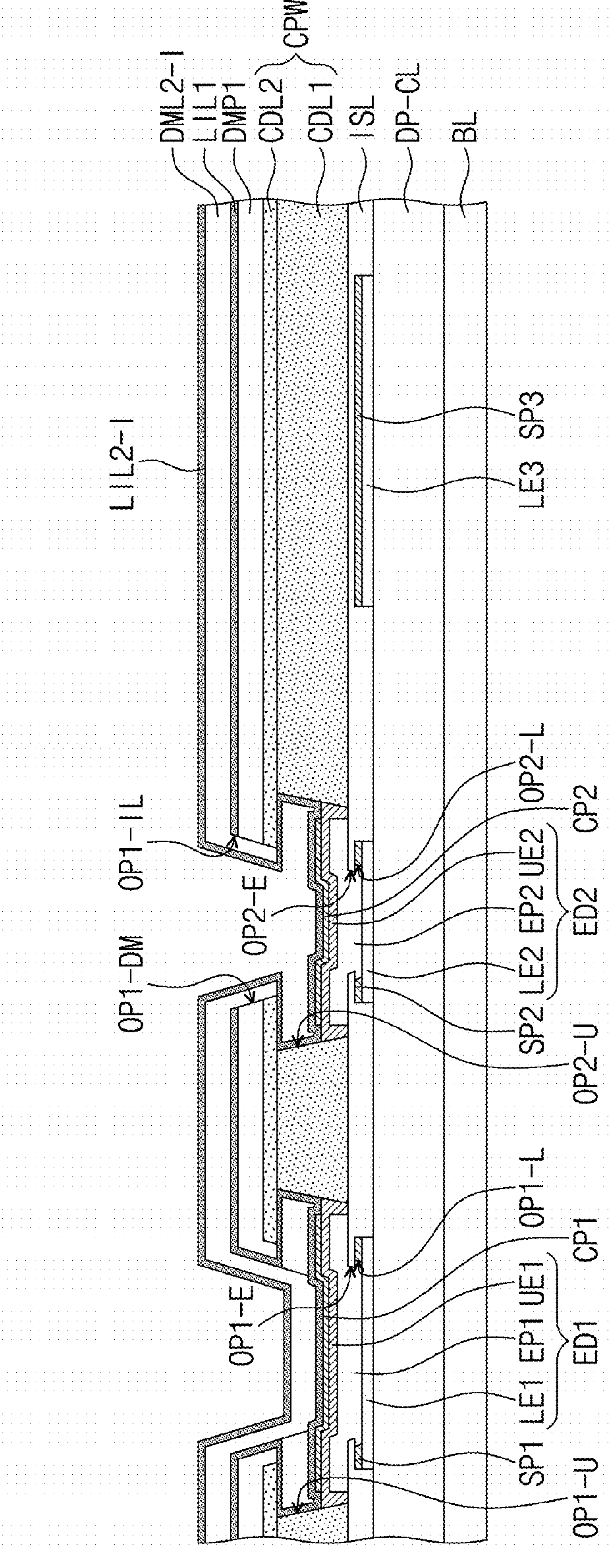

Referring to FIG. 10F, the third group process according to an embodiment may include forming a second preliminary lower encapsulation inorganic layer LIL2-I. The second preliminary lower encapsulation inorganic layer LIL2-I may be formed in a manner similar to the method of forming the first lower encapsulation inorganic layer LILT-I of the second group process. The second preliminary lower encapsulation inorganic layer LIL2-I may be formed on the conductive bank CPW and the first and second upper electrodes UE1 and UE2, and may be disposed inside each of the first and second upper openings OP1-U and OP2-U.

After the third group process, the fourth group process may be performed. In an embodiment, the third light emitting element ED3 (refer to FIG. 11E) and the third preliminary lower encapsulation inorganic layer LIL3-I (refer to FIG. 11E) covering the third light emitting element ED may be formed by the fourth group process. The fourth group process may include first to seventh etching processes. The third to seventh etching processes of the fourth group process may be performed in a similar manner to the first to fifth etching processes of the third group process, respectively. Accordingly, the first and second etching processes of the fourth group process may be more included as compared to the third group process. Hereinafter, the fourth group process will be described with reference to FIGS. 11A to 11E, and the same/similar reference numerals are used for the same/similar components as those described in FIGS. 8A to 10F, and redundant descriptions will be omitted.

Figure 11A:
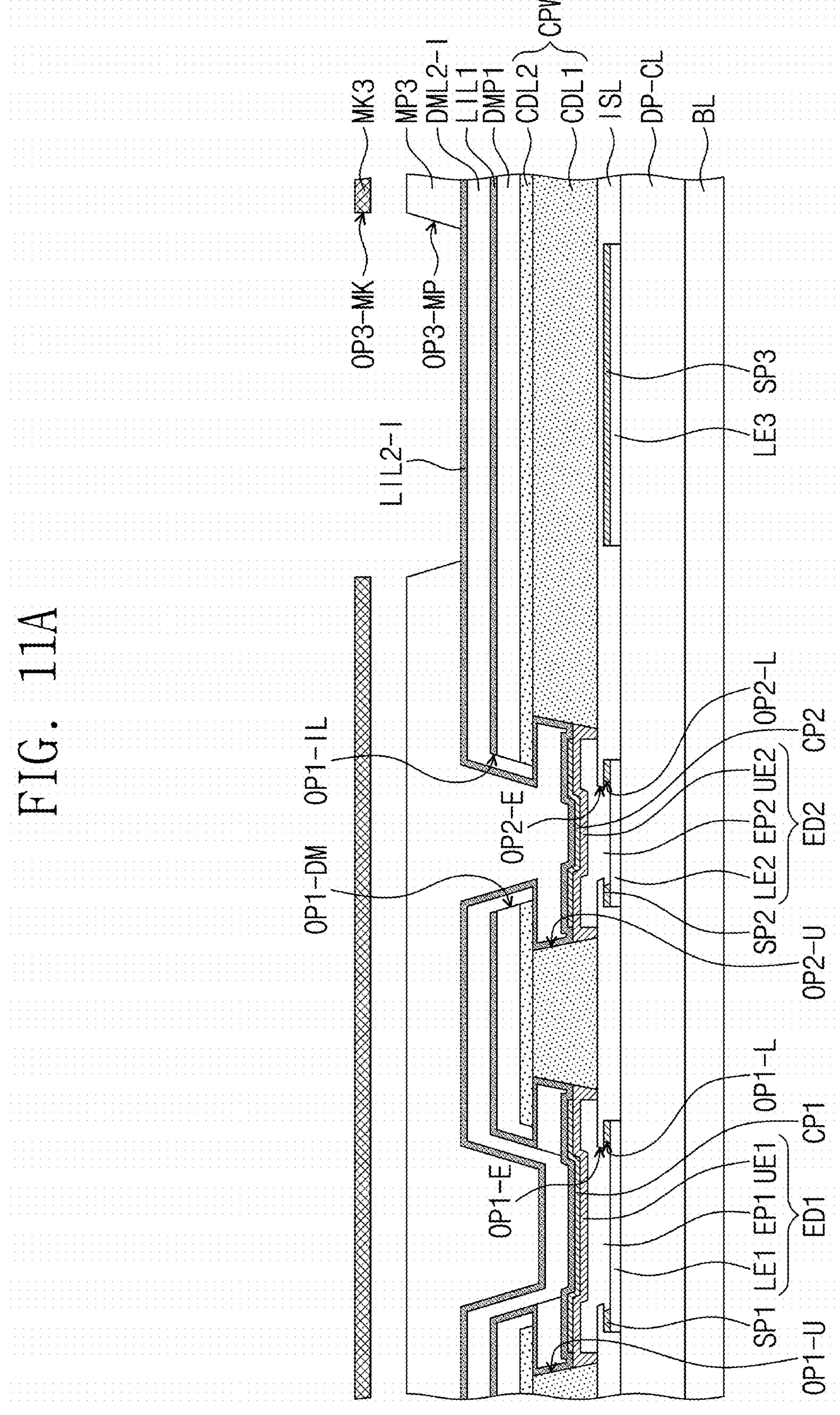

Referring to FIG. 11A, the fourth group process according to an embodiment may include forming a third mask pattern layer MP3. The third mask pattern layer MP3 may be formed by exposure and development processes by using a third photomask MK3 having a third mask openings OP3-MK. A third photo opening OP3-MP overlapping the third lower electrode LE3 may be formed in the third mask pattern layer MP3.

Referring to FIG. 11B, the fourth group process according to an embodiment may include forming a third encapsulation opening OP3-IL (or dummy inorganic opening) in the second preliminary lower encapsulation inorganic layer LIL2-I by the first etching process, forming a third dummy pattern opening OP3-DM in the second preliminary dummy layer DML2-I by the second etching process, forming a second encapsulation opening OP2-IL in the first lower encapsulation inorganic layer LIL1 by the third etching process, and forming a second dummy pattern opening OP2-DM in the first dummy pattern layer DMP1 by the fourth etching process. In each of the first to fourth etching processes, the third mask pattern layer MP3 may be used as a mask.

The etching of each of the second preliminary lower encapsulation inorganic layer LIL2-I and the first lower encapsulation inorganic layer LIL1 may be performed in a similar manner to the etching of the first lower encapsulation inorganic layer LIL1 in the third group process. Each of the second preliminary dummy layer DML2-I and the first dummy pattern layer DMP1 may be etched in a manner similar to the etching of the first dummy pattern layer DMP1 in the third group process.

Referring to FIG. 11C, the fourth group process according to an embodiment may include forming a third upper opening OP3-U spaced apart from the first and second upper openings OP1-U and OP2-U in the conductive bank CPW and corresponding to the second encapsulation opening OP2-IL by the fifth etching process, forming a third emission opening OP3-E spaced apart from the first and second emission openings OP1-E and OP2-E in the insulating layer ISL by the sixth etching process, and forming a third lower opening OP3-L in the third sacrificial pattern layer SP3 by the seventh etching process.

According to an embodiment, the third upper opening OP3-U, the third emission opening OP3-E, and the third lower opening OP3-L may be formed in the conductive bank CPW, the insulating layer ISL, and the third sacrificial pattern layer SP3, respectively, after the second light emitting element ED2 is formed. Accordingly, in case that the second light emitting element ED2 is formed, the third lower electrode LE3 may be covered by the conductive bank CPW, the insulating layer ISL, and the third sacrificial pattern layer SP3, and may not be exposed. Therefore, damage to the third lower electrode LE3 in the forming of the second light emitting element ED2 may be prevented.

Referring to FIG. 11D, the fourth group process according to an embodiment may include forming a third emission pattern layer EP3 and forming a third upper electrode UE3. For example, a third preliminary dummy layer DML3-I may be further formed. A portion of the third preliminary dummy layer DML3-I may be disposed on the conductive bank CPW to cover the second preliminary lower encapsulation inorganic layer LIL2-I disposed on the conductive bank CPW. Another portion of the third preliminary dummy layer DML3-I may cover the second preliminary lower encapsulation inorganic layer LIL2-I disposed inside the first upper opening OP1-U. For example, another portion of the third preliminary dummy layer DML3-I may be disposed inside the second upper opening OP2-U to cover a portion of the second preliminary lower encapsulation inorganic layer LIL2-I disposed inside the second upper opening OP2-U.

Although FIG. 11D illustrates that the third preliminary dummy layer DML3-I is continuously formed inside the second upper opening OP2-U, the third preliminary dummy layer DML3-I may be provided as a pattern layer separated from the inside of the second upper opening OP2-U by the tip portion of the conductive bank CPW.

Referring to FIG. 11E, the fourth group process according to an embodiment may include forming a third preliminary lower encapsulation inorganic layer LIL3-I. The third preliminary lower encapsulation inorganic layer LIL3-I may be formed on the conductive bank CPW and the first to third upper electrodes UE1, UE2, and UE3.

The third preliminary lower encapsulation inorganic layer LIL3-I may be disposed inside the first separation opening OP1-SP (refer to FIG. 5B) of the first dummy pattern layer DMP1 on the first upper electrode UE1, and may be disposed inside the second and third upper openings OP2-U and OP3-U, respectively, on the second and third upper electrodes UE2 and UE3. However, embodiments are not limited thereto, and the third preliminary lower encapsulation inorganic layer LIL3-I may be disposed inside the first upper opening OP1-U on the first upper electrode UE1, or may be disposed outside the first separation opening OP1-SP (refer to FIG. 5B) and the first upper opening OP1-U according to process conditions.

After the fourth group process, the fifth group process may be performed. In this embodiment, by the fifth group process, a portion of each of the second and third preliminary dummy layers DML2-I and DML3-I and a portion of each of the second and third preliminary lower encapsulation inorganic layers LIL2-I and LIL3-I may be removed to provide a completed display panel DP (refer to FIG. 12E). The fifth group process may include first to fourth etching processes. Hereinafter, the fifth group process will be described with reference to FIGS. 12A to 12E, and the same/similar reference numerals are used for the same/similar components as those described in FIGS. 8A to 11E, and redundant descriptions will be omitted.

Figure 12A:
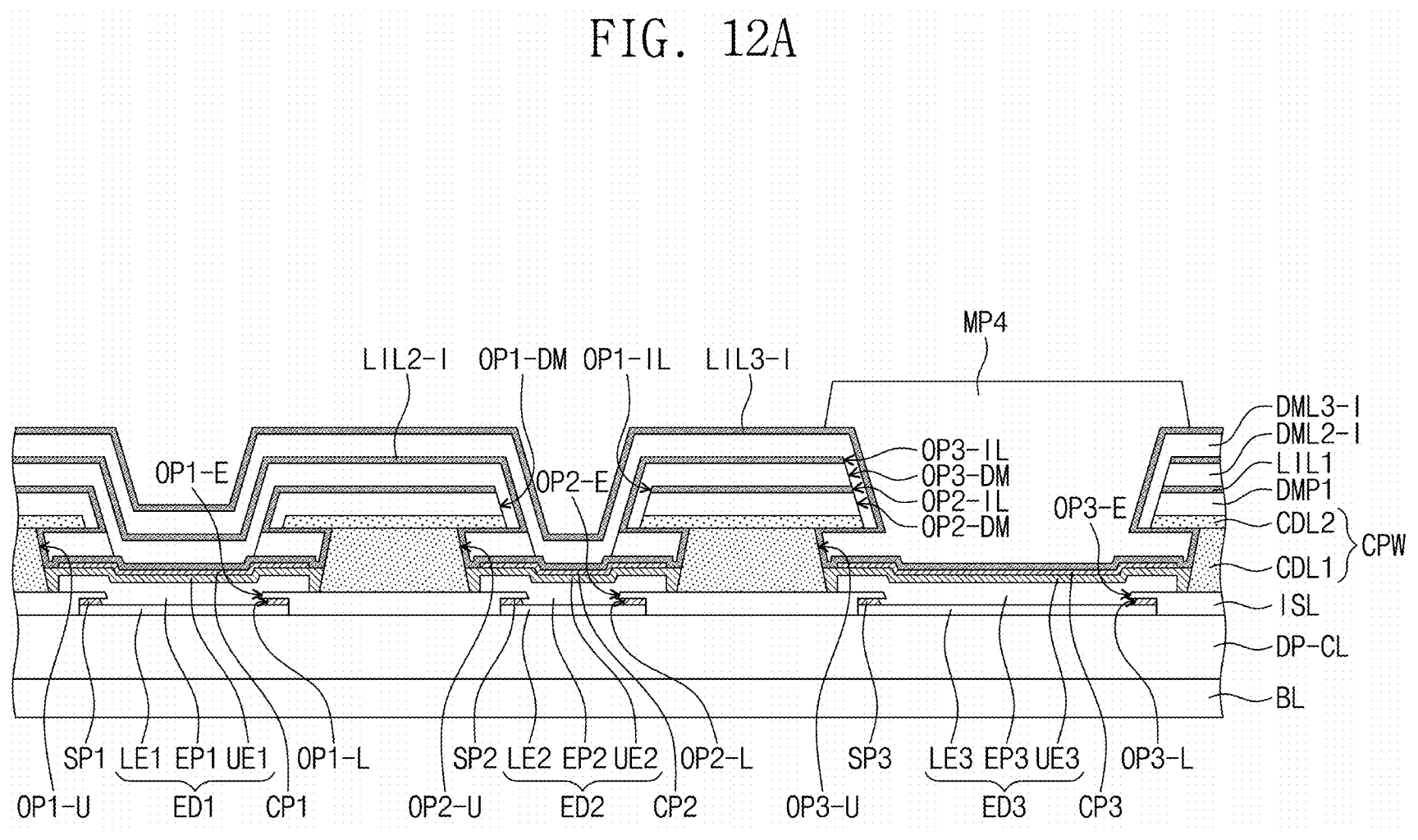

Referring to FIG. 12A, the fifth group process according to an embodiment may include forming a fourth mask pattern layer MP4. The fourth mask pattern layer MP4 may overlap the third emission opening OP3-E.

Figure 12B:
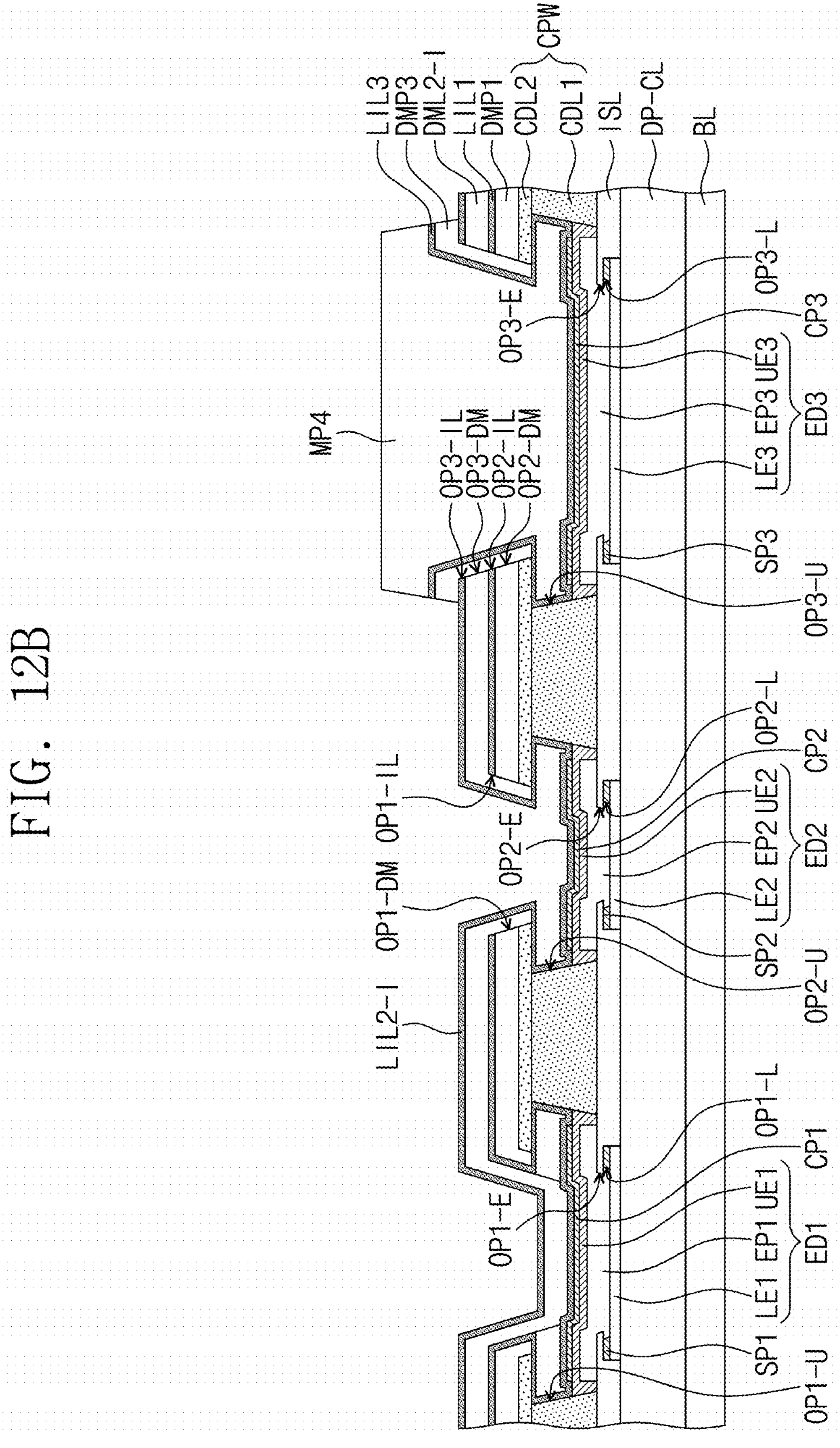

Referring to FIGS. 12A and 12B, the fifth group process according to an embodiment may include removing a portion of the third preliminary lower encapsulation inorganic layer LIL3-I that overlaps the first and second emission openings OP1-E and OP2-E such that the third lower encapsulation inorganic layer LIL3 may be formed from the third preliminary lower encapsulation inorganic layer LIL3-I by a first etching process.

The third preliminary lower encapsulation inorganic layer LIL3-I may be etched by using the fourth mask pattern layer MP4 as a mask, and thus a third lower encapsulation inorganic layer LIL3 may not overlap the first and second emission openings OP1-E and OP2-E and overlap the third emission opening OP3-E.

The fifth group process according to an embodiment may include removing a portion overlapping the first and second emission openings OP1-E and OP2-E such that the third dummy pattern layer DMP3 may be formed from the third preliminary dummy layer DML3-I by a second etching process.

The third preliminary dummy layer DML3-I may be etched by using the fourth mask pattern layer MP4 as a mask, and thus a third dummy pattern layer DMP3 may not overlap the first and second emission openings OP1-E and OP2-E. The third dummy pattern layer DMP3 may overlap an inner surface of the second conductive layer CDL2 defining the third upper opening OP3-U. The third dummy pattern layer DMP3 may have a closed-line shape in a plan view.

Figure 12C:
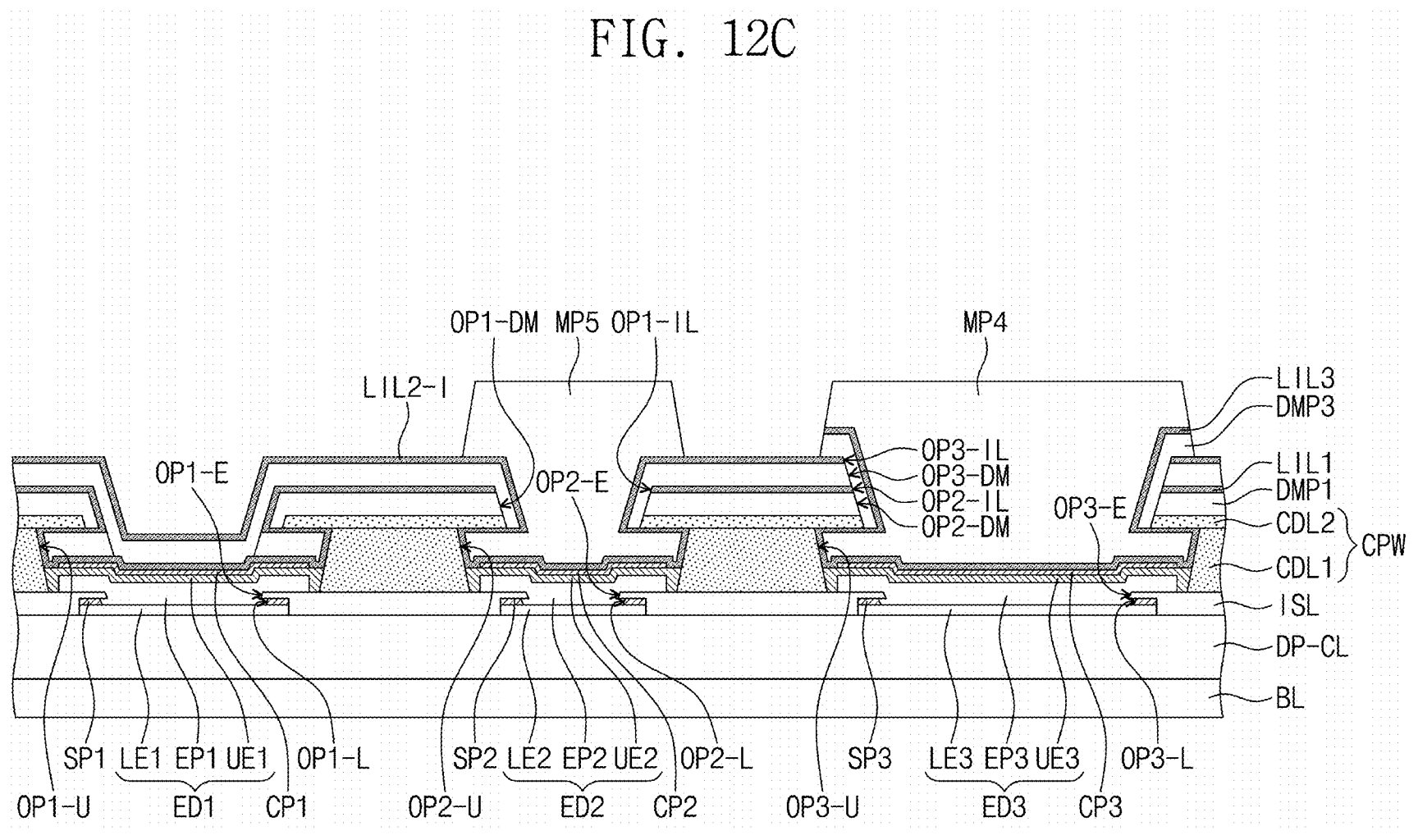

Referring to FIG. 12C, the fifth group process according to an embodiment may include forming a fifth mask pattern layer MP5. The fifth mask pattern layer MP5 may overlap the second emission opening OP2-E.

Referring to FIGS. 12C and 12D, the fifth group process according to an embodiment may include removing a portion of the second preliminary lower encapsulation inorganic layer LIL2-I that overlaps the first emission opening OP1-E such that the second lower encapsulation inorganic layer LIL2 may be formed from the second preliminary lower encapsulation inorganic layer LIL2-I by the third etching process.

The second preliminary lower encapsulation inorganic layer LIL2-I may be etched by using the fourth and fifth mask pattern layers MP4 and MP5 as a mask to form a lower encapsulation inorganic layer LIL2 and a dummy inorganic layer LIL2-D from the second preliminary lower encapsulation inorganic layer LIL2-I. The second lower encapsulation inorganic layer LIL2 may overlap the second emission opening OP2-E. A third encapsulation opening OP3-IL (or dummy inorganic opening) may be defined in the dummy inorganic layer LIL2-D, and the dummy inorganic layer LIL2-D may be a portion covered by the third dummy pattern layer DMP3. The dummy inorganic layer LIL2-D and the second lower encapsulation inorganic layer LIL2 may include a same material.

The fifth group process according to an embodiment may include removing a portion of the second preliminary dummy layer DML2-I that overlaps the first emission opening OP1-E such that the second dummy pattern layer DMP2 may be formed from the second preliminary dummy layer DML2-I by the fourth etching process.

The second preliminary dummy layer DML2-I may be etched by using the fourth and fifth mask pattern layers MP4 and MP5 as a mask, thereby forming a second dummy pattern layer DMP2 including a first dummy part DPP1 and a second dummy part DPP2. The first dummy part DPP1 may overlap an inner surface of the second conductive layer CDL2 defining the second upper opening OP2-U. The second dummy part DPP2 may be a portion in which the third dummy pattern opening OP3-DM is defined. The second dummy part DPP2 may be a portion covered by the dummy inorganic layer LIL2-D. Each of the first dummy part DPP1 and the second dummy part DPP2 may have a closed-line shape in a plan view.

Figure 12E:
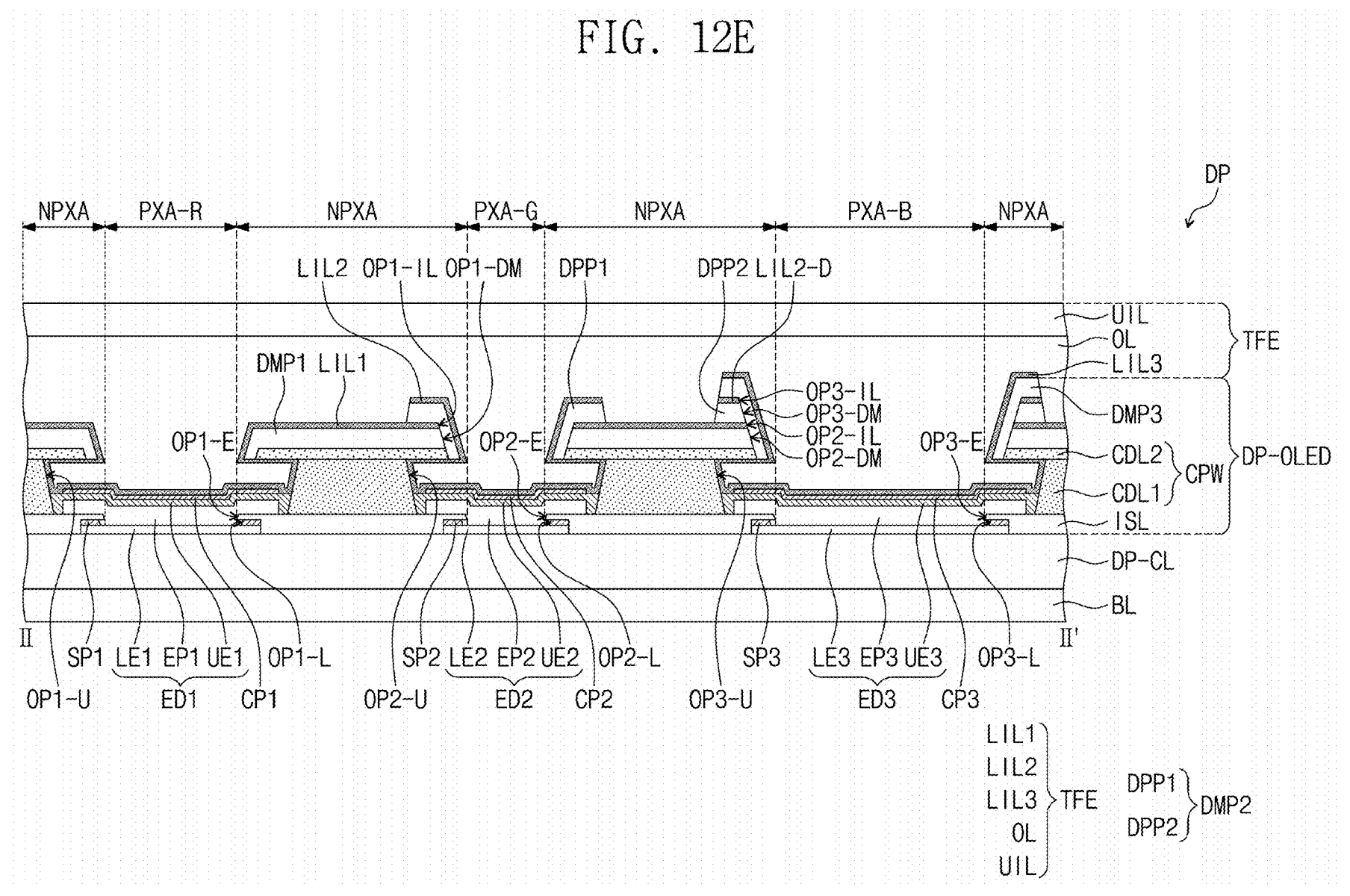

Referring to FIG. 12E, the fifth group process according to an embodiment may include forming an encapsulation organic layer OL and an upper encapsulation inorganic layer UIL to complete the display panel DP. After removing the fourth and fifth mask pattern layers MP4 and MP5, the encapsulation organic layer OL may be formed on the first to third lower encapsulation inorganic layers LIL1, LIL2, and LIL3, and the upper encapsulation inorganic layer UIL may be formed on the encapsulation organic layer OL. Accordingly, the display panel DP including the base layer BL, the circuit element layer DP-CL, the display element layer DP-OLED, and the thin film encapsulation layer TFE may be formed.

According to an embodiment, the organic pattern layer including the light emitting material may be patterned for each pixel without contact with the separate mask, thereby preventing the damage to the display panel caused by contact with the mask. Accordingly, the display panel with the improved reliability may be provided.

Further, according to an embodiment, the separate mask for patterning the organic pattern layer including the light emitting material with a pixel as a unit may be not manufactured, thereby providing the display panel in which the process is simplified and the process cost is reduced.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display panel comprising:

a base layer;

a first lower electrode disposed on the base layer;

a first sacrificial pattern layer disposed on the first lower electrode and defining a first lower opening exposing a portion of an upper surface of the first lower electrode;

an insulating layer disposed on the base layer, covering at least a portion of the first sacrificial pattern layer, and defining a first emission opening overlapping the first lower opening;

a conductive bank disposed on the insulating layer and defining a first upper opening overlapping the first emission opening;

a first emission pattern layer disposed inside the first lower opening, the first emission opening, and the first upper opening, the first emission pattern layer disposed on the first lower electrode; and a first upper electrode disposed on the first emission pattern layer and in contact with an inner surface of the conductive bank defining the first upper opening, wherein a thickness of the first emission pattern layer is greater than a sum of a thickness of the first sacrificial pattern layer and a thickness of a portion of the insulating layer disposed on the first sacrificial pattern layer.

2. The display panel of claim 1, wherein the first sacrificial pattern layer includes an amorphous transparent conductive oxide.

3. The display panel of claim 2, wherein the first lower electrode includes:

a first layer including a metallic material; and a second layer disposed on the first layer, exposed through the first lower opening, and including a crystallized transparent conductive oxide.

4. The display panel of claim 1, wherein the conductive bank includes:

a first conductive layer having a first conductivity; and a second conductive layer having a second conductivity lower than the first conductivity and disposed on the first conductive layer.

5. The display panel of claim 4, wherein the first conductive layer has a first thickness, and the second conductive layer has a second thickness smaller than the first thickness.

6. The display panel of claim 4, wherein an inner surface of the first conductive layer defines a first opening portion of the first upper opening, an inner surface of the second conductive layer defines a second opening portion of the first upper opening, and the inner surface of the second conductive layer defining the second opening portion is closer to a center portion of the first lower electrode than the inner surface of the first conductive layer defining the first opening portion, in a plan view.

7. The display panel of claim 4, wherein the conductive bank further includes a third conductive layer disposed under the first conductive layer, the second conductive layer and the third conductive layer include a same material, and the first conductive layer includes a different material from a material of the second and third conductive layers.

8. The display panel of claim 7, wherein the first conductive layer has a first thickness, and the third conductive layer has a third thickness smaller than the first thickness.

9. The display panel of claim 7, wherein an inner surface of the third conductive layer defining a third opening portion of the first upper opening is closer to a center portion of the first lower electrode than an inner surface of the first conductive layer defining a first opening portion of the first upper opening, in a plan view, and a thickness of the first emission pattern layer in a portion of the first emission pattern layer in contact with the first lower electrode is greater than a sum of a thickness of the first sacrificial pattern layer, a thickness of the insulating layer, and a thickness of the third conductive layer.

10. The display panel of claim 1, further comprising:

a first lower encapsulation inorganic layer disposed on the first upper electrode and the conductive bank;

an encapsulation organic layer disposed on the first lower encapsulation inorganic layer; and an upper encapsulation inorganic layer disposed on the encapsulation organic layer, wherein the first lower encapsulation inorganic layer is disposed inside the first upper opening and is in contact with the inner surface of the conductive bank defining the first upper opening.

11. The display panel of claim 10, further comprising:

a capping pattern layer disposed between the first upper electrode and the first lower encapsulation inorganic layer.

12. The display panel of claim 1, further comprising:

a second lower electrode spaced apart from the first lower electrode, the first lower electrode and the second lower electrode disposed on a same layer;

a second sacrificial pattern layer disposed on the second lower electrode and defining a second lower opening exposing a portion of an upper surface of the second lower electrode;

a second emission pattern layer disposed on the second lower electrode and spaced apart from the first emission pattern layer; and a second upper electrode disposed on the second emission pattern layer and spaced apart from the first upper electrode, wherein a second emission opening spaced apart from the first emission opening is defined in the insulating layer, a second upper opening spaced apart from the first upper opening is defined in the conductive bank, and the second emission pattern layer is disposed inside the second lower opening, the second emission opening, and the second upper opening, and the second upper electrode is in contact with an inner surface of the conductive bank defining the second upper opening.

13. The display panel of claim 12, further comprising:

a first dummy pattern layer having an integral shape, completely covering an upper surface of the conductive bank, and spaced apart from the first emission pattern layer and the second emission pattern layer, wherein the first dummy pattern layer includes an organic layer, and the organic layer of the first dummy pattern layer and the first emission pattern layer include a same material.

14. The display panel of claim 13, wherein the first dummy pattern layer further includes a conductive layer disposed on the organic layer, and the conductive layer of the first dummy pattern layer and the first upper electrode include a same material.

15. The display panel of claim 13, further comprising:

a first lower encapsulation inorganic layer disposed on the first upper electrode and the first dummy pattern layer, having an integral shape, and defining a first encapsulation opening overlapping the second upper opening.

16. The display panel of claim 15, further comprising:

a second lower encapsulation inorganic layer disposed on the second upper electrode and in contact with the inner surface of the conductive bank defining the second upper opening, wherein the second lower encapsulation inorganic layer is disposed on the first lower encapsulation inorganic layer on the upper surface of the conductive bank.

17. The display panel of claim 13, wherein a first dummy pattern opening overlapping the second upper opening is defined in the first dummy pattern layer.

18. The display panel of claim 17, further comprising:

a second dummy pattern layer overlapping an inner surface of the first dummy pattern layer defining the first dummy pattern opening and disposed on the first dummy pattern layer on the upper surface of the conductive bank.

19. The display panel of claim 18, wherein the second dummy pattern layer includes:

an organic layer spaced apart from the second emission pattern layer, the organic layer of the second dummy pattern layer and the second emission pattern layer including a same material; and a conductive layer disposed on the organic layer of the second dummy pattern layer, the conductive layer and the second upper electrode including a same material.

20. The display panel of claim 18, further comprising:

a third lower electrode spaced apart from the first lower electrode and the second lower electrode, the third lower electrode and the first lower electrode disposed on a same layer;

a third sacrificial pattern layer disposed on the third lower electrode and defining a third lower opening exposing a portion of an upper surface of the third lower electrode;

a third emission pattern layer disposed on the third lower electrode and spaced apart from the first emission pattern layer and the second emission pattern layer; and a third upper electrode disposed on the third emission pattern layer and spaced apart from the first upper electrode and the second upper electrode, wherein a third emission opening spaced apart from the first emission opening and the second emission opening is defined in the insulating layer, a third upper opening spaced apart from the first upper opening and the second upper opening is defined in the conductive bank, the third emission pattern layer is disposed inside the third lower opening, the third emission opening, and the third upper opening, and the third upper electrode is in contact with an inner surface of the conductive bank defining the third upper opening.

21. The display panel of claim 20, wherein a second dummy pattern opening overlapping the third upper opening is defined in the first dummy pattern layer, and the second dummy pattern layer includes:

a first dummy part overlapping the inner surface of the first dummy pattern layer defining the first dummy pattern opening, and a second dummy part spaced apart from the first dummy part and defining a third dummy pattern opening overlapping the third upper opening.

22. The display panel of claim 21, further comprising:

a third dummy pattern layer disposed on the second dummy pattern layer, wherein the third dummy pattern layer overlaps the inner surface of the first dummy pattern layer defining the second dummy pattern opening and an inner surface of the second dummy part defining the third dummy pattern opening, and is disposed on the second dummy part on the upper surface of the conductive bank.

23. The display panel of claim 21, further comprising:

a first lower encapsulation inorganic layer disposed on the first upper electrode and the first dummy pattern layer, wherein the first lower encapsulation inorganic layer has an integral shape, and a first encapsulation opening overlapping the second upper opening and a second encapsulation opening overlapping the third upper opening are defined in the first lower encapsulation inorganic layer.

24. The display panel of claim 23, further comprising:

a second lower encapsulation inorganic layer disposed on the second upper electrode and the first dummy part and in contact with the inner surface of the conductive bank defining the second upper opening; and a dummy inorganic layer spaced apart from the second lower encapsulation inorganic layer and disposed on the second dummy part, the dummy inorganic layer and the second lower encapsulation inorganic layer including a same material, wherein the dummy inorganic layer overlaps the first lower encapsulation inorganic layer, and a dummy inorganic opening overlapping the third upper opening is defined in the dummy inorganic layer.

25. The display panel of claim 24, further comprising:

a third lower encapsulation inorganic layer disposed on the third upper electrode and the second dummy part and in contact with the inner surface of the conductive bank defining the third upper opening, wherein the third lower encapsulation inorganic layer is disposed on the first lower encapsulation inorganic layer and the dummy inorganic layer on the upper surface of the conductive bank.

26. The display panel of claim 1, wherein the conductive bank is configured to receive a bias voltage.

27. The display panel of claim 1, wherein an inner surface of the insulating layer defining the first emission opening is closer to a center portion of the first lower electrode than an inner surface of the first sacrificial pattern layer defining the first lower opening in a plan view.

28. A display panel comprising:

a base layer;

a lower electrode disposed on the base layer;

a sacrificial pattern layer disposed on the lower electrode and defining a lower opening exposing a portion of an upper surface of the lower electrode;

an insulating layer disposed on the base layer, covering at least a portion of the sacrificial pattern layer, and defining an emission opening overlapping the lower opening;

a conductive bank disposed on the insulating layer, defining an upper opening overlapping the emission opening, and including a first conductive layer and a second conductive layer disposed on the first conductive layer;

an emission pattern layer disposed on the lower electrode and covering an inner surface of the insulating layer defining the emission opening; and an upper electrode disposed on the emission pattern layer and in contact with an inner surface of the conductive bank defining the upper opening, wherein the upper opening defined in the second conductive layer overlaps the upper opening defined in the first conductive layer, a size of the upper opening of the second conductive layer is smaller than a size of the upper opening of the first conductive layer in a plan view, and a minimum separation distance from the upper surface of the lower electrode to an upper surface of the emission pattern layer in a thickness direction is greater than a maximum separation distance from the upper surface of the lower electrode to an upper surface of the insulating layer in the thickness direction.

29. A method of manufacturing a display panel, the method comprising:

forming a preliminary display panel including a base layer, a first lower electrode disposed on the base layer, a first sacrificial pattern layer disposed on the first lower electrode, an insulating layer disposed on the base layer to cover the first lower electrode and the first sacrificial pattern layer, and a conductive bank layer disposed on the insulating layer;

forming a conductive bank defining a first upper opening overlapping the first lower electrode from the conductive bank layer;

forming a first emission opening in the insulating layer;

forming a first lower opening in the first sacrificial pattern layer;

forming a first emission pattern layer on the first lower electrode inside the first upper opening, the first emission opening, and the first lower opening; and forming a first upper electrode on the first emission pattern layer to be in contact with an inner surface of the conductive bank defining the first upper opening, wherein in the forming of the first emission pattern layer, the first emission pattern layer is formed to have a thickness greater than a sum of a thickness of the first sacrificial pattern layer and a thickness of the insulating layer.

30. The method of claim 29, wherein the conductive bank layer includes a first conductive layer and a second conductive layer disposed on the first conductive layer, the forming of the conductive bank defining the first upper opening includes:

dry etching the first conductive layer and the second conductive layer to form a first preliminary upper opening in the conductive bank layer; and wet etching the first conductive layer and the second conductive layer to form the conductive bank from the conductive bank layer and to form the first upper opening from the first preliminary upper opening, and an inner surface of the second conductive layer defining a second opening portion of the first upper opening is closer to a center portion of the first lower electrode than an inner surface of the first conductive layer defining a first opening portion of the first upper opening in a plan view.

31. The method of claim 29, wherein the forming of the first emission opening is performed by a dry etching process, the forming of the first lower opening is performed by a wet etching process, and an inner surface of the insulating layer defining the first emission opening is closer to a center portion of the first lower electrode than an inner surface of the first sacrificial pattern layer defining the first lower opening in a plan view.

32. The method of claim 31, wherein, in the forming of the first lower opening, an etch rate of the first lower electrode is smaller than an etch rate of the first sacrificial pattern layer.

33. The method of claim 29, wherein, in the forming of the preliminary display panel, the preliminary display panel further includes a second lower electrode spaced apart from the first lower electrode and a second sacrificial pattern layer disposed on the second lower electrode.

34. The method of claim 33, further comprising:

after the forming of the first upper electrode, forming a first lower encapsulation inorganic layer on the conductive bank and the first upper electrode;

forming a first encapsulation opening overlapping the second lower electrode in the first lower encapsulation inorganic layer;

forming a second upper opening spaced apart from the first upper opening and overlapping the first encapsulation opening in the conductive bank;

forming a second emission opening spaced apart from the first emission opening in the insulating layer;

forming a second lower opening in the second sacrificial pattern layer;

forming a second emission pattern layer on the second lower electrode inside the second upper opening, the second emission opening, and the second lower opening; and forming a second upper electrode on the second emission pattern layer to be in contact with an inner surface of the conductive bank defining the second upper opening.

35. The method of claim 34, wherein in the forming of the first emission pattern layer, a first dummy pattern layer spaced apart from the first emission pattern layer is further formed on the conductive bank, the first dummy pattern layer and the first emission pattern layer including a same material, and the method further comprises:

forming a first dummy pattern opening overlapping the first encapsulation opening in the first dummy pattern layer between the forming of the first encapsulation opening in the first lower encapsulation inorganic layer and the forming of the second upper opening in the conductive bank.

36. The method of claim 34, further comprising:

after the forming of the second upper electrode, forming a second preliminary lower encapsulation inorganic layer on the conductive bank and the first upper electrode and the second upper electrode; and removing a portion of the second preliminary lower encapsulation inorganic layer overlapping the first emission opening to form a second lower encapsulation inorganic layer from the second preliminary lower encapsulation inorganic layer.

37. The method of claim 36, wherein, in the forming of the preliminary display panel, the preliminary display panel further includes:

a third lower electrode spaced apart from the first lower electrode and the second lower electrode, and a third sacrificial pattern layer disposed on the third lower electrode.

38. The method of claim 37, further comprising:

forming a third encapsulation opening overlapping the third lower electrode in the second preliminary lower encapsulation inorganic layer;

forming a second encapsulation opening overlapping the third encapsulation opening in the first lower encapsulation inorganic layer;

forming a third upper opening spaced apart from the first upper opening and the second upper opening and overlapping the third encapsulation opening in the conductive bank;

forming a third emission opening spaced apart from the first emission opening and the second emission opening in the insulating layer;

forming a third lower opening in the third sacrificial pattern layer;

forming a third emission pattern layer on the third lower electrode inside the third upper opening, the third emission opening, and the third lower opening; and forming a third upper electrode on the third emission pattern layer to be in contact with an inner surface of the conductive bank defining the third upper opening.

39. The method of claim 38, wherein in the forming of the first emission pattern layer, a first dummy pattern layer spaced apart from the first emission pattern layer is further formed on the conductive bank, the first dummy pattern layer and the first emission pattern layer including a same material, in the forming of the second emission pattern layer, a second dummy pattern layer spaced apart from the second emission pattern layer is further formed on the conductive bank, the second dummy pattern layer and the second emission pattern layer including a same material, and the method further comprises:

forming a third dummy pattern opening overlapping the third encapsulation opening in the second dummy pattern layer between the forming of the third encapsulation opening in the second preliminary lower encapsulation inorganic layer and the forming of the second encapsulation opening in the first lower encapsulation inorganic layer; and forming a second dummy pattern opening overlapping the second encapsulation opening in the first dummy pattern layer between the forming of the second encapsulation opening in the first lower encapsulation inorganic layer and the forming of the third upper opening in the conductive bank.

40. The method of claim 38, further comprising:

after the forming of the third upper electrode, forming a third preliminary lower encapsulation inorganic layer on the conductive bank and the first, second, and third upper electrodes;

removing a portion of the third preliminary lower encapsulation inorganic layer overlapping the first emission opening and the second emission opening to form a third lower encapsulation inorganic layer from the third preliminary lower encapsulation inorganic layer;

removing a portion of the second preliminary lower encapsulation inorganic layer overlapping the first emission opening and a portion of the second preliminary lower encapsulation inorganic layer overlapping the conductive bank adjacent to the second emission opening to form the second lower encapsulation inorganic layer and a dummy inorganic layer from the second preliminary lower encapsulation inorganic layer; and forming an encapsulation organic layer and an upper encapsulation inorganic layer on the first lower encapsulation inorganic layer, the second lower encapsulation inorganic layer, the third lower encapsulation inorganic layer, wherein the second lower encapsulation inorganic layer overlaps the second emission opening, and the dummy inorganic layer is spaced apart from the second lower encapsulation inorganic layer and disposed under the third lower encapsulation inorganic layer and includes the third encapsulation opening.

41. An electronic device comprising:

a display panel; and an input sensor on the display panel, wherein the display panel comprises:

a base layer;

a first lower electrode disposed on the base layer;

a first sacrificial pattern layer disposed on the first lower electrode and defining a first lower opening exposing a portion of an upper surface of the first lower electrode;

an insulating layer disposed on the base layer, covering at least a portion of the first sacrificial pattern layer, and defining a first emission opening overlapping the first lower opening;

a conductive bank disposed on the insulating layer and defining a first upper opening overlapping the first emission opening;

a first emission pattern layer disposed inside the first lower opening, the first emission opening, and the first upper opening, the first emission pattern layer disposed on the first lower electrode; and a first upper electrode disposed on the first emission pattern layer and in contact with an inner surface of the conductive bank defining the first upper opening, and wherein a thickness of the first emission pattern layer is greater than a sum of a thickness of the first sacrificial pattern layer and a thickness of a portion of the insulating layer disposed on the first sacrificial pattern layer.

* * * * *